(12) United States Patent
Kim

(10) Patent No.: US 9,081,037 B2
(45) Date of Patent: Jul. 14, 2015

(54) ATTACHMENT OF AN ELECTRICAL ELEMENT TO AN ELECTRONIC DEVICE USING A CONDUCTIVE MATERIAL

(75) Inventor: Tae Ma Kim, Dublin, CA (US)

(73) Assignee: FormFactor, Inc., Livermore, CA (US)

( * ) Notice: Subject to any disclaimer, the term of this patent is extended or adjusted under 35 U.S.C. 154(b) by 1248 days.

(21) Appl. No.: 12/952,440

(22) Filed: Nov. 23, 2010

(65) Prior Publication Data

US 2011/0067231 A1    Mar. 24, 2011

Related U.S. Application Data

(62) Division of application No. 11/858,057, filed on Sep. 19, 2007, now Pat. No. 7,836,587.

(60) Provisional application No. 60/828,774, filed on Oct. 9, 2006, provisional application No. 60/826,540, filed on Sep. 21, 2006.

(51) Int. Cl.
  *G01R 31/20*   (2006.01)
  *G01R 1/073*   (2006.01)
  *G01R 1/067*   (2006.01)
  *G01R 3/00*    (2006.01)

(52) U.S. Cl.
  CPC ........ *G01R 1/07342* (2013.01); *G01R 1/06727* (2013.01); *G01R 3/00* (2013.01); *Y10T 29/4973* (2015.01); *Y10T 29/49117* (2015.01); *Y10T 29/49149* (2015.01); *Y10T 29/49718* (2015.01); *Y10T 29/49726* (2015.01); *Y10T 29/53174* (2015.01); *Y10T 428/20* (2015.01)

(58) Field of Classification Search
  None
  See application file for complete search history.

(56) References Cited

U.S. PATENT DOCUMENTS

| | | | |
|---|---|---|---|
| 4,755,631 A * | 7/1988 | Churchwell et al. | 174/258 |
| 4,970,570 A * | 11/1990 | Agarwala et al. | 257/735 |
| 5,173,055 A | 12/1992 | Grabbe | |
| 5,495,667 A | 3/1996 | Farnworth et al. | |
| 6,268,015 B1 * | 7/2001 | Mathieu et al. | 430/313 |
| 6,297,164 B1 | 10/2001 | Khoury et al. | |
| 6,336,269 B1 | 1/2002 | Eldridge et al. | |
| 6,432,747 B1 | 8/2002 | Everett | |

(Continued)

FOREIGN PATENT DOCUMENTS

JP    62-165944    7/1987

OTHER PUBLICATIONS

PCT Search Report PCT/US07/78964, (16 pages).

(Continued)

*Primary Examiner* — Paresh Patel
(74) *Attorney, Agent, or Firm* — Kirton McConkie

(57) ABSTRACT

An electrical element can be attached and electrically connected to a substrate by a conductive adhesive material. The conductive adhesive material can electrically connect the electrical element to a terminal or other electrical conductor on the substrate. The conductive adhesive material can be cured by directing a flow of heated gas onto the material or by heating the material through a support structure on which the substrate is located. A non-conductive adhesive material can attach the electrical element to the substrate with a greater adhesive strength than the conductive adhesive. The non-conductive adhesive material can also be cured by directing a flow of heated gas onto the material or by heating the material through the support structure on which the substrate is located. The non-conductive adhesive material can cover the conductive adhesive material.

10 Claims, 36 Drawing Sheets

(56) References Cited

U.S. PATENT DOCUMENTS

| | | |
|---|---|---|
| 6,441,315 B1 * | 8/2002 | Eldridge et al. .............. 174/260 |
| 6,523,255 B2 | 2/2003 | Shih et al. |
| 6,675,474 B2 | 1/2004 | Mitani et al. |
| 6,777,319 B2 | 8/2004 | Grube et al. |
| 7,347,702 B2 | 3/2008 | Eldridge et al. |
| 7,836,587 B2 | 11/2010 | Kim et al. |
| 2003/0113990 A1 | 6/2003 | Grube et al. |
| 2005/0052194 A1 | 3/2005 | Kister et al. |
| 2005/0122100 A1 | 6/2005 | Wan et al. |
| 2006/0028220 A1 | 2/2006 | Malantonio et al. |
| 2006/0040417 A1 | 2/2006 | Eldridge et al. |
| 2009/0174423 A1 | 7/2009 | Klaerner et al. |

OTHER PUBLICATIONS

International Preliminary Report on Patentability PCT/US07/78964, Apr. 2, 2009, 6 pages.

* cited by examiner

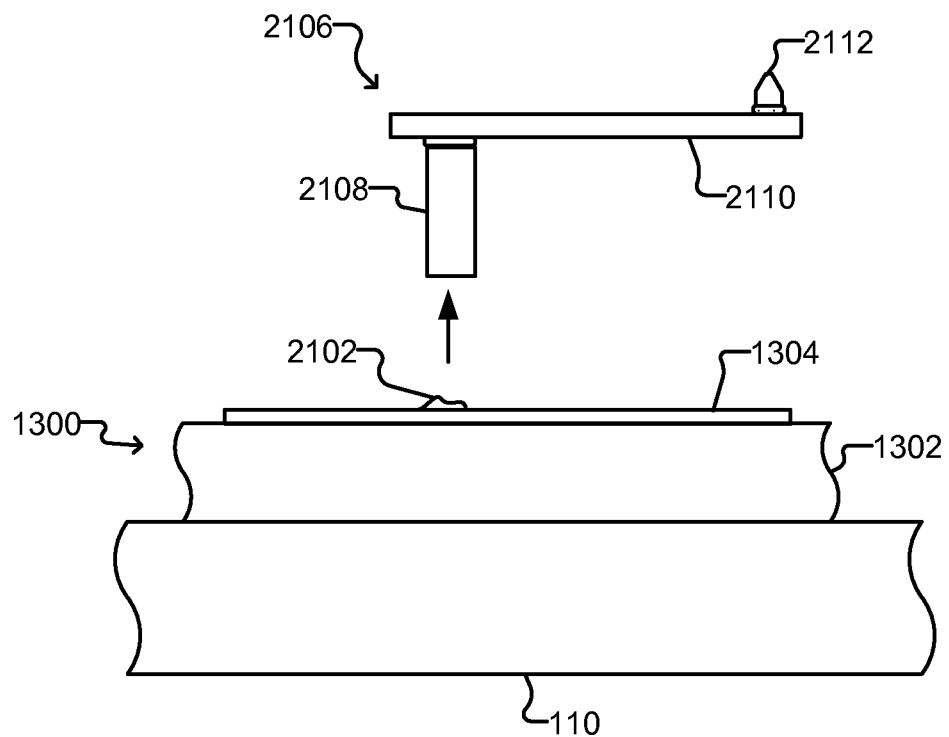

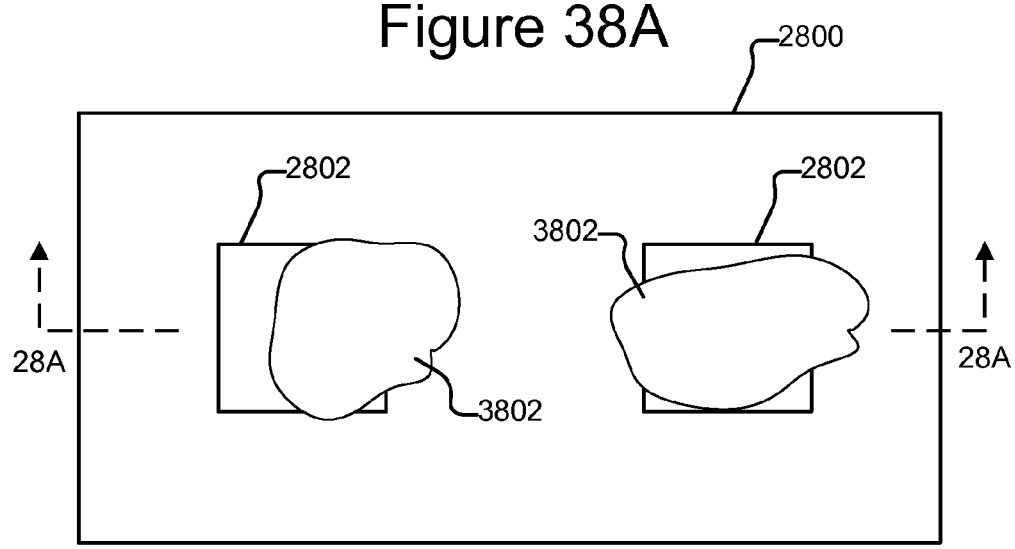
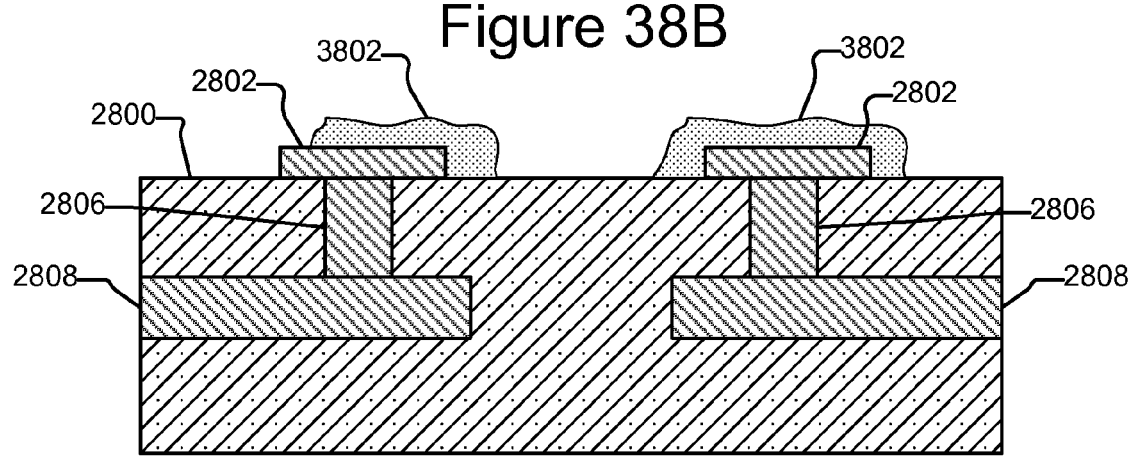

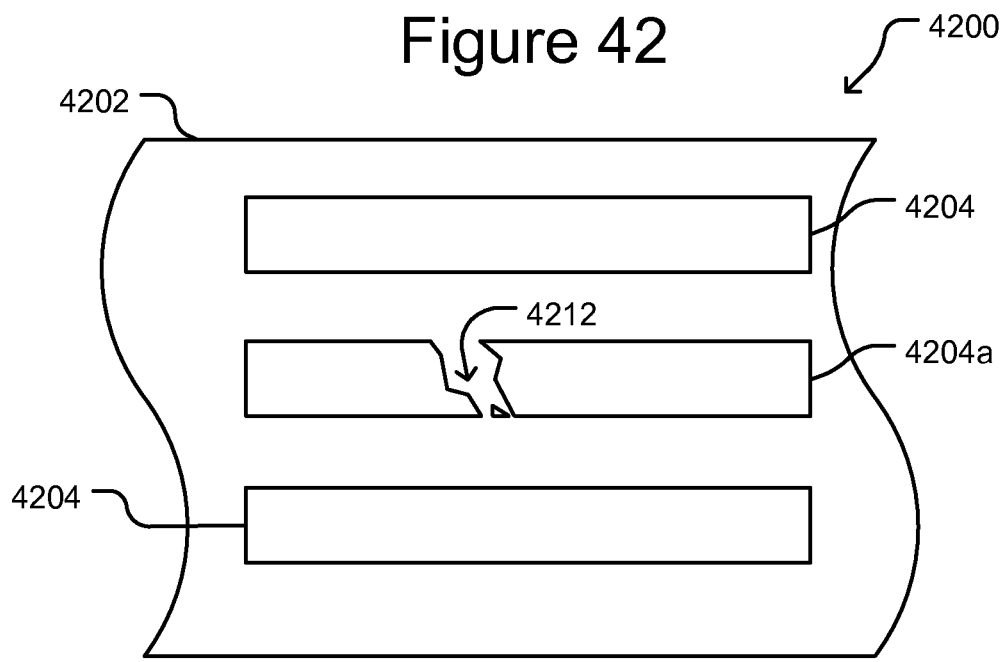
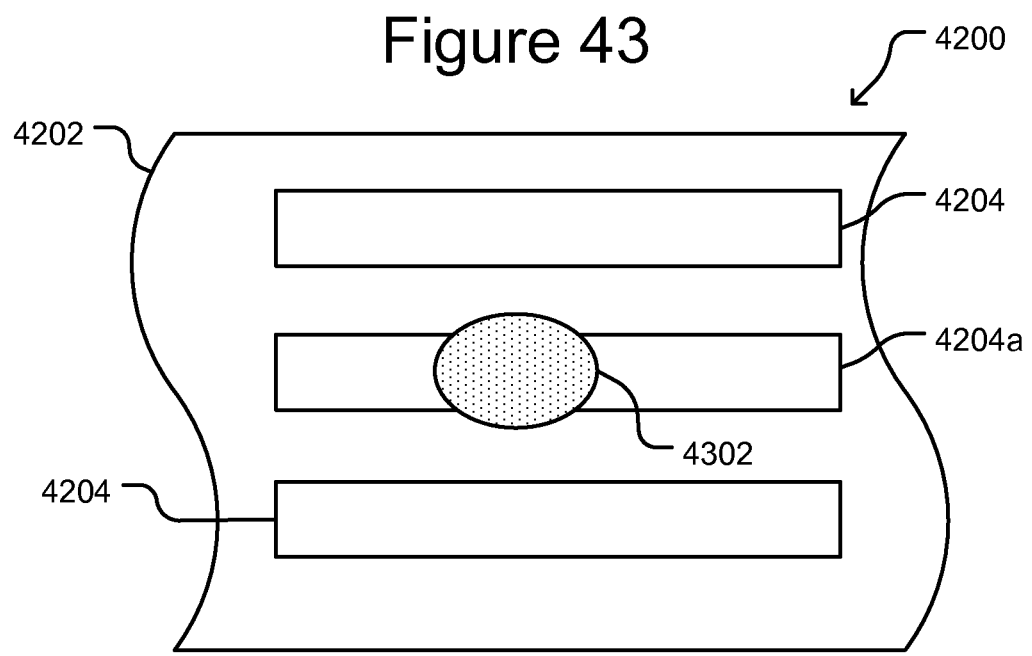

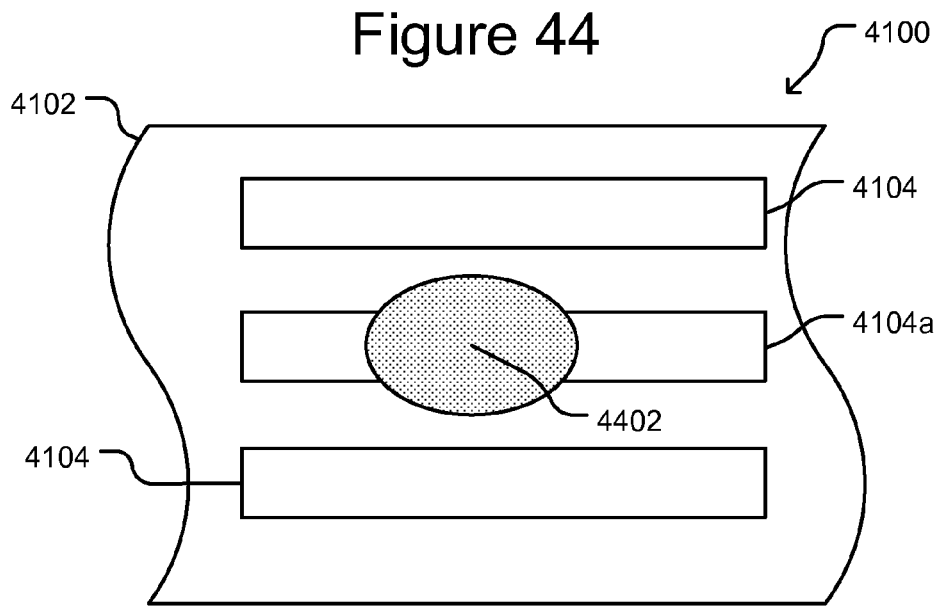
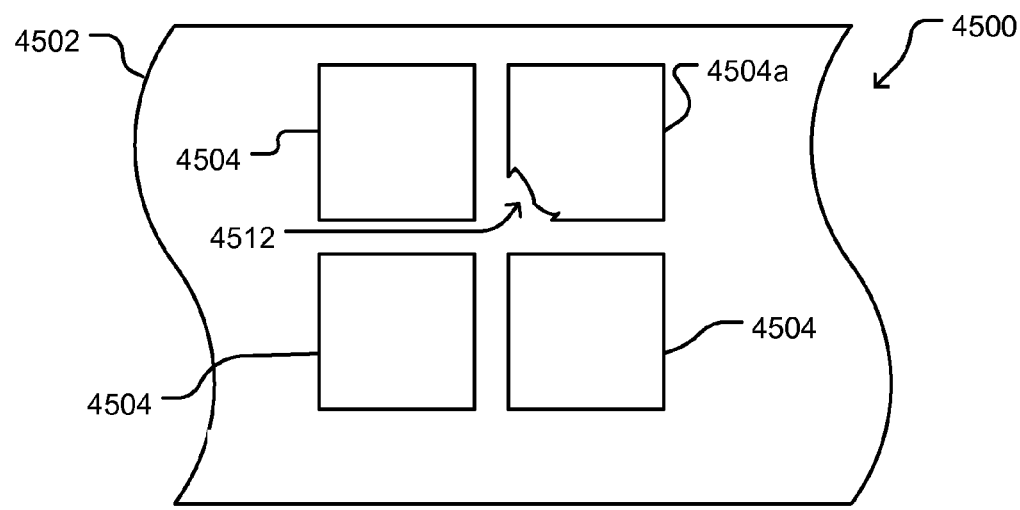

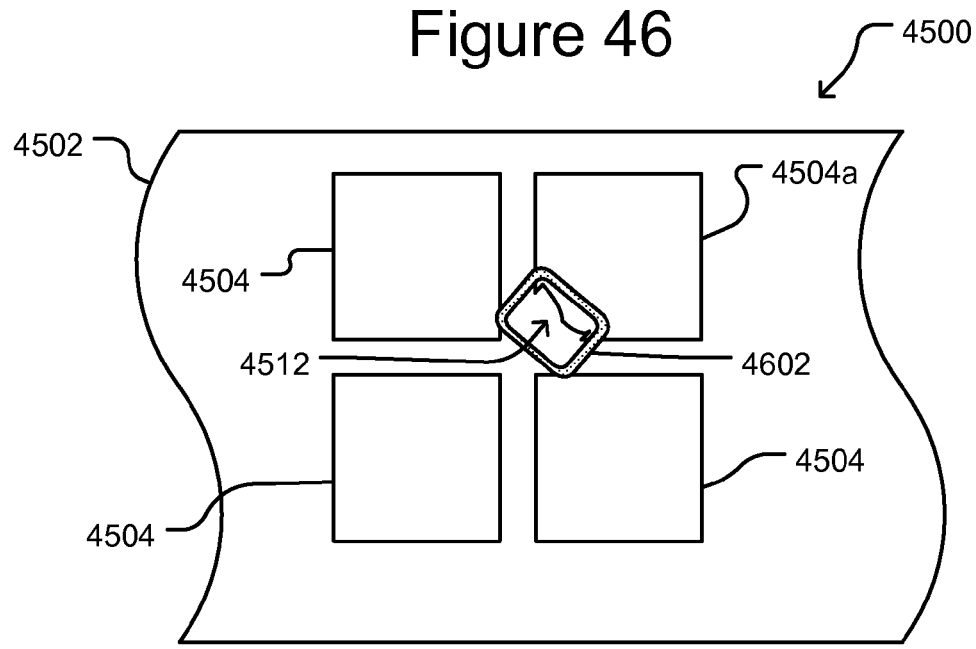
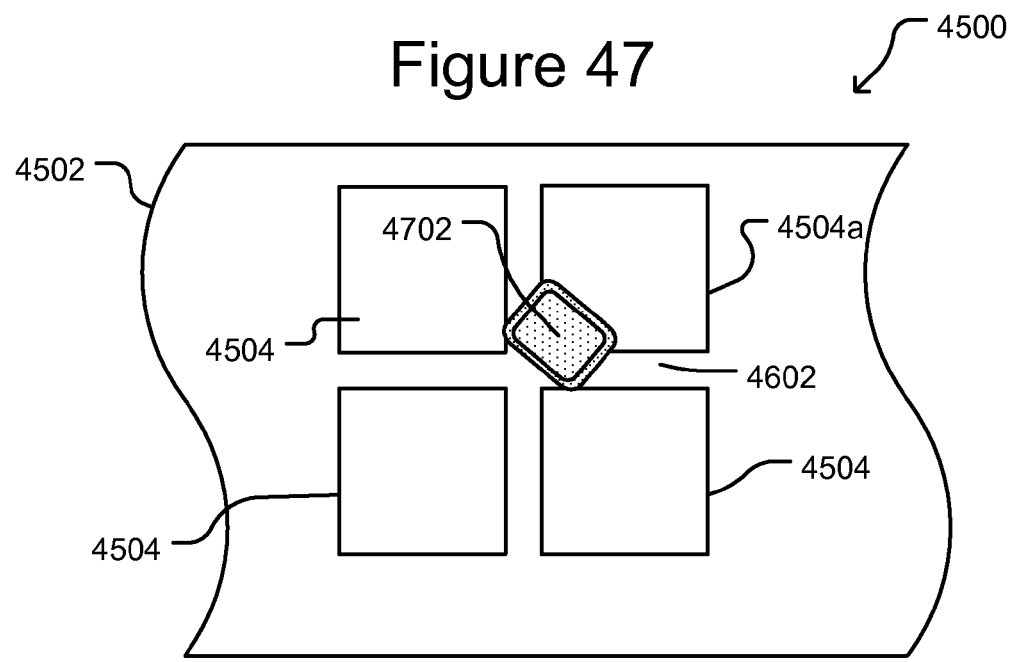

ATTACHMENT OF AN ELECTRICAL ELEMENT TO AN ELECTRONIC DEVICE USING A CONDUCTIVE MATERIAL

CROSS REFERENCE TO RELATED APPLICATIONS

This application is a division of U.S. patent application Ser. No. 11/858,057, filed Sep. 19, 2007 (now U.S. Pat. No. 7,836,587), which claims the benefit of U.S. provisional patent application Ser. No. 60/826,540 (filed Sep. 21, 2006) and U.S. provisional patent application Ser. No. 60/828,774 (filed Oct. 9, 2006).

BACKGROUND

An electronic device can include electrical elements that are both electrically connected to and physically attached to a base component, substrate, or other portion of the electronic device. For example, a plurality of electrically conductive probes can be attached to a testing device configured to contact electronic components, such as semiconductor dies, to test the components. As another example, a plurality of electrically conductive spring contact structures can be attached to opposite sides of a substrate forming an interposer device. As yet another example, electrically conductive contact structures can be attached to terminals (e.g., bond pads) of a singulated semiconductor die or a plurality of dies that are part of an unsingulated semiconductor wafer. As still another example, electric circuit elements (e.g., capacitors, resistors, diodes, switches, transistors, integrated circuit chips, etc.) can be attached to a wiring substrate (e.g., a printed circuit board). In the foregoing examples as well as other instances of an electronic device with attached electrical elements, there can be many such elements. The failure of even one such element can cause the electronic device to fail to function properly. In some instances, however, the cost of the damaged electrical element can be a small fraction of the total cost or value of the electronic device. It has been difficult, however, to repair a single damaged electrical element, particularly where the electrical element is small and/or one of many such electrical elements. Indeed, where many electrical elements are located close together and the damaged electrical element is surrounded by other such electrical elements, it can be particularly difficult to remove and replace the damaged electrical element, particularly if the damaged electrical element is surrounded by others of the electrical elements.

Moreover, even if the electrical element is not surrounded by other electrical elements, it may nevertheless be difficult to attach a replacement electrical element to the electronic device. For example, electrically conductive terminals or traces to which the damaged electrical element was attached may have been fully or partially removed with the damaged electrical element. It can be difficult, impractical, or impossible to attach the replacement electrical element to the electronic device with solder or similar materials. For example, it can be difficult, impractical, or impossible to attach a replacement electrical element to a ceramic substrate with solder or similar materials. As another example, even if solder or similar materials can be used to attach the replacement electrical element to the electronic device, heating the electronic device sufficiently to melt the solder or similar materials to attach the replacement electrical element can also melt solder or similar materials that attach other electrical elements to the electronic device, which can loosen or otherwise damage those other electrical elements and/or the attachment of those electrical elements to the electronic device. Indeed, for the foregoing and other reason, a soldering process can be difficult to control.

Where the electrical element is a spring contact structure configured to make pressured-based electrical connections with another electronic component by being pressed against terminals of the other electronic component, the foregoing difficulties can be particularly acute. In fact, a replacement spring contact structure typically should not only be electrically connected to the electronic device but should also be physically attached to the electronic device with sufficient adhesion strength to withstand forces that arise when the replacement spring contact, with the other spring contacts attached to the device, are pressed against the other electrical component. Regardless of whether the electrical element is a spring contact, an electric circuit element, or another type of electrical element, a process by which a damaged individual one or ones of the electrical elements can be repaired or replaced can allow for the repair of the electrical device. In some instances, such a process can be simple and inexpensive and can result in the electrical device having one or more replacement electrical elements that are securely attached and electrically connected to the electronic device.

An electronic device, for example, like any of the electronic devices mentioned above, can include a substrate on there which are one or more electrically conductive traces, terminals, and/or pads. For example, such traces, terminals, or pads can comprise thin, electrically conductive material (e.g., a conductive metal) deposited or otherwise formed or placed on the substrate. Such a trace, terminal, or pad can become damaged or be fully or partially detached. In some instances, depositing or otherwise forming conductive material on the substrate to repair or replace the damaged or detached trace, terminal, or pad can be difficult, costly, or otherwise impractical or impossible to accomplish. For example, it can be difficult, impractical, or impossible to deposit conductive material on a ceramic substrate to repair a trace, terminal, or pad on the ceramic substrate. A process by which a damaged or detached trace, terminal, or pad or multiple traces, terminals, or pads on a substrate can be repaired or replaced can allow for the repair of an electrical device that includes such a substrate.

BRIEF DESCRIPTION OF THE DRAWINGS

FIG. 21 illustrates a partial side view of an exemplary electronic device from which a spring probe is detached according to some embodiments of the invention.

FIG. 38A illustrates a top view of the substrate of FIGS. 28A and 28B with electric circuit element detached, terminals generally in tact, and solder residue according to some embodiments of the invention.

FIG. 38B illustrates a side, cross-sectional view of the substrate of FIG. 38A.

FIG. 42 shows a partial top view of traces on the substrate of an electronic device according to some embodiments of the invention.

FIG. 43 shows application of a conductive material to a damaged trace of the electronic device of FIG. 42 according to some embodiments of the invention.

FIG. 44 shows application of a non-conductive adhesive material to the conductive material, damaged trace, and substrate of the device of FIG. 43 according to some embodiments of the invention.

FIG. 45 shows a partial top view of pads on the substrate of an electronic device according to some embodiments of the invention.

FIG. 46 shows a dam structure formed around a damaged portion of one of the pads of the device of FIG. 45 according to some embodiments of the invention.

FIG. 47 shows deposit of a conductive material within the dam structure shown in FIG. 46 according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

Figure 1:
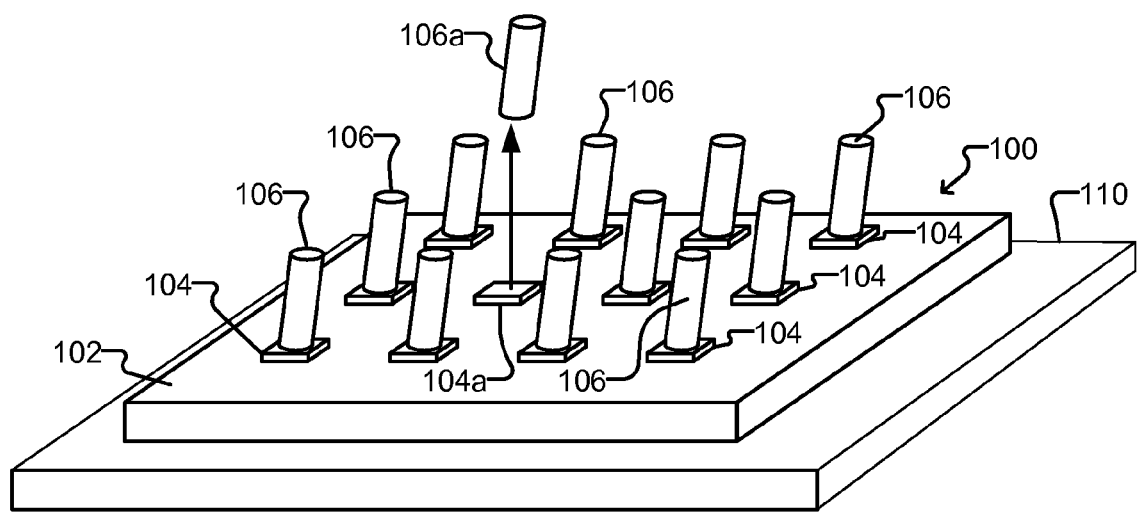
FIG. 1 shows a perspective view of an exemplary electronic device with a plurality of electrical elements according to some embodiments of the invention.

FIG. 1 illustrates an exemplary electronic device 100 that includes a substrate 102 with terminals 104 and electrical elements 106 physically attached and electrically connected to terminals 104, and FIGS. 2-6 illustrate an exemplary process by which one of the electrical elements 106a can be detached and replaced by a replacement electrical element 306 according to some embodiments of the invention. Alternatively, as will be discussed, the detached electrical element 106a—rather than replacement electrical elements 306—can be reattached to terminal 104a (the detached electrical element 106a can thus be a non-limiting example of a replacement electrical element).

Referring to FIG. 1, an exemplary electronic device 100 with electrical elements 106 attached to terminals 104 of a substrate 102 is shown. The electronic device 100 can be any type of electronic component, assembly, etc., and the electrical elements 106 can be any type of electrical elements suitable for the electronic device 100. For example, the electronic device can be a test contactor or a component of a test contactor configured to contact and test electrical devices (hereinafter an electrical device being or to be tested will sometimes be referred to as a "device under test" or "DUT"), and electrical elements 106 can be electrically conductive probes configured to contact and thereby make electrical connections with DUT (not shown). As another example, electronic device 100 can be a singulated semiconductor die (packaged or unpackaged) or a semiconductor die that has not been singulated from the semiconductor wafer on which the die was made. Many other non-limiting examples are possible including the following: electronic device 100 can be an electronics module comprising a plurality of electrical devices that are interconnected one to another; electronic device 100 can be an interposer, and electrical elements 106 can be spring contact structures that are electrically connected through substrate 102 to similar spring contact structures (not shown) attached to terminals (not shown) on an opposite side of the substrate 102. Many other examples are possible.

In any of the foregoing examples, substrate 102 can comprise a wiring substrate comprising electrically conductive connections (e.g., electrically conductive traces and/or vias in or on the substrate 102) between ones of the terminals 104 and/or other electrical elements, components, structures, etc. on or in the substrate 102. In some examples, substrate 102 can comprise a wiring substrate such as a printed circuit board or a multilayer ceramic substrate with electrically conductive traces on or between layers and electrically conductive vias electrically connecting traces on different layers. Terminals 104 can be any terminal suitable for use with substrate 102. Non-limiting examples of suitable terminals 104 include pads, bumps (e.g., solder bumps), landings, posts, probes, etc.

Electrical elements 106 can be any type of electrically conductive contact structures configured to contact and thereby make electrical connections with one or more other electrical devices. For example, electrical elements can be probes, spring probes, contact structures, spring contact structures, etc. For example, electrical elements 106 can be spring contacts that comprise a compliant yet sturdy material that allows the spring contacts to repeatedly spring back after being compressed. Non-limiting examples of suitable electrical elements 106 can also include composite structures formed of a core wire bonded to a conductive terminal (e.g., like terminals 104) and over coated with a resilient material as described in U.S. Pat. No. 5,476,211, U.S. Pat. No. 5,917,707, and U.S. Pat. No. 6,336,269. Electrical elements 106 can alternatively be lithographically formed structures, such as the spring elements disclosed in U.S. Pat. No. 5,994,152, U.S. Pat. No. 6,033,935, U.S. Pat. No. 6,255,126, U.S. Pat. No. 6,938,827, U.S. Pat. No. 6,939,474, and U.S. Pat. No. 7,047, 638. Still other non-limiting examples of electrical elements 106 are disclosed in U.S. Pat. No. 6,827,584, U.S. Pat. No. 6,640,432, U.S. Pat. No. 6,441,315, and U.S. Pat. No. 7,063, 541. Other non-limiting examples of electrical elements 106 include conductive pogo pins, bumps, studs, stamped springs, needles, buckling beams, etc. In some embodiments, one, some, or all of electrical elements 106 can alternatively be electric circuit elements such as capacitors, resistors, diodes, switches, transistors, integrated circuit chips, etc.

As shown in FIG. 1, one of the electrical elements 106a can be detached (e.g., intentionally detached, accidentally broken off, or otherwise intentionally or unintentionally removed). For example, electrical element 106a may be damaged or the terminal 104a to which the electrical element 106a is attached may be damaged. The electrical element 106a can be detached in any suitable manner. For example, the electrical element 106a can be grasped and moved using any mechanical grasping tool (e.g., a tool with moveable extensions that can pinch the electrical element 106a between the moveable extensions). As another example, the electrical element 106a can be grasped using a vacuum tool. Such tools can include heating elements that can, for example, melt or soften an adhesive material (not shown), e.g., solder, that holds the electrical element 106a to the terminal 104a. As shown, the substrate 102 of the electronic device 100 can be placed on a holding structure 110. Holding structure 110 can comprise any structure suitable for supporting the substrate 102. For example, the holding structure 110 can comprise a stage or a chuck mechanism with a flat surface on which the substrate 102 can be placed. (Holding structure 110 can be a non-limiting example of a support structure.) In some non-limiting examples, electronic device 100 can be a component of a larger electronic apparatus. In such an example, electronic device 100 can be detached from the larger electronic apparatus and placed on holding structure 110. Alternatively, holding structure 110 can be configured to hold the larger electronic apparatus, and electronic device 100 can be placed on holding structure 110 without detaching electronic device 100 from the larger electronic apparatus. For example, as will be discussed, electronic device 100 can be a probe head (e.g., like probe head 4112 of FIG. 41) of a probe card assembly (e.g., like probe card assembly 4140 of FIG. 41), and electrical elements 106, 106a can be probes (e.g., like probes 4114 of FIG. 41). In such a case, holding structure 110 can, in some exemplary embodiments, be configured to hold the entire probe card assembly with the probe head and probes oriented (e.g., facing up) to be accessible.

Figure 2:
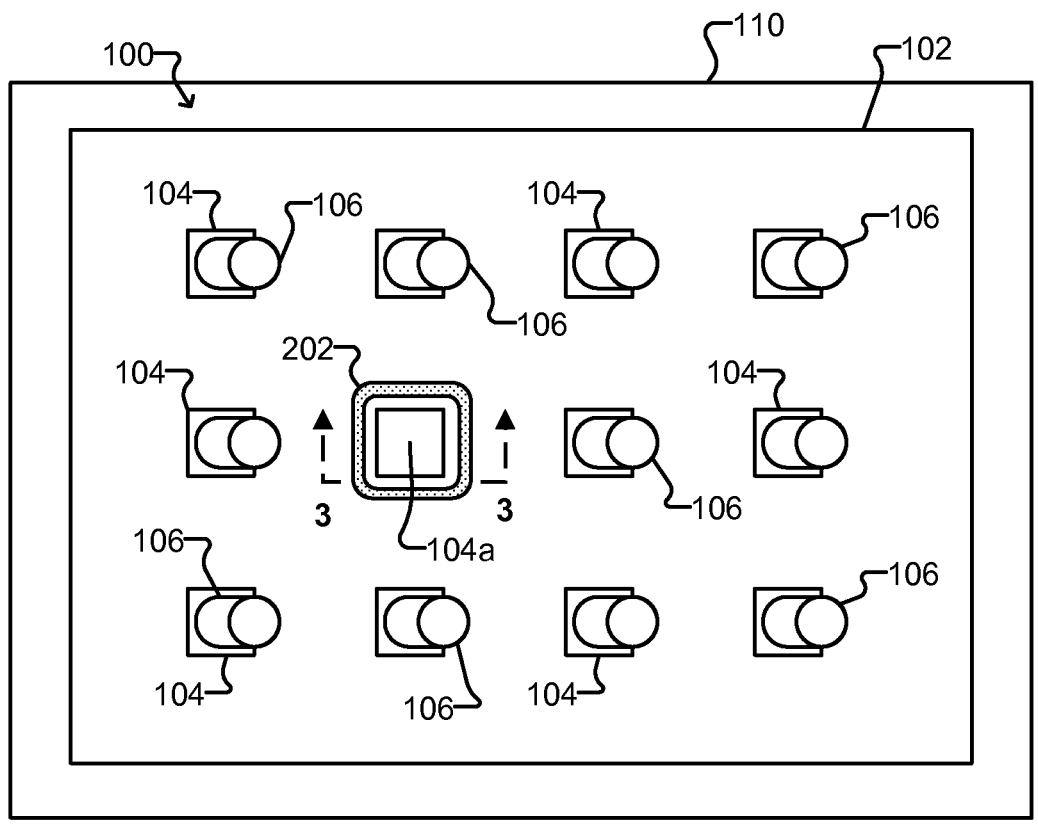
FIG. 2 shows a top view of the electronic device of FIG. 1 with a dam structure according to some embodiments of the invention.

In some instances, one or more electrical elements 106a can become detached such as by, for example, accidental breakage during use of electronic device 100 or intentional removal of the electrical element(s) 106a. As shown in FIG. 2 (which shows a top view of base substrate 102 disposed on holding structure 110), a dam structure 202 can be formed around terminal 104a. As will be discussed, a purpose of the dam structure 202 can be to define a limited space or area on the substrate 102 (e.g., the dam structure 202 can enclose a portion of the substrate 102) into or onto which a conductive adhesive material (402 in FIG. 4) can flow. As shown in FIG. 2, the dam structure 202 can be formed around terminal 104a or anywhere else conductive adhesive is to be deposited. The dam structure 202 can comprise any material that can be temporarily or permanently attached or otherwise disposed on the substrate 102 to form an enclosed structure. In some embodiments, the dam structure 202 can comprise a gasket placed on or adhered to the substrate 102. Other non-limiting examples of the dam structure 202 include an adhesive material deposited on substrate 102.

Figure 3:
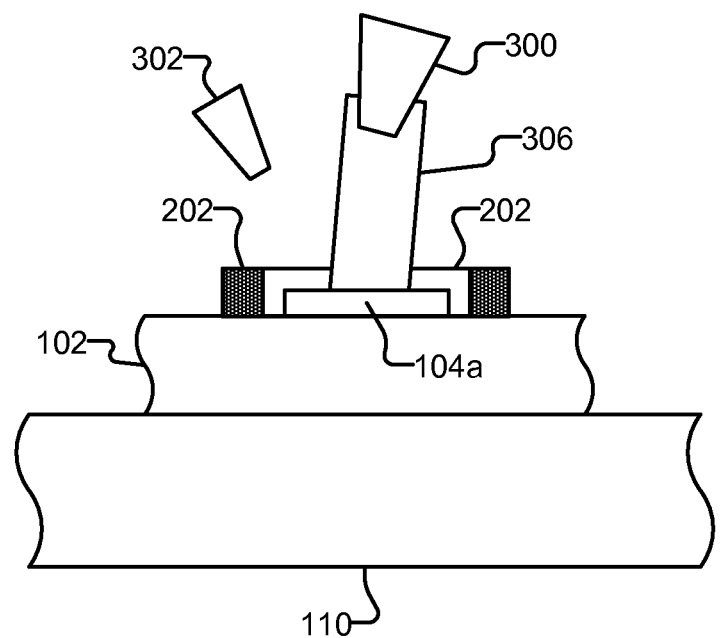
FIG. 3 shows a partial side view of the device of FIG. 1 illustrating positioning a replacement electrical element on a terminal of the electronic device of FIG. 1 according to some embodiments of the invention.

As shown in FIG. 3, a replacement electrical element 306 can be positioned on or in proximity to the terminal 104a. (Terminal 104a can be a non-limiting example of an electrical conductor, and the electrical element 306 being placed on or in proximity to the terminal 104a can be a non-limiting example of an electrical element being placed adjacent an electrical conductor.) For example, replacement electrical element 306 can be placed in contact with terminal 104a or, alternatively, replacement electrical element 306 can be spaced close to but not in contact with terminal 104a. A tool 300 (which can be a non-limiting example of a grasping tool) can be used to grasp, move, and/or hold in position the replacement electrical element 306. The tool 300 can be any tool suitable for grasping, moving, and/or holding the replacement electrical element 306. In some exemplary embodiments, the tool 300 can mechanically grasp the replacement electrical element 306. For example, tool 300 can comprise moveable fingers (not shown) that can pinch replacement electrical element 306 between the fingers. Alternatively or in addition, the tool 300 can grasp the replacement electrical element 306 using a vacuum. In some embodiments, tool 300 can be or can be part of a pick-and-place machine such as are known for handling semiconductor dies. If needed or desired, the tool 300 can be used to position the replacement electrical element 306 in generally the same position and orientation on or adjacent the terminal 104a as the original electrical element 106a. As also shown in FIG. 3, a nozzle or nozzles 302 (one is shown but more can be used) through which a heated gas (e.g., heated ambient air) can be directed can be positioned in proximity to the replacement electrical element 306. For example, nozzle 302 can be connected to a pump (not shown), which can be connected to a source (not shown) of heated gas. As will be discussed, the heated gas can be used as an aid in curing a material or materials applied to the replacement electrical element 306, terminal 104a, and/or substrate 102. Nozzle 302 can be separate from tool 300. Alternatively, nozzle 302 can be part of or otherwise attached to tool 300.

Figure 4:
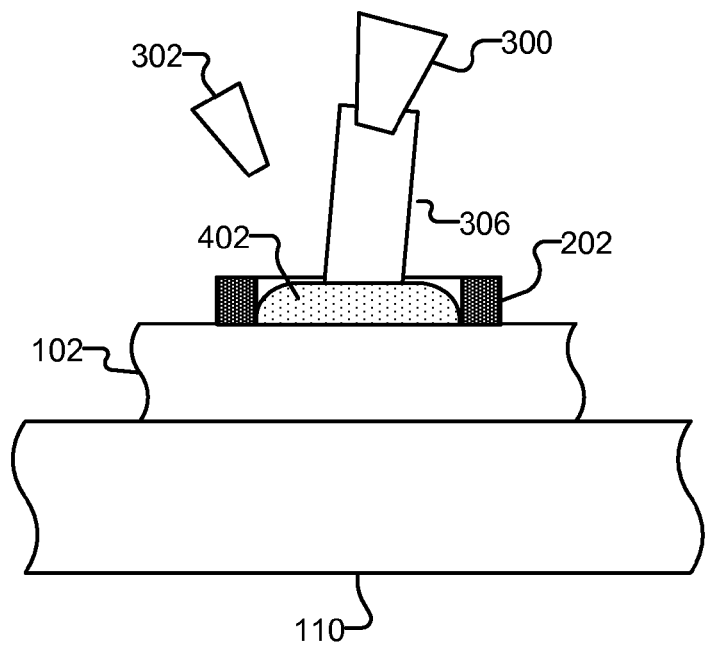
FIG. 4 illustrates application of a conductive material to the replacement electrical element and terminal shown in FIG. 3 according to some embodiments of the invention.

As shown in FIG. 4, an electrically conductive material 402 can be applied to the terminal 104a and the replacement electrical element 306. As shown, the dam structure 202 can limit the flow of the conductive material 402 to a space or area within the dam structure 202. In some embodiments, dam structure 202 is not included, and the flow of conductive material 402 can be limited or contained using other techniques. For example, the flow of conductive material 402 can be controlled by limiting the amount of conductive material 402 deposited.

Rather than apply the conductive material 402 to the replacement electrical element 306 and terminal 104a as discussed above, the electrically conductive material 402 can be applied to terminal 104a first (e.g., prior to positioning the replacement electrical element 306 on or adjacent the terminal 104a as shown in FIG. 3) and thereafter the replacement electrical element 306 can be positioned on or adjacent the terminal 104a and in the electrically conductive material 402. As yet another alternative, the conductive material 402 can be applied to an end portion of the replacement electrical element 306 that is to be positioned on or adjacent the terminal 104a and the replacement electrical element 306 can then be positioned on or adjacent the terminal 104a (e.g., as generally shown in FIG. 3). As still another alternative, the conductive material 402 can be applied to both the end portion of the replacement electrical element 306 and the terminal 104a before the replacement electrical element 306 is positioned on or adjacent the terminal 104a.

A significant purpose of the conductive material 402 can be to provide a relatively low resistance electrical connection (i.e., a high conductivity electrical connection) between the replacement electrical element 306 and the terminal 104a. For example, the resistance level of the electrical connection between the replacement electrical element 306 and the terminal 104a can be approximately the same as or less than the resistance level of the electrical connection between other electrical elements 106 and the terminals 104 to which those electrical elements 106 are attached (see FIG. 1). Conductive material 402 can be any electrically conductive material that can be applied to one or both of the replacement electrical element 306 and the terminal 104a.

In addition to electrical conductivity properties, the electrically conductive material 402 can have adhesive properties (the conductive material 402 can thus be a non-limiting example of a conductive adhesive). For example, the conductive material 402 can be an adhesive such as an epoxy. The conductive material 402 can thus adhere the replacement electrical element 306 to the terminal 104a. The conductive material 402 need not, however, have strong adhesive properties. Thus, for example, the conductive material 402 can be a weak adhesive. For example, the strength of any adhesion of the replacement electrical element 306 to terminal 104a can be less than, and in some instances, significantly less than, the strength of bonds attaching other electrical elements 106 to terminals 104.

In some embodiments, conductive material 402 can be a material that is applied in an uncured state and later cured. For example conductive material 402 can be applied to one or both of the replacement electrical element 306 and the terminal 104a in an uncured stated and then cured while the replacement electronic element 306 is properly positioned with respect to the terminal 104a. Such a conductive material 402 can be flowable (e.g., in a gel, semi-liquid, or liquid state) prior to being cured, and the conductive material 402 can change to a hardened or semi-hardened stated after being cured. In some embodiments, the conductive material 402 can cure at a temperature that is less than the reflow temperature of any material that attaches electrical elements 106 to terminals 104.

In some examples, the conductive material 402 can be cured by heating the conductive material 402 in its uncured state. The uncured conductive material 402 can be heated in any suitable manner. For example, heated gas (e.g., heated ambient air) can be directed onto the conductive material 402 through nozzle 302. Alternatively, nozzle 302 need not be used, and need not be present, or nozzle 302 can be used in combination with other techniques for heating conductive material 402. For example, heated gas can be directed onto or around conductive material 402 from the holding tool 110 or another tool (not shown) placed in proximity to the conductive material 402. As another example, tool 300 can include a heat generating mechanism that heats replacement electrical element 306, which heats conductive material 402. As another example, holding structure 110 can include a heat generating mechanism that heats substrate 102, which heats terminal 104a and conductive material 402. As still another example, a heating tool (not shown) can be placed in contact with or in proximity to the conductive material 402 to heat the material 402. As yet another example, substrate 102 can be placed in an oven (not shown) to heat and cure conductive material 402.

The time and temperature required for curing can depend on the particular characteristics of the type of material 402 being cured. In some embodiments, the time and/or temperature can be less than a time and/or temperature of a manufacturing process to join the electrical elements 106 to the terminals 104 of substrate 102. In some embodiments, the time and/or temperature can be less than a time and/or temperature to reflow a solder or other joining material that attaches the electrical elements 106 to the terminals 104 of substrate 102. Non-limiting exemplary curing times and temperatures for curing the conductive material 402 can be 80-160° Celsius for 2-20 minutes. In some embodiments, the curing time can be longer (e.g., 2-30 minutes), and in other embodiments the curing time can be shorter. In other embodiments, the curing temperature can be less than 80° Celsius, and in other embodiments, the curing temperature can be greater than 160° Celsius.

Examples of suitable conductive material 402 include, without limitation, conductive epoxies. Non-limiting examples of suitable conductive epoxies include conductive epoxies marketed under the names ABLEBOND 2030SC, ABLEBOND 2100A, and ABLEBOND 2300 by Ablestik a National Starch & Chemical Company, headquartered in Rancho Dominguez, Calif. Other non-limiting examples of suitable conductive epoxies include conductive epoxies marketed under the names EPO-TEC E-2036 and EPO-TEC E-3001 by Epoxy Technology, Inc. of Billerica, Mass. and a conductive epoxy marketed under the name CE3104 by Emerson and Cummins Company.

Figure 5:
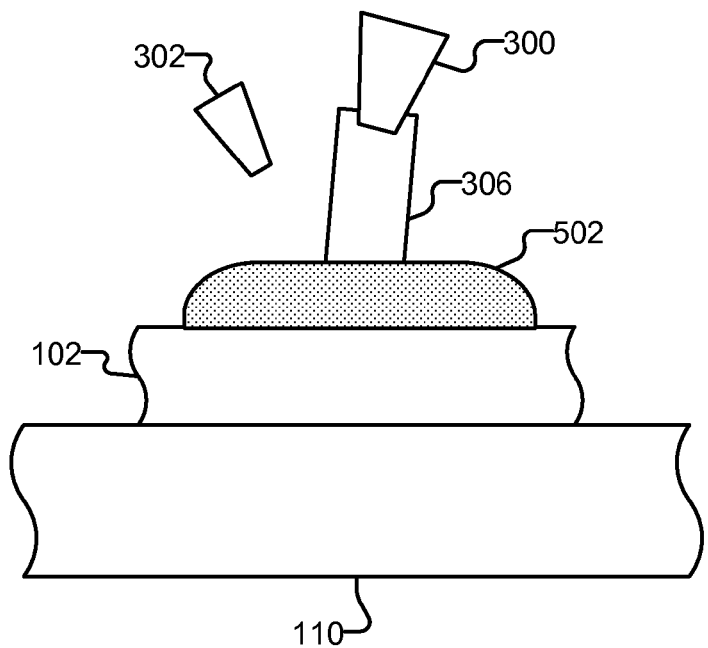
FIG. 5 illustrates application of a non-conductive adhesive material to the conductive material, replacement electrical element, terminal, and substrate shown in FIG. 4 according to some embodiments of the invention.

As shown in FIG. 5, a non-electrically conductive adhesive material 502 can be applied to the replacement electrical element 306 and terminal 104a. A significant purpose of the non-electrically conductive adhesive material 502 can be to secure the replacement electrical element 306 to the terminal 104a and/or substrate 102. The non-electrically conductive adhesive material 502 can thus be a relatively strong adhesive (at least in some instances as compared to the conductive material) that secures the replacement electrical element 306 to the terminal 104 and/or substrate 102. In some embodiments, non-electrically conductive adhesive material 502 can secure the replacement electrical element 306 to the terminal 104 and/or substrate 102 with at least as much strength as the other electrical elements 106 are attached to terminals 104. The bond between the replacement electrical element 306 and the terminal 104a and/or substrate 102 provided by the non-electrically conductive adhesive material 502 can thus be stronger, indeed significantly stronger, than any bond provided by the conductive material 402. For example, the bond provided by the non-electrically conductive adhesive material 502 can be two, three, four, five, ten, twenty, or more times stronger than any bond provided by the conductive material 402.

In addition to bonding the replacement electrical element 306 to terminal 104a, the non-electrically conductive adhesive material 502 can electrically insulate the conductive material 402; coat and protect the conductive material 402; and/or prevent the formation of debris in the form of small pieces wearing off of the conductive material 402. As should be apparent from FIG. 5, the non-electrically conductive adhesive material 502 can cover the conductive material 402 and can also cover all or part of the terminal 104a and part of the substrate 102. Alternatively, the non-electrically conductive adhesive material 502 can cover less than all of the conductive material 402 and terminal 104a. The non-conductive adhesive material 502 can also cover all or part of dam structure 202. In some embodiments, the non-conductive adhesive material 502 can cover all or part of one or more adjacent electrical elements 106 and/or terminals 104 without creating an electrical connection with the adjacent electrical element(s) 106 and/or terminal(s) 104.

In some embodiments, non-electrically conductive adhesive material 502 can be a material that is applied in an uncured state and later cured. For example, conductive non-electrically conductive adhesive material 502 can be applied to the replacement electrical element 306, the terminal 104a, and/or substrate 102 in an uncured stated and then cured while the replacement electronic element 306 is properly positioned with respect to the terminal 104a. Such a non-electrically conductive adhesive material 502 can be flowable (e.g., in a gel, semi-liquid, or liquid state) prior to being cured, and the non-electrically conductive adhesive material 502 can change to a hardened or semi-hardened stated after being cured. In some embodiments, the non-electrically conductive adhesive material 502 can be cured at a temperature that is less than the reflow temperature of any material that attaches electrical elements 106 to terminals 104.

In some examples, non-electrically conductive adhesive material 502 can be cured by heating the uncured non-electrically conductive adhesive material 502. The uncured non-electrically conductive adhesive material 502 can be heated in any suitable manner including any of the techniques discussed above for heating conductive material 402.

Examples of suitable non-electrically conductive adhesive material 502 include, without limitation, non-conductive epoxies. Non-limiting examples of suitable non-conductive epoxies include epoxies marketed under the names ABLEBOND 2035SC, ABLEBOND 2025NS, ABLEBOND 8417B, and ABLEBOND 2025DSi by Ablestik a National Starch & Chemical Company, headquartered in Rancho Dominguez, Calif. Other non-limiting examples of suitable non-conductive epoxies include non-conductive epoxies marketed under the names EPO-TEC H54 and EPO-TEC H55 by Epoxy Technology, Inc. of Billerica, Mass. and a non-conductive epoxy marketed under the name XA80215 by Emerson and Cummins Company.

Figure 6:
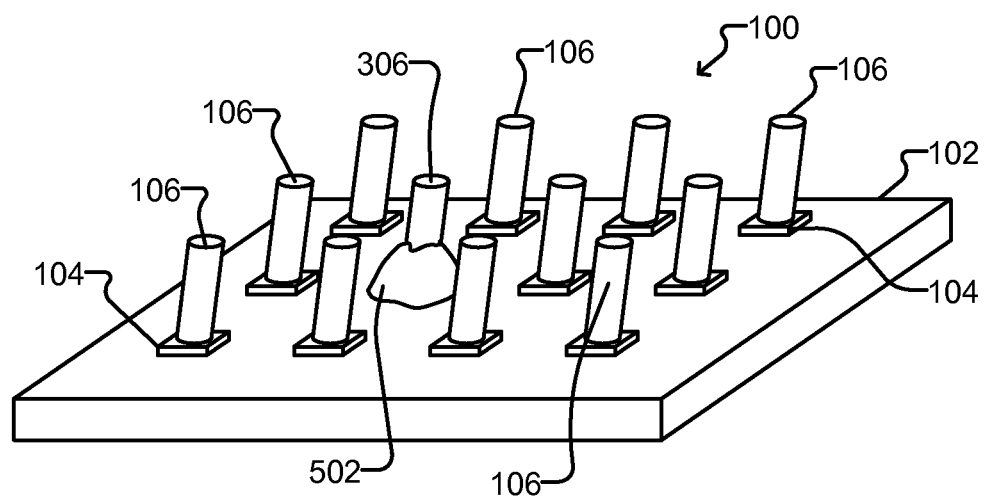
FIG. 6 illustrates the electronic device of FIG. 1 with the replacement electrical element shown in FIGS. 2-5 according to some embodiments of the invention.

FIG. 6 illustrates electronic device 100 after electrical element 106a is detached and replaced by replacement electrical element 306 as generally illustrated in FIGS. 1-5. As shown, the result can be electrical element 100 as generally shown in FIG. 1 except replacement electrical element 306 is one of the plurality of electrical elements 106. As discussed above, electronic device 100 can thus be repaired and put in working order even though one of the electrical elements 106a was damaged or otherwise not functioning properly.

The process illustrated in FIGS. 1-5 is exemplary only and many modifications and variations are possible. For example, the terminal 104a may be damaged (e.g., a piece of the terminal 104a may have broken off and be missing) or the terminal 104a may have been detached from the substrate 102. For example, the terminal 104a may be damaged or detached entirely from substrate 102 as the electrical element 106a is detached (see FIG. 1). In such a case, the conductive material 402 can be used to repair or replace the damaged or missing terminal 104a. For example, if a piece of terminal 104a is missing, conductive material 402 can be applied to the terminal 104a to fill in the missing piece, or if all of terminal 104a is missing from the substrate 102, conductive material 402 can be applied to substrate 102 to form a new terminal in the place of terminal 104a. Non-limiting examples include terminals 3102 in FIGS. 30A-31B and FIGS. 35A-36B. Thus, the terminal 104a shown in FIG. 3 can be terminal 104a as shown or can alternatively be a repaired version of terminal 104a or conductive material 402 applied to substrate 102 as a replacement for terminal 104a. Other non-limiting examples of variations and modifications to the process illustrated in FIGS. 1-5 include removing and replacing more than one electronic element 106, and performing the process in different sequences than shown in FIGS. 1-5. The foregoing as well as other exemplary modifications and variations are illustrated in some of the additional embodiments and examples that follow.

As mentioned, electrical elements 106 can be electrically conductive spring contacts or probes configured to contact and thereby make electrical connections with one or more other electronic devices. Hereinafter, for ease of discussion, only the term probe will be used, but the term probe is intended to include without limitation any type of electrically conductive spring contact structure. FIGS. 7-27 illustrate several exemplary applications of the process illustrated in FIGS. 1-5 to various exemplary probes.

Figure 7:
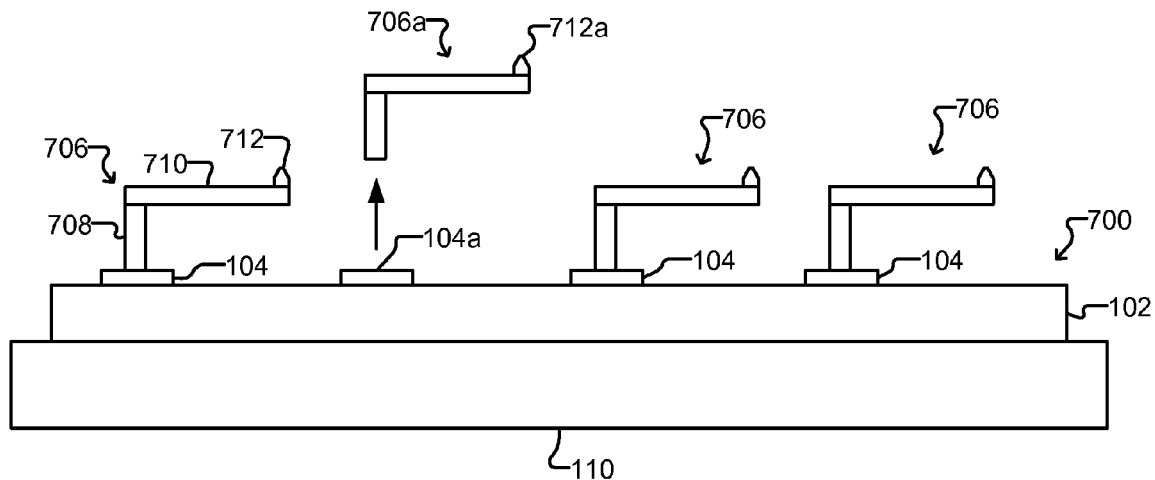
FIG. 7 illustrates an exemplary electronic device with a plurality of probes according to some embodiments of the invention.

FIGS. 7-10 illustrate an example in which the electrical elements 106 shown in FIGS. 1-6 can be electrically conductive spring probes 706 of an electronic device 700, and replacement electrical element 306 can be a replacement electrically conductive spring probe 806. FIG. 7 illustrates substrate 102 located on a holding structure 110. As shown, each of probes 706—which, as mentioned, can be non-limiting examples of electrical elements 106—can comprise a post 708, a beam 710 (which can be a non-limiting example of a spring body), and a contact tip 712. For ease of illustration and discussion, FIG. 7 is shown in side view only, and only some of terminals 104, 104a are visible. As mentioned, probes 706 can be electrically conductive so that while contact tips 712 are pressed against another electronic device, probes 706 electrically connect the other electronic device with terminals 104, 104a. The structure of probes 706—comprising a post 708, beam 710, and contact tip 712—is exemplary only, and probes 706 can take the form of many other structures including without limitation any of the exemplary probe structures described herein.

Figure 8:
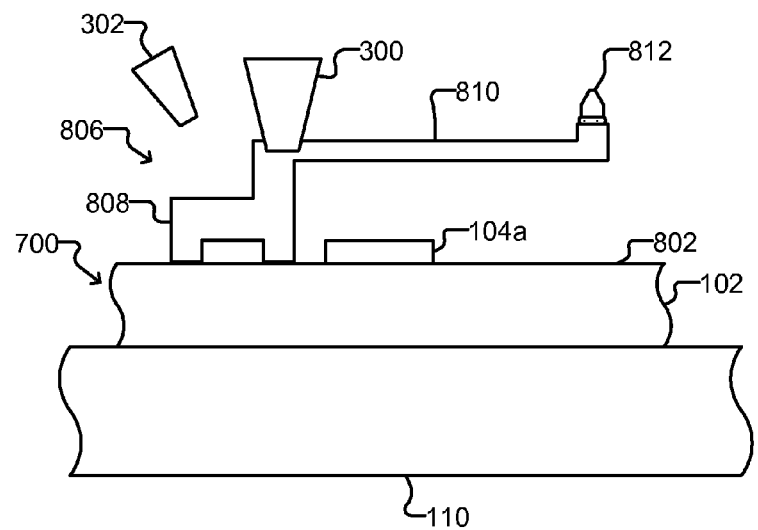
FIG. 8 shows a partial side view of the electronic device of FIG. 7 illustrating positioning a replacement spring probe on a substrate of the device according to some embodiments of the invention.

In some embodiments of the invention, one or more of the probes 706 can be detached and replaced as follows. Initially, a probe 706a can be detached from terminal 104a in generally the same way as electrical element 106a is detached from terminal 104a in FIG. 1. Alternatively, the probe 706a may have been accidentally removed (e.g., torn or ripped off), in which case the probe 706a is already detached and, of course, need not be manually detached. As shown in FIG. 8, a replacement probe 806 comprising a base 808 (a non-limiting example of a replacement base), beam 810 (a non-limiting example of a replacement spring body), and contact tip 812 (a non-limiting example of a replacement contact tip) can be positioned such that contact tip 812 of replacement probe 806 is located generally in the same location as contact tip 712a of the probe 706a was located or would have been located while probe 706a was properly attached to terminal 104a. The replacement probe 806 can be grasped, moved, and held in place by tool 300. As shown in FIG. 8, the base 808 of the replacement probe 806 can be positioned to be in contact with or proximity to (e.g., spaced away from) a surface 802 of the substrate 102 adjacent the terminal 104a from which the probe 706a was detached. Alternatively, base 808 can be positioned to contact or in proximity to terminal 104a. (The base 808 being placed in contact with or in proximity to the surface 802 of the substrate 102 or terminal 104a can be non-limiting examples of a replacement electrical element being placed adjacent an electrical conductor.)

Figure 9:
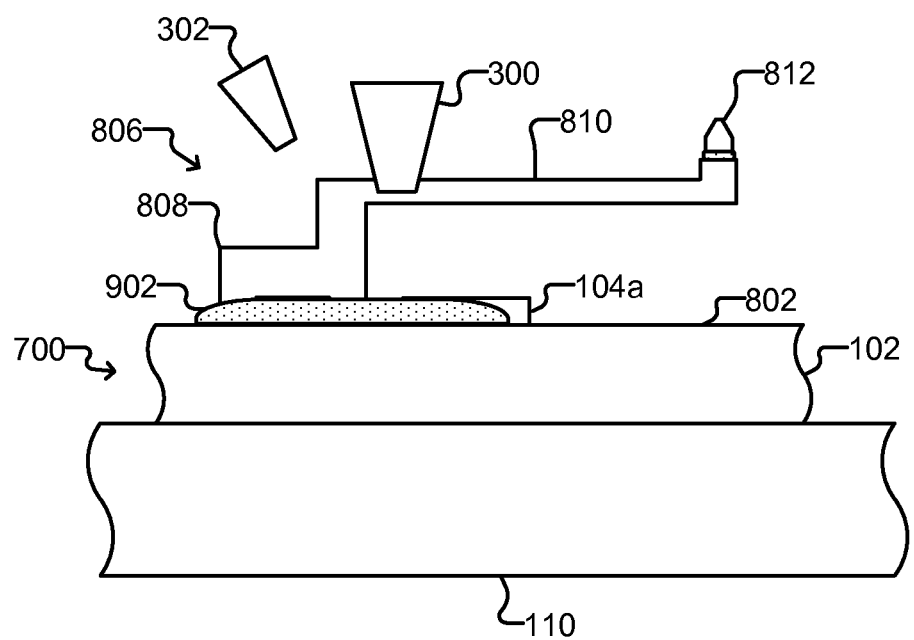
FIG. 9 illustrates application of a conductive material to the replacement spring probe, terminal, and substrate shown in FIG. 8 according to some embodiments of the invention.

As shown in FIG. 9, while tool 300 holds replacement probe 806 in place, a conductive material 902 can be applied to the terminal 104a, base 808 of the replacement probe 806, and/or surface 802 of the substrate 102. Conductive material 902 can be the same as or similar to conductive material 402, and conductive material 902 can thus have the same properties as conductive material 402 and can be processed (e.g., cured) in any way discussed above with respect to conductive material 402. As generally discussed above with respect to conductive material 402, conductive material 902 can electrically connect the base 808 of the replacement probe 806 to the terminal 104a. As also discussed above with respect to conductive material 402, conductive material 902 can be a weak adhesive and can thus weakly adhere the base 808 to the surface 802 of the substrate 102 and/or to terminal 104a.

Figure 10:
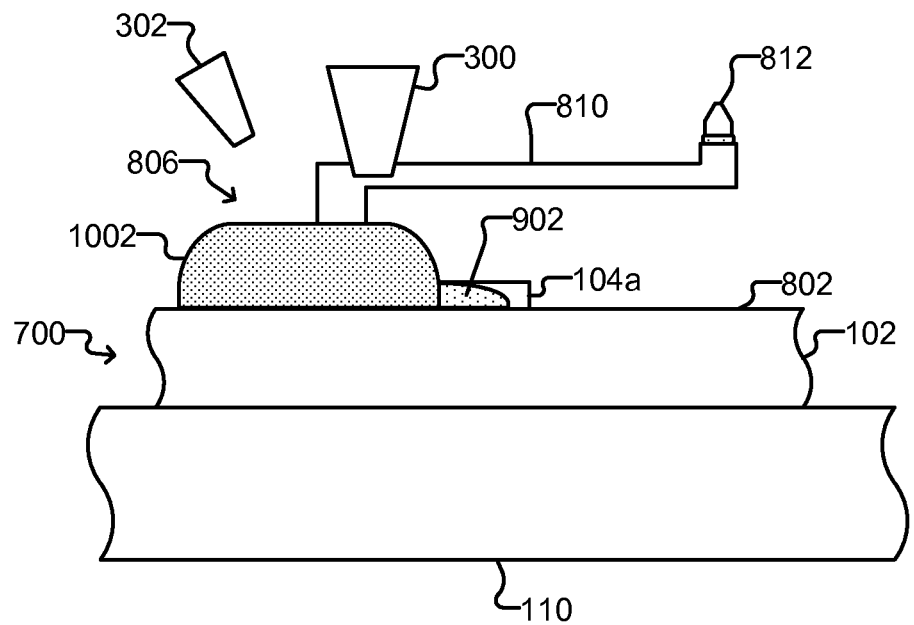
FIG. 10 illustrates application of a non-conductive adhesive material to the conductive material, replacement spring probe, terminal, and substrate shown in FIG. 9 according to some embodiments of the invention.

As shown in FIG. 10, while tool 300 continues to hold replacement probe 806 in place, a non-conductive adhesive material 1002 can be deposited over part or all of the conductive material 902, and non-conductive adhesive material 1002 can also be deposited onto the surface 802 of the substrate 102 and over part or all of the base 808 of the replacement probe 806 and the terminal 104a. In some embodiments, non-conductive adhesive material 1002 can cover all or part of adjacent or nearby components (e.g., other probes 706 in FIG. 7) and/or other terminals (e.g., like terminals 104 in FIG. 7) without electrically connecting the replacement probe 806 and/or terminal 104a to the adjacent or nearby component(s). Non-conductive adhesive material 1002 can be the same as or similar to non-conductive adhesive material 502, and non-conductive adhesive material 1002 can thus have the same properties as non-conductive adhesive material 1002 and can be processed (e.g., cured) in any way discussed above with respect to non-conductive adhesive material 1002. As discussed above with respect to non-conductive adhesive material 1002, a significant purpose of non-conductive adhesive material 1002 can be to strongly adhere the replacement probe 806 to the surface 802 of the substrate 102 and/or terminal 104a. For example, the non-conductive adhesive material 1002 can physically bond the replacement probe 806 to the surface 802 of the base substrate 102 and/or terminal 104a with a bond that is as strong or stronger than the bond by which other probes 706 are bonded to terminals 104. Although a significant purpose of non-conductive adhesive material 1002 can be to bond replacement probe 806 to the surface 802 of substrate 102 and/or terminal 104a, non-conductive adhesive material 1002 can also provide other advantages. For example, non-conductive adhesive material 1002 can electrically insulate the conductive material 902; coat and protect the conductive material 902; and/or prevent the formation of debris in the form of small pieces wearing off of the conductive material 902.

Once the replacement probe 806 is bonded to the surface 802 of substrate 102 and/or terminal 104a as shown in FIG. 10, the tool 300 can release the replacement probe 806. As shown in FIG. 7, a plurality of probes 706 can be attached to a plurality of terminals 104 of substrate 102. The process illustrated in FIGS. 7-10 can result in the removal of one 706a of those probes 706 and the replacement of the detached probe 706a by a replacement probe 806. Of course, more than one of the probes 706 can be detached and replaced with a replacement probe 806.

Figure 11:
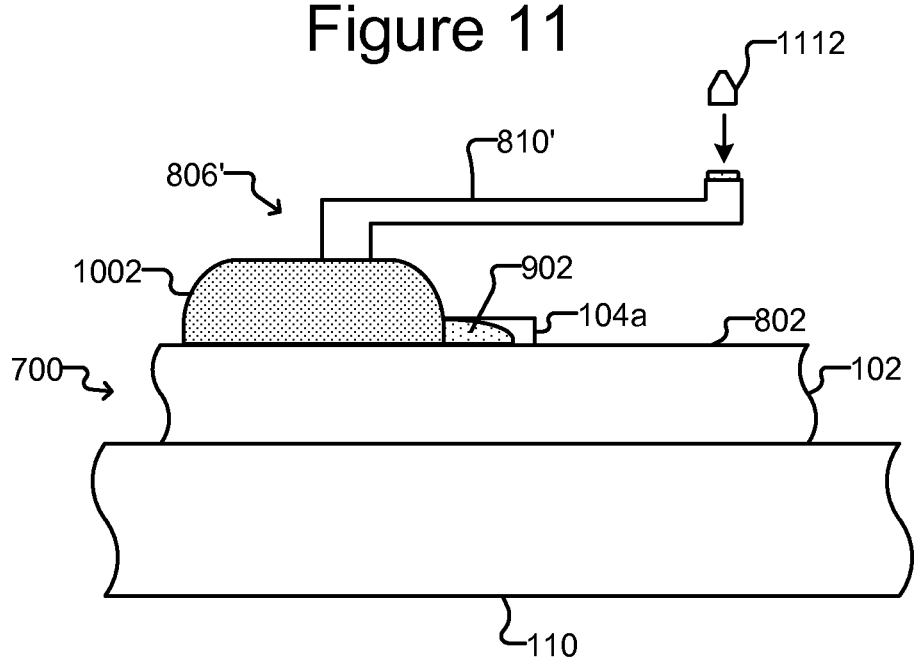
FIG. 11 illustrates attachment of a contact tip to a beam of a replacement spring probe according to some embodiments of the invention.

The process illustrated in FIGS. 7-10 is exemplary only, and many variations are possible. FIG. 11 illustrate a non-limiting example. As shown in FIG. 11, a replacement probe 806' can be generally the same as replacement probe 806 except that replacement probe 806' can lack a contact tip 812. The replacement probe 806' can be attached to the surface 802 of substrate 102 and/or terminal 104a generally in accordance with the process shown in FIGS. 7-10, and after the replacement probe 806' is attached to the surface 802 of substrate 102 and/or terminal 104a, a contact tip 1112 can be attached to the beam 810' of the replacement probe 806'. Any suitable means can be use to attached contact tip 1112 to beam 810'. For example, contact tip 1112 can be soldered to beam 810'. Alternatively, contact tip 1112 can be attached to beam 810' by a conductive adhesive material, which can be the same as or similar to any of the adhesive materials discussed above with respect to conductive material 402. As yet another example, contact tip 1112 can be attached to beam 810' by a conductive material and a non-conductive adhesive material, which can be like conductive material 402 and non-conductive adhesive material 502.

As another exemplary non-limiting variation of the process illustrated in FIGS. 7-10, contact tip 1112 can alternatively be attached to the beam 810' of the replacement probe 806' before conductive material 902 is deposited and non-conductive adhesive material 1002 is applied to attach the base 808' of the replacement probe 806' to substrate 102 and/or terminal 104a. That is, while tool 300 holds the replacement probe 806' in proper position, contact tip 1112 can be attached to beam 810. Thereafter, conductive material 902 and non-conductive adhesive material 1002 can be deposited in accordance with FIGS. 9 and 10 to electrically connect replacement probe 806' to terminal 104a and physically attach replacement probe 806' to substrate 102 and/or terminal 104a.

Figure 12:
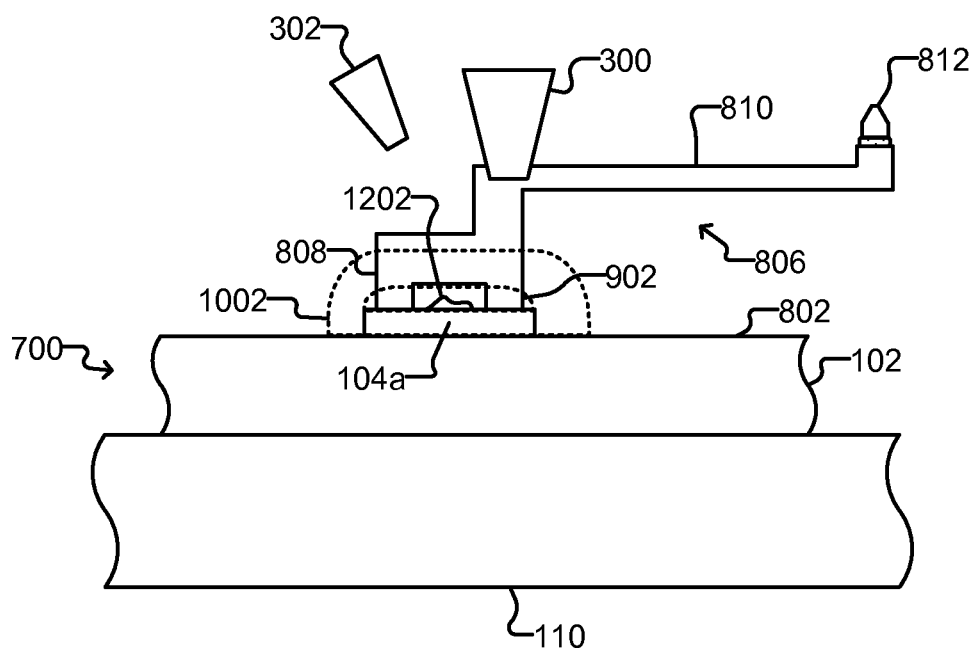
FIG. 12 illustrates variations of the process shown in FIGS. 7-11 according to some embodiments of the invention.

FIG. 12 illustrates yet another non-limiting exemplary variation of the process illustrated in FIGS. 7-10. As shown in FIG. 12, base 808 of replacement probe 806 can be placed on terminal 104a rather than on surface 802 of substrate 102. As also shown in FIG. 12, there may be debris 1202 on terminal 104a, which can remain after probe 706a (see FIG. 7) is removed from terminal 104a. For example, debris 1202 can be solder residue, pieces of probe 706a, or a combination of solder residue and pieces of probe 706a. As can be seen in FIG. 12, base 808 can be positioned on terminal 104a such that debris 1202 is located between legs of base 808. Thereafter, conductive material 902 can be deposited and cured and non-conductive adhesive material 1002 can be applied and cured generally as shown in FIGS. 9 and 10. Probe 806 in FIG. 12 can alternatively be like probe 806' (e.g., lacking tip 812), and tip 1112 can be attached to beam 810' as shown in FIG. 11 and/or as generally described above.

FIGS. 13-16 illustrate another non-limiting variation of the process shown in FIGS. 7-10. In the example illustrated in FIGS. 13-16, an electronic device 1300 can comprise a substrate 1302 having a plurality of electrically conductive traces 1304 to which a plurality of spring probes 1306 can be attached. FIGS. 13-16 show a partial side views of the electronic device 1300 located on holding structure 110. In the partial view shown in FIG. 13 (and FIGS. 14-16), only one of the probes 1306 attached to one trace 1304 is visible, but many probes like probe 1306 can be attached to many traces like trace 1304.

The electronic device 1300 can be generally like electronic device 700 or electronic device 100, and substrate 1302 can be generally like substrate 102. Spring probes 1306 can thus be non-limiting examples of electrical elements 106 and alternative configurations of spring probes 706. In addition, traces 1304 (which can be non-limiting examples of electrical conductors) can be alternatives to terminals 104, 104a.

Spring probes 1306 can each comprise posts 1308 (which can be non-limiting examples of a base), a beam 1310 (which can be a non-limiting example of a spring body), and a contact tip 1312. Like probes 706, probes 1306 can be electrically conductive so that while contact tips 1312 of the probes 1306 are pressed against another electronic device, probes 1306 electrically connect the other electronic device with traces 1304. Posts 1308, beam 1310, and contact tip 1312 can be structurally distinct elements that are attached one to another. Alternatively, two or more of posts 1308, beam 1310, and contact tip 1312 can be portions of the same integral structure.

In some embodiments of the invention, a spring probe 1306 can be detached from substrate 1302 and then reattached to substrate 1302 as follows. Initially, probe 1306 can be detached from substrate 1302 in generally the same way as electrical element 106a is detached from terminal 104a in FIG. 1. As shown, in the example illustrated in FIG. 13, a portion 1304b of the trace 1304 can break away from the substrate 1302 and be detached with the probe 1306, leaving portions 1304a, 1304c of the trace 1304 attached to the substrate 1302. Portion 1304b can break away from substrate 1302 for any number of reasons including, without limitation, any of the following: the trace portion 1304b can be purposely cut away from trace portions 1304a, 1304c; trace portion 1304b may be been damaged and therefore only weakly attached to substrate 1302; and the bond between posts 1308 and trace portion 1304b may have been stronger than the bond between trace portion 1304b and substrate 1302.

Removal of probe 1306 from substrate 1302 may result in damage to one or both of trace portions 1304a, 1304c and/or trace portion 1304b. If so, damaged portions of the trace portions 1304a, 1304b, 1304c can be detached or otherwise repaired. For example, if one or more of ends 1322 of trace portions 1304a, 1304c and/or ends 1320 of trace portion 1304b are damaged, one or more of the ends 1320, 1322 can be trimmed.

Figure 14:
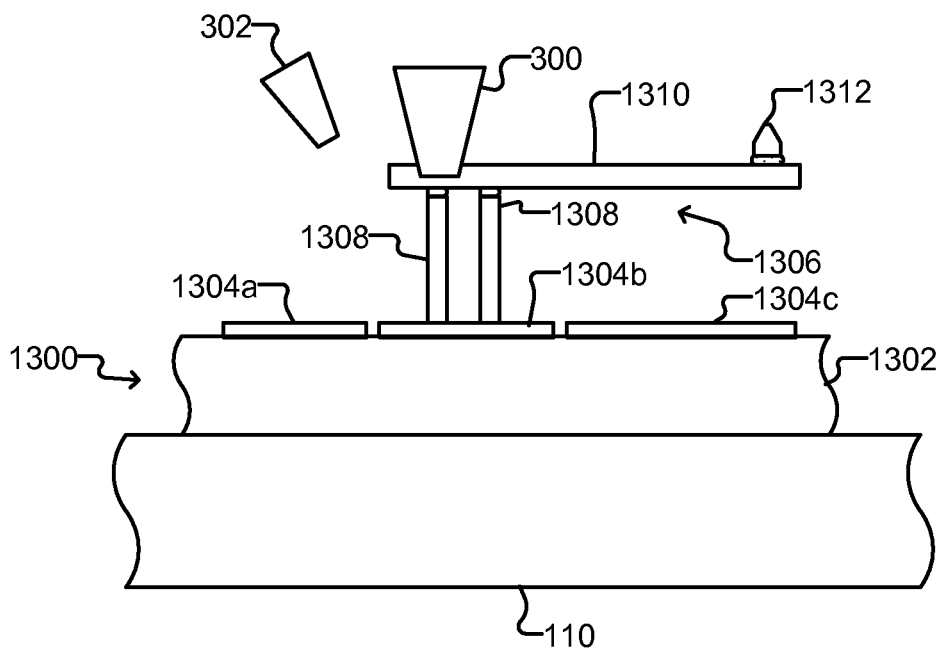
FIG. 14 shows positioning the detached spring probe on a substrate of the device according to some embodiments of the invention.

As shown in FIG. 14, the detached probe 1306 can be placed back onto substrate 1302, and probe 1306 can be positioned such that contact tip 1312 is located generally in the same location as prior to removal of probe 1306 from substrate 1302. Probe 1306 can be grasped, moved, and held in place by tool 300. As shown in FIG. 14, the trace portion 1304b that remained attached to probe 1306 can be positioned on substrate 1302 in the space between trace portions 1304a, 1304c. As mentioned, one or more of ends 1320 of trace portion 1304b and/or ends 1322 of trace portions 1304a, 1304c can be trimmed, and trace portion 1304b can therefore be smaller than the space between trace portions 1304a, 1304c as shown in FIG. 14.

Figure 15:
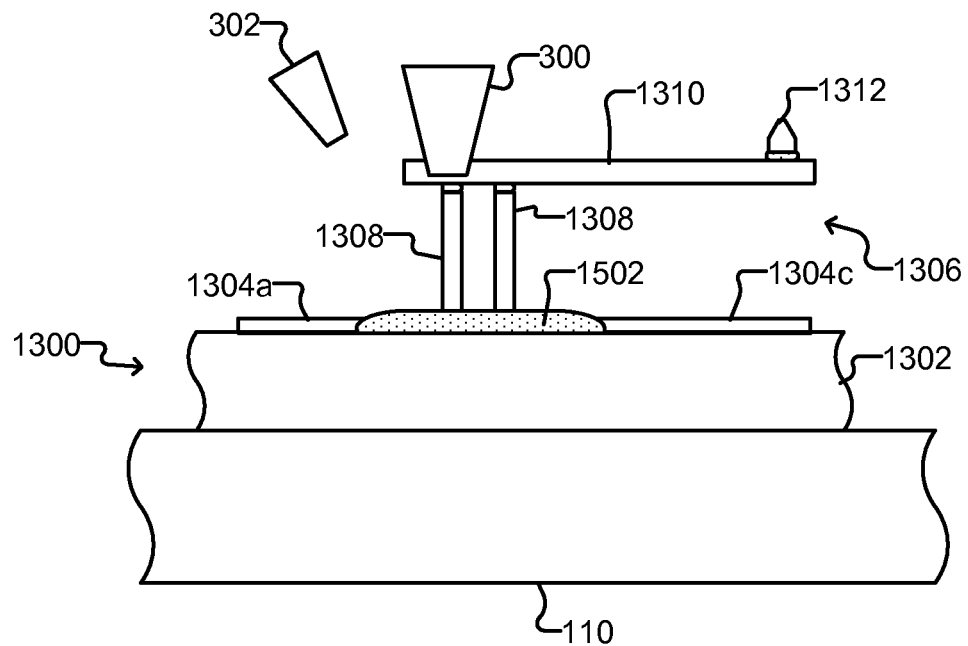
FIG. 15 illustrates application of a conductive material to the spring probe, trace, and substrate shown in FIG. 14 according to some embodiments of the invention.
Figure 16:
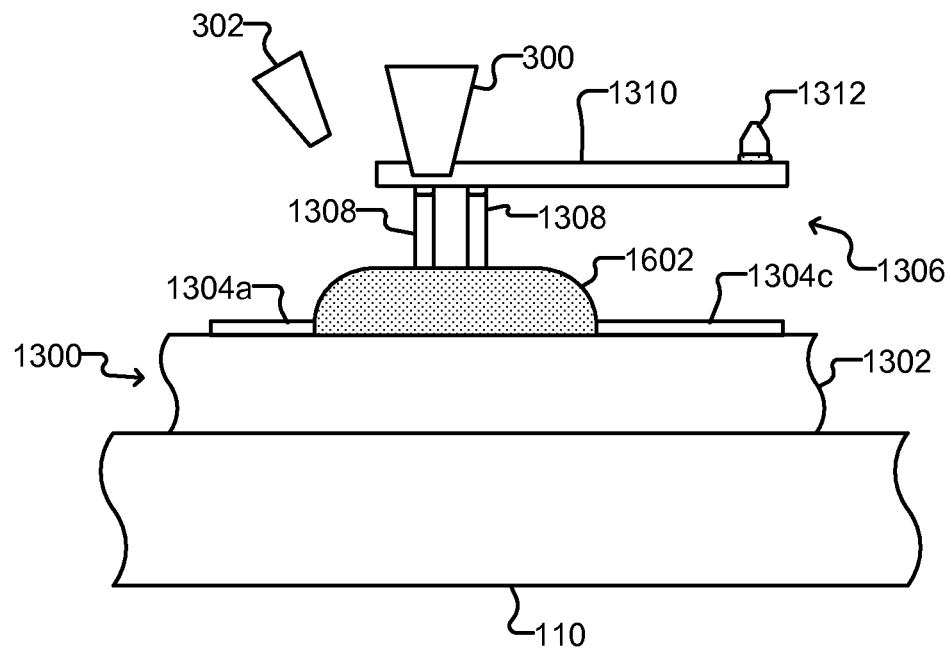
FIG. 16 illustrates application of a non-conductive adhesive material to the conductive material, spring probe, trace, and substrate shown in FIG. 15 according to some embodiments of the invention.

As shown in FIG. 15, while tool 300 holds probe 1306 in place, a conductive material 1502 can be applied to one or more of the trace portions 1304a, 1304b, 1304c; posts 1308; and substrate 1302. As shown in FIG. 16, a non-conductive adhesive material 1602 can be deposited over part or all of the conductive material 1502, and the non-conductive adhesive material 1602 can also be deposited onto posts 1308, substrate 1302, and/or trace portions 1304a, 1304c. The conductive material 1502 can be the same as or similar to conductive material 402 or conductive material 902. The conductive material 1502 can also be deposited and cured and can serve the same purposes as conductive material 402 or conductive material 902. Similarly, non-conductive adhesive material 1602 can be the same as or similar to, can be deposited and cured in the same way as, and can serve the same purposes as non-conductive adhesive material 502 or non-conductive adhesive material 1002. In some embodiments, non-conductive adhesive material 1602 can cover all or part of adjacent or nearby components (e.g., other probes like probe 1306) and/or other traces (e.g., like trace 1304) without electrically connecting the probe 1306 and/or trace 1304 to the adjacent or nearby component(s).

Once probe 1306 is bonded to substrate 1302 as shown in FIG. 16, the tool 300 can release probe 1306. As mentioned, substrate 1302 can have a plurality of traces 1304 to which a plurality of probes 1306 can be attached. The process illustrated in FIGS. 13-16 can result in the removal of one of those probes 1306 and reattachment of the detached probe 1306. Of course, more than one probe 1306 can be detached from substrate 1302 and then reattached to substrate 1302. Because spring probe 1306 is reattached to the substrate 1302, spring probe 1306 can be a non-limiting example of a replacement spring probe, and posts 1308 can be non-limiting examples of a replacement base, beam 1310 can be a non-limiting example of a replacement spring body, and contact tip 1312 can be a non-limiting example of a replacement contact tip.

Figure 13:
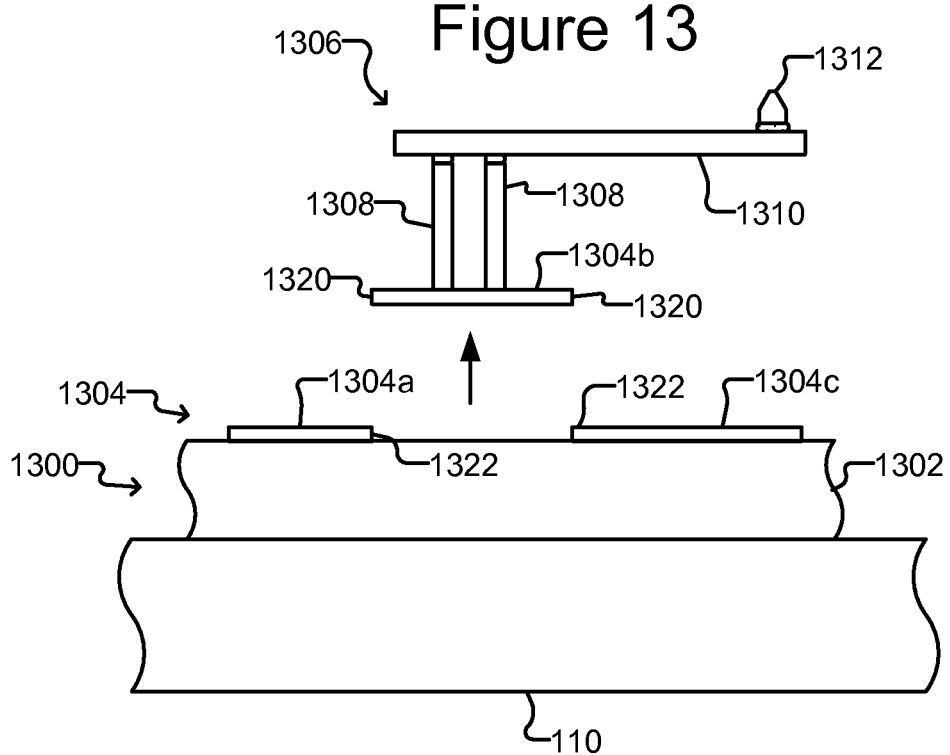
FIG. 13 illustrates a partial side view of an exemplary electronic device from which a spring probe is detached according to some embodiments of the invention.
Figure 17:
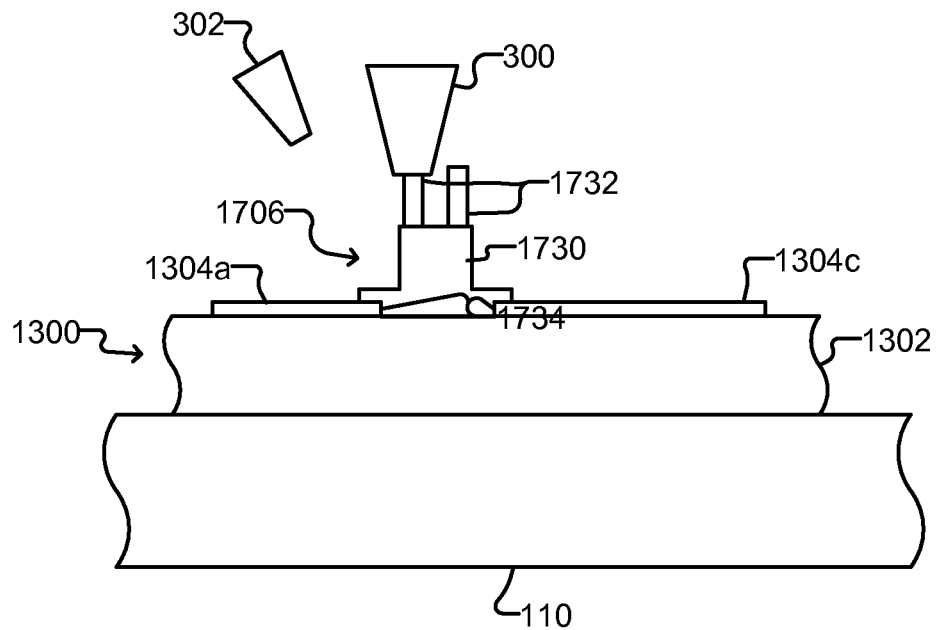
FIG. 17 shows a partial side view of the electronic device of FIG. 13 in which a replacement pedestal structure is positioned on a substrate of the device in place of the detached spring probe according to some embodiments of the invention.

FIGS. 17-20A illustrate exemplary variations of the process illustrated in FIGS. 13-16. FIG. 17 shows a partial view of holding structure 110 and substrate 1302 with trace portions 1304a, 1304c remaining on substrate 1302 after probe 1306, with trace portion 1304b, is detached from substrate 1302 as shown in FIG. 13. As shown in FIG. 17, however, replacement pedestal structure 1706 (which can be a non-limiting example of a replacement base) can comprise a base 1730 with notches 1734 configured so that the base 1730 fits generally in the space between trace portions 1304a, 1304c and overhangs trace portions 1304a, 1304c as shown in FIG. 17. As shown in FIG. 17, replacement pedestal structure 1706 can also comprise one or more posts 1732 (although two posts 1732 are shown, more or fewer can be used) that extend from the base 1730. As will be seen a beam 2010 (which can be a non-limiting example of a replacement spring body) can be attached to the posts 1732. The specific configuration of replacement pedestal structure 1706 shown in FIG. 17 is, however, exemplary only, and other configurations can be used. For example, base 1730 can extend to the height of the posts 1732 shown in FIG. 17, and posts 1732 thus need not be included. As another example, no part of base 1730 need overhand trace portions 1304a, 1304c, and base 1730 thus need not include notches 1734.

Figure 18:
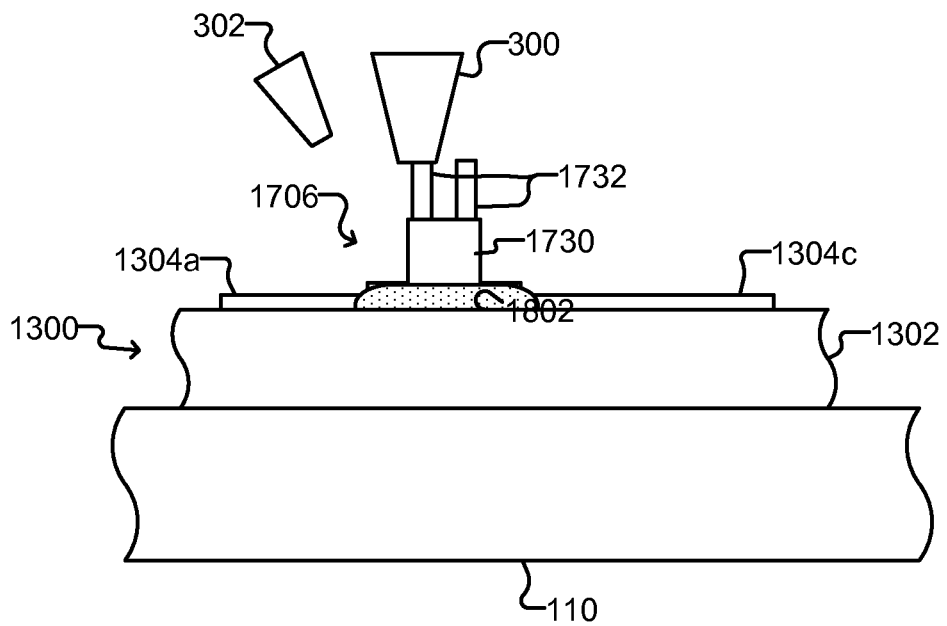
FIG. 18 illustrates application of a conductive material to the replacement pedestal structure and trace shown in FIG. 17 according to some embodiments of the invention.
Figure 19:
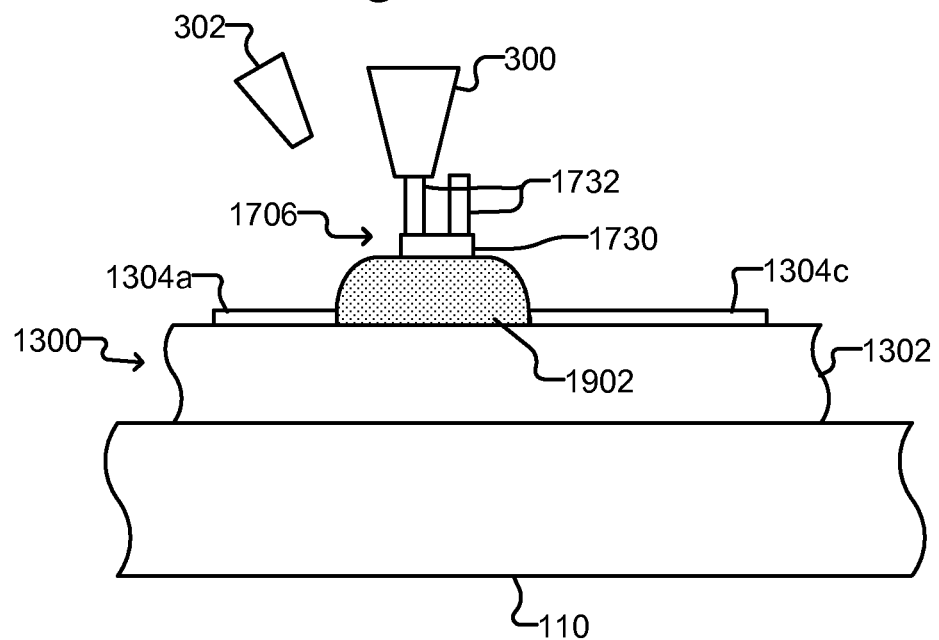
FIG. 19 illustrates application of a non-conductive adhesive material to the conductive material, replacement pedestal structure, trace, and substrate shown in FIG. 18 according to some embodiments of the invention.

As shown in FIG. 17, replacement pedestal structure 1706 can be grasped, moved, and/or held in place by tool 300. As shown in FIG. 18, while tool 300 holds replacement pedestal structure 1706 in place, a conductive material 1802 can be applied to one or more of the trace portions 1304a, 1304c, base 1730, and substrate 1302. As shown in FIG. 19, a non-conductive adhesive material 1902 can be deposited over part or all of the conductive material 1802, and the non-conductive adhesive material 1902 can also be deposited onto replacement pedestal structure 1706, substrate 1302, and/or trace portions 1304a, 1304c. The conductive material 1802 can be the same as or similar to conductive material 402, conductive material 902, or conductive material 1502. The conductive material 1802 can also be deposited and cured and can serve the same purposes as conductive material 402, conductive material 902, or conductive material 1502. Similarly, non-conductive adhesive material 1902 can be the same as or similar to, can be deposited and cured in the same way as, and can serve the same purposes as non-conductive conductive material 502, conductive material 1002, or conductive material 1602. In some embodiments, non-conductive adhesive material 1902 can cover all or part of adjacent or nearby components (e.g., other probes attached to other traces 1304) and/or other traces (e.g., like trace 1304) without electrically connecting the pedestal 1706 and/or trace 1304 to the adjacent or nearby component(s).

Figure 20A:
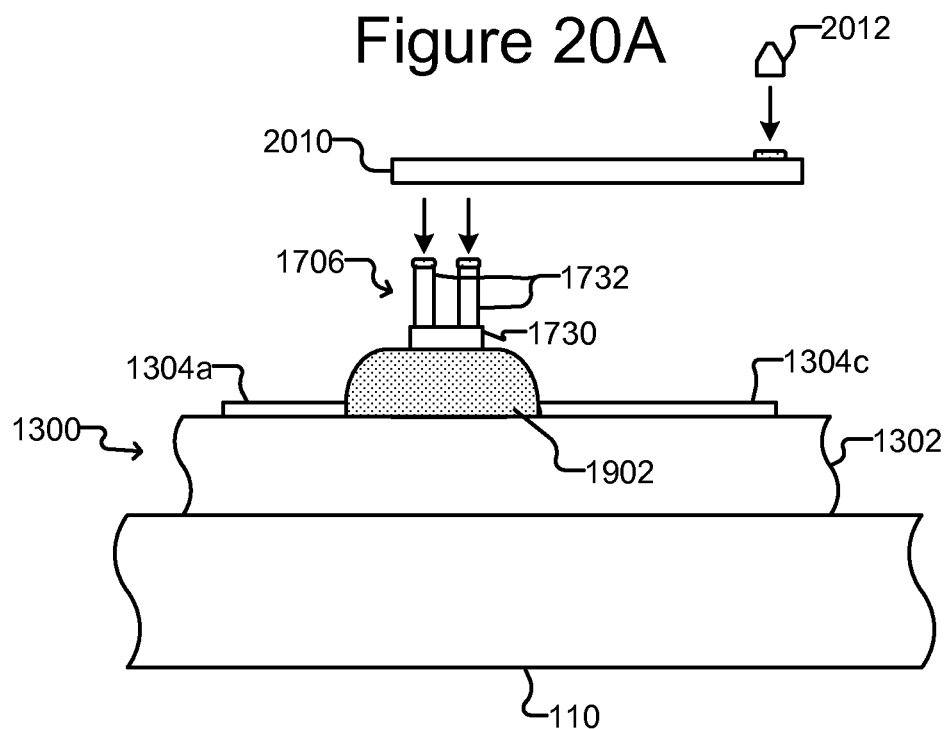
FIG. 20A illustrates attachment of a beam to the replacement pedestal shown in FIG. 19 and attachment of a contact tip to the beam according to some embodiments of the invention.

As shown in FIG. 20A, once replacement pedestal structure 1706 is bonded to substrate 1302, the tool 300 can release replacement pedestal structure 1706. A beam 2010 (which can be a non-limiting example of a replacement spring body) can then be attached to posts 1732, and a contact tip 2012 (which can be a non-limiting example of a replacement contact tip) can be attached to the beam 2010. Beam 2010 can be attached to posts 1732 using any suitable attachment mechanism, and contact tip 2012 can likewise be attached to beam 2010 using any suitable attachment mechanism. For example, beam 2010 can be soldered to posts 1732, and contact tip 2012 can likewise be soldered to beam 2010. Alternatively, beam 2010 can be attached to posts 1732 and contact tip 2012 can be attached to beam 2010 with a conductive adhesive material, which can be the same as or similar to any of the adhesive materials discussed above with respect to conductive material 402. As yet another example, beam 2010 can be attached to posts 1732 and contact tip 2012 can be attached to beam 2010 with a conductive material and a non-conductive adhesive material, which can be like conductive material 402 and non-conductive adhesive material 502. In still another variation, beam 2010 and contact tip 2012 can be portions of the same integral structure as opposed to distinct structures that are attached to each other. Regardless of how beam 2010 is attached to posts 1732 and contact tip 2012 is attached to beam 2010 (or contact tip 2012 and beam 2010 are portions of the same structure), beam 2010 and contact tip 2012 can be positioned so that contact tip 2012 is in generally the same location as contact tip 1312 of the probe 1306 detached from substrate 1302.

As mentioned, substrate 1302 can have a plurality of traces 1304 to which a plurality of probes 1306 are attached. The process illustrated in FIGS. 17-20A can result in the removal of one of those probes 1306 and replacement of the detached probe 1306 by a replacement probe comprising replacement pedestal structure 1706, beam 2010, and contact tip 2012. Of course, more than one probe 1306 can be detached and replaced with such a replacement probe.

The process shown in FIGS. 17-20A is exemplary only and many modifications and variations are possible. For example, beam 2010 can be attached to posts 1732 prior to placing the base 1730 onto substrate 1302 in the space between trace portions 1304a, 1304c. As another example, beam 2010 can be attached to posts 1732 and contact tip 2012 can be attached to beam 2010 prior to placing the base 1730 onto substrate 1302 in the space between trace portions 1304a, 1304c. As yet another example, beam 2010 can be attached to posts 1732 while tool 300 holds replacement pedestal structure 1706 in place with base 1730 in the space between traces 1304a, 1304c and before one or both of conductive material 1802 and non-conductive adhesive material 1902 are deposited onto substrate 1302. Thereafter, conductive material 1802 and/or non-conductive adhesive material 1902 can be deposited onto substrate 1302 as shown in FIGS. 18 and 19, after which, contact tip 2012 can be attached to beam 2010. As yet a further example, beam 2010 can be attached to posts 1732 and contact tip 2012 can be attached to beam 2010 while tool 300 holds replacement pedestal structure 1706 in place in the space between traces 1304a, 1304c and before one or both of conductive material 1802 and non-conductive adhesive material 1902 are deposited onto substrate 1302. Thereafter, conductive material 1802 and/or non-conductive adhesive material 1902 can be deposited onto substrate 1302 as shown in FIGS. 18 and 19. In either of the two latter examples, tool 300 can grip replacement pedestal structure 1706 in a location that does not interfere with attachment of beam 2010 to posts 1732.

Figure 20B:
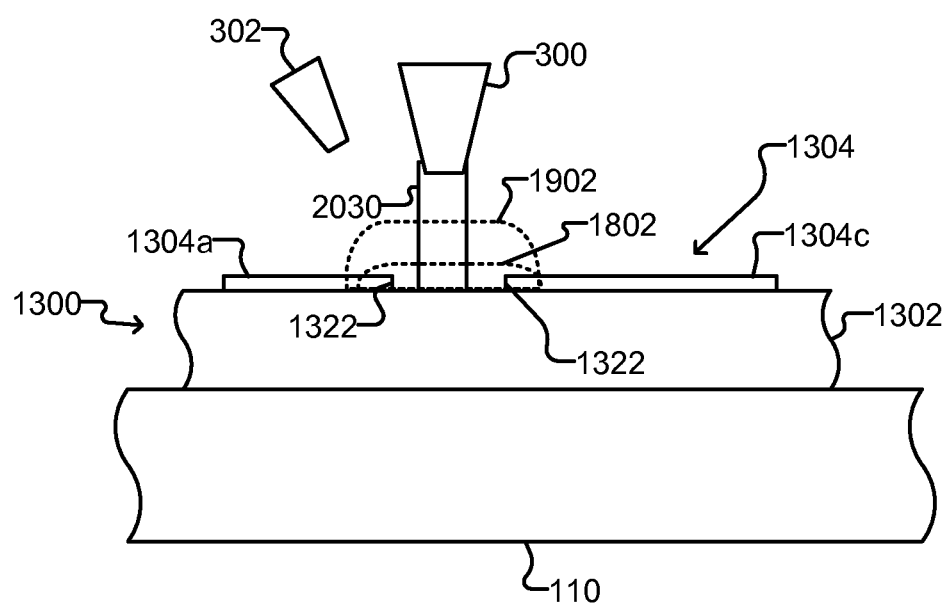
FIG. 20B illustrates exemplary variations of the process illustrated in FIGS. 17-20A according to some embodiments of the invention.

FIG. 20B illustrates another non-limiting exemplary variation of the process illustrated in FIGS. 17-20A according to some embodiments of the invention. As shown in FIG. 20B, a replacement post 2030—rather than replacement pedestal structure 1706—can be grasp by tool 300 and positioned such that an end of replacement post 2030 is between ends 1322 of trace portions 1304a, 1304c. Post 2030 can touch the surface of substrate 1302 as shown or can be held by tool 300 spaced apart from the surface of substrate 1302. Conductive material 1802 and non-conductive adhesive material 1902 can then be applied and cured as generally shown in FIGS. 18 and 19 and discussed above. Although not shown, beam 2010 and tip 2012 can be attached to replacement post 2030 generally as shown in FIG. 20A and discussed above. Replacement post 2030 can be a non-limiting example of a replacement base.

Figure 22:
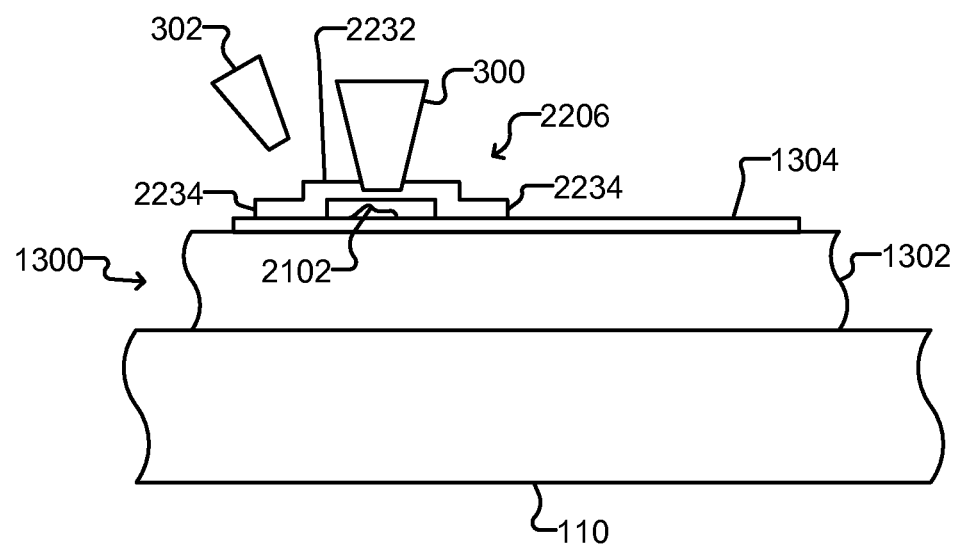
FIG. 22 shows a replacement pedestal positioned on a trace of a substrate of the device of FIG. 21 in place of the detached spring probe according to some embodiments of the invention.
Figure 23:
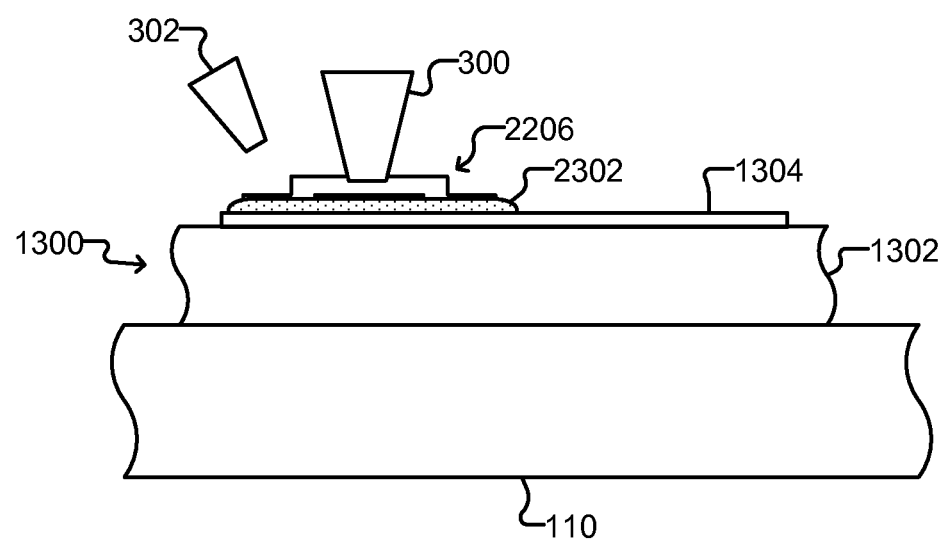
FIG. 23 illustrates application of a conductive material to the replacement pedestal and trace shown in FIG. 22 according to some embodiments of the invention.

FIGS. 21-27 illustrate more exemplary variations of the process illustrated in FIGS. 13-16. FIG. 21 shows a partial view of holding structure 110 and substrate 1302 with trace 1304. As shown in FIG. 21, however, in the example illustrated in FIGS. 21-27, probe 2106 comprising a post 2108, beam 2110, and tip 2112 is removed from trace 1304. (In the example shown in FIGS. 21-27, a plurality of probes like probes 2106 can be attached to a plurality of traces like trace 1304 on substrate 1302.) As shown, probe 2106 can have one post 2108 but otherwise can be generally similar to or the same as probe 1306 of FIG. 13. As shown in FIG. 21, probe 2106 can be detached from trace 1304 without also detaching an appreciable portion of trace 1304. Alternatively, probe 2106 can be detached with a portion (e.g., like trace portion 1304b) of trace 1304 generally as shown in FIG. 13, and probe 1306 can alternatively be detached without also detaching an appreciable portion of trace 1304 generally as shown in FIG. 21. As shown in FIG. 22, a replacement pedestal 2206, which can comprise feet 2234 and a base 2232, can be grasped, moved, and/or held in place by tool 300. As shown in FIGS. 21 and 22, debris 2102 (which can be like debris 1202 of FIG. 12) can be on trace 1304, and pedestal 2206 can be positioned on trace 1304 such that debris 2102 is located between feet 2234. As also shown in FIG. 23, while tool 300 holds replacement pedestal 2206 in place, a conductive material 2302 can be applied to trace 1304, replacement pedestal 2206, and/or substrate 1302.

Figure 24:
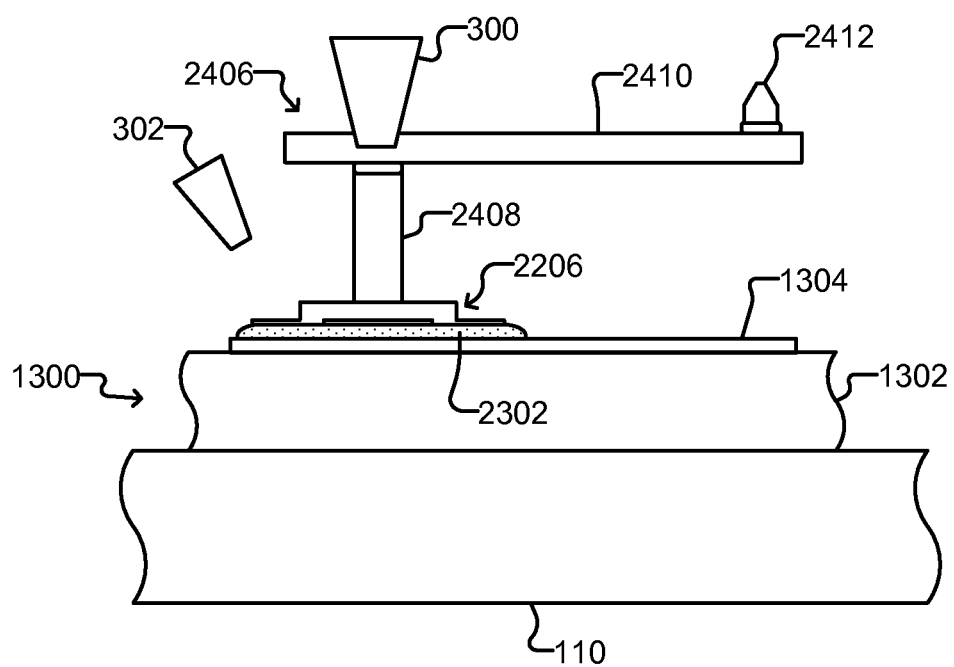
FIGS. 24 and 25 illustrate attachment of a replacement probe to the replacement pedestal shown in FIG. 23.
Figure 26:
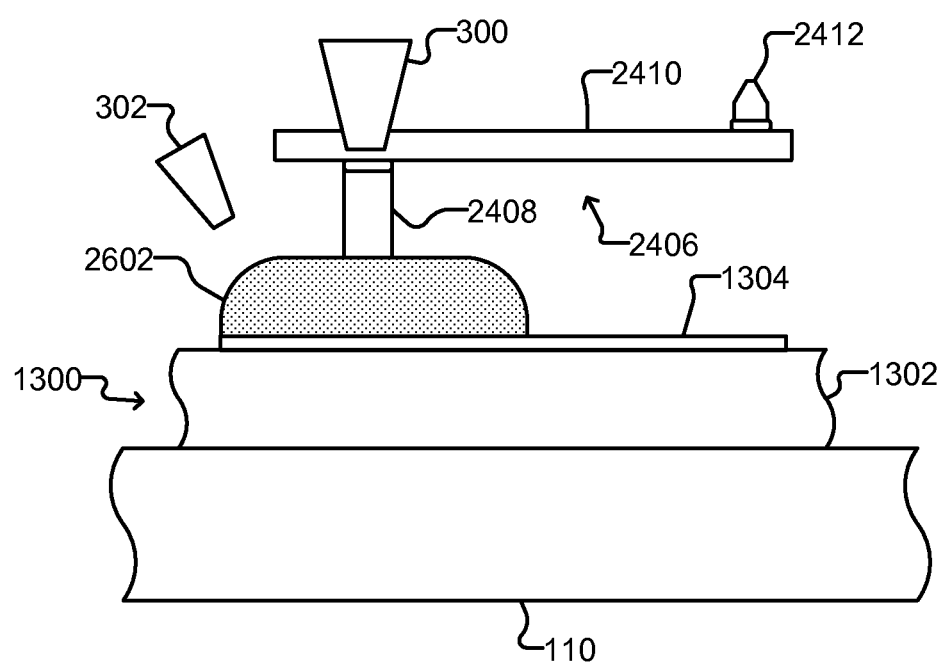
FIG. 26 illustrates application of a non-conductive adhesive material to the replacement pedestal, replacement probe, trace, and substrate shown in FIGS. 24 and 25 according to some embodiments of the invention.

As shown in FIG. 24, a post 2408 of a replacement probe 2406, which can comprise a post 2408, beam 2410, and contact tip 2412, can be placed on the replacement pedestal 2206. (The pedestal 2206 and the post 2408 can be non-limiting examples of a replacement base; beam 2410 can be a non-limiting example of a replacement spring body; and contact tip 2412 can be a non-limiting example of a replacement contact tip.) The replacement probe 2406 can be positioned such that contact tip 2412 is generally in the same position as contact tip 1312 of probe 1306 prior to removal of probe 1306 from trace 1304. The replacement probe 2406 can be grasped, moved, and held in place by tool 300, which in some embodiments, can release pedestal 2206 after conductive material 2302 is applied (see FIG. 23). Alternatively, a mechanism (not shown) (e.g., like tool 300) can be used to hold replacement pedestal 2206 in place while tool 300 grasps and positions replacement probe 2406 as shown in FIG. 24. As shown in FIG. 26, a non-conductive adhesive material 2602 can be deposited over part or all of the conductive material 2302, and the non-conductive adhesive material 2602 can also be deposited onto trace 1304, replacement pedestal 2206, and post 2408. The non-conductive adhesive material 2602 can also be deposited onto the substrate 1302.

The conductive material 2302 can be the same as or similar to conductive material 402. The conductive material 2302 can also be deposited and cured and can serve the same purposes as conductive material 402. Similarly, non-conductive adhesive material 2602 can be the same as or similar to, can be deposited and cured in the same way as, and can serve the same purposes as non-conductive conductive material 502. In some embodiments, non-conductive adhesive material 2602 can cover all or part of adjacent or nearby components (e.g., other probes attached to other traces 1304) and/or other traces (e.g., like trace 1304) without electrically connecting the replacement probe 2406 and/or trace 1304 to the adjacent or nearby component(s).

As mentioned, substrate 1302 can include a plurality of traces 1304 to which a plurality of probes 1306 are attached. As should be apparent, the process illustrated in FIGS. 21-26 can result in the removal of one of those probes 1306 and the replacement of the detached probe with probe 2406. Of course, more than one probe 1306 can be detached, and each detached probe 1306 can be replaced with a probe 2406.

Figure 25:
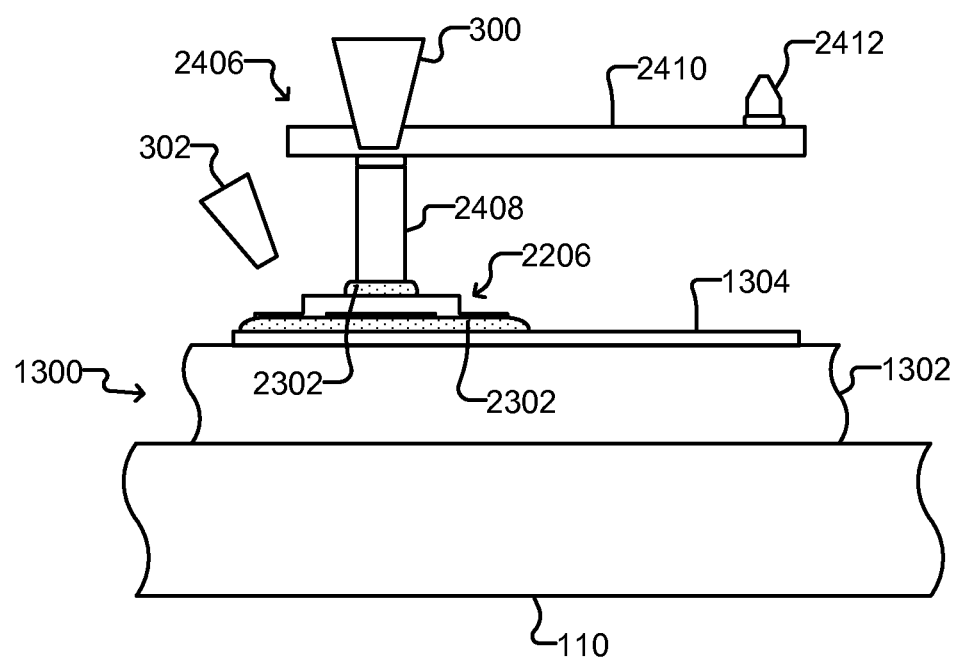

The process illustrated in FIGS. 21-26 is exemplary only and many variations are possible. For example, rather than attach the entire probe 2406 to replacement pedestal 2206 as shown in FIGS. 24-26, only the post of the probe 2408 can be attached to the replacement pedestal 2206 in accordance with the process shown in FIGS. 24-26. Thereafter, the beam 2410 can be attached to the post 2408 and the contact tip 2412 can then be attached to the beam 2410. Alternatively, the contact tip 2412 can be attached to the beam 2410 and then the beam 2410 can be attached to the post 2408. As another exemplary alternative, contact tip 2412 and beam 2410 can comprise a single structural entity rather than being distinct structural entities. As still another exemplary alternative, a structure comprising the post 2408 and beam 2410 can be attached to the replacement pedestal 2206 in accordance with the process illustrated in FIGS. 24-26, and thereafter contact tip 2412 can be attached to beam 2410. In any of the foregoing examples, the post 2408, beam 2410, and contact tip 2412 can be joined one to another using any suitable means. For example, post 2408 and beam 2410 can be soldered together, and contact tip 2412 and beam 2410 can likewise be solder together. Alternatively, post 2408, beam 2410, and contact tip 2412 can be joined together with a conductive adhesive material, which can be the same as or similar to any of the adhesive materials discussed above with respect to conductive material 402. As yet another example, post 2408, beam 2410, and contact tip 2412 can be joined together with a conductive material and a non-conductive adhesive material, which can be like conductive material 402 and non-conductive adhesive material 502.

Many other variations of the process shown in FIGS. 21-26 are possible. For example, replacement pedestal 2206 and probe 2406 can be positioned as shown in FIG. 24 before the conductive material 2302 shown in FIG. 23 is deposited onto trace 1304 and replacement pedestal 2206. In the foregoing example, once the replacement pedestal 2206 and probe 2406 are positioned as shown in FIG. 24, conductive material 2302 can be deposited onto the trace 1304, replacement pedestal 2206, and post 2408 and then non-conductive adhesive 2602 can be deposited as shown in FIG. 26. As another example of a variation, adhesive material 2602 can be deposited over the conductive material 2206 shown in FIG. 23 and also over part of the replacement pedestal 2206 to attach securely the replacement pedestal 2206 to the trace 1304 prior to placing the probe 2406 on the replacement pedestal 2206 as shown in FIG. 24.

Figure 27:
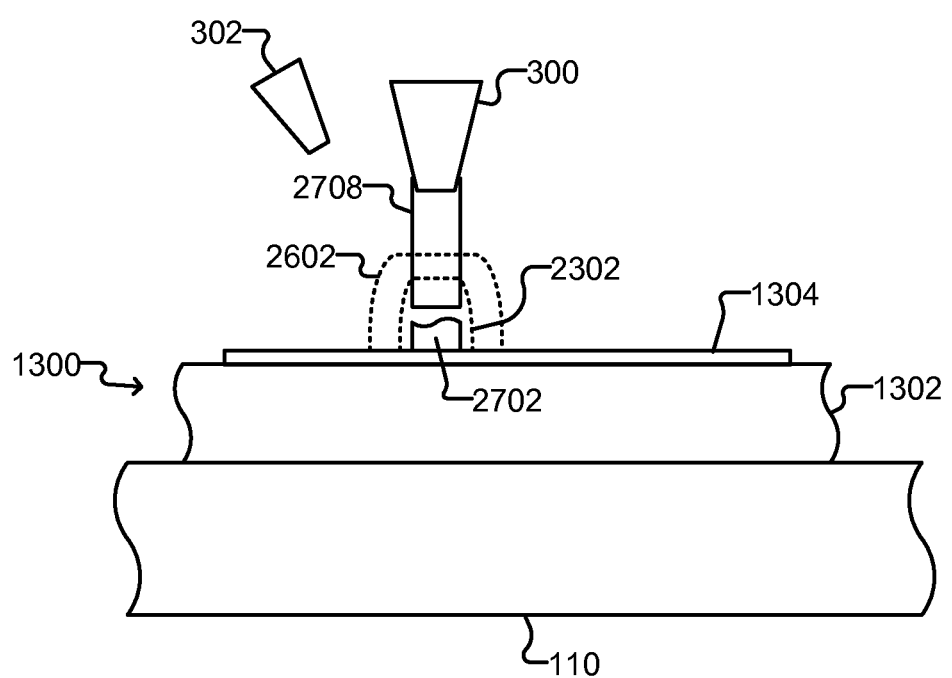
FIG. 27 illustrates variations of the process illustrated in FIGS. 21-26 according to some embodiments of the invention.

FIG. 27 illustrates another non-limiting exemplary variation of the process illustrate in FIGS. 21-26 according to some embodiments. As shown in FIG. 27, detachment of probe 2106 (see FIG. 21) breaks post 2108, and a piece 2702 of post 2108 remains attached to trace 1304. A replacement post 2708 can be grasp by tool 300 and positioned such that an end of replacement post 2708 is held in contact with or spaced apart from piece 2702. Replacement post 2708 can be sized such that, with piece 2702 and any gap between piece 2702 and replacement post 2708, replacement post 2708 extends substantially the same distance from trace 1304 as post 2108 (see FIG. 21). Conductive material 2302 can be applied to replacement post 2708, piece 2702, and/or trace 1304 as shown in FIG. 27. A significant purpose of conductive material 2302 can be to electrically connect replacement post 2708, piece 2702, and/or trace 1304. If conductive material 2302 has adhesive properties, conductive material 2302 can also function to adhere replacement post 2708 to piece 2702 and/or trace 1304. Non-conductive adhesive material 2602, which can have greater adhesive characteristics than conductive material 2302, can then be applied to replacement post 2708, piece 2702, trace 1304, and/or substrate 1302 to create and or strengthen a mechanical connection of replacement post 2708 to piece 2702, trace 1304, and or substrate 1302. Non-conductive material 2602 can cover, and thus protect, conductive material 2302. Non-conductive material 2602 can be applied and cured as generally discussed above. Although not shown, a beam (e.g., like beam) 2410 with a tip (e.g., like tip 2412) can be attached to replacement post 2708 generally as discussed in any similar example above. Alternatively, the beam and tip can be attached to the replacement post 2708 prior to applying conductive material 2302 and non-conductive adhesive material 2602. Replacement post 2708 can be a non-limiting example of a replacement base.

The process illustrated in FIG. 27 is exemplary only and variations are possible. For example, referring again to FIG. 13, probe 1306 could alternatively detach from trace 1304 without trace portion 1304b, and in some instances, pieces of posts 1308 can remain attached to trace 1304 after probe 1306 is detached. This can leave substrate 1302 with two pieces of posts 1308 that can be similar to piece 2702 shown in FIG. 27 attached to trace 1304. In such a case, a replacement pedestal structure generally similar to replacement pedestal structure 1706 (see FIG. 17) can be positioned in contact with one or both of the pieces or adjacent both of the pieces generally in the same way that replacement post 2708 is positioned in contact with or adjacent piece 2702 in FIG. 27. Conductive material (e.g., like conductive material 2302) and non-conductive adhesive material (e.g., like non-conductive adhesive material 2602) can then be applied and cured generally as shown in FIG. 27, and beam (e.g., like beam 2010) can be attached to the replacement pedestal structure (e.g., as shown in FIG. 20A).

With reference generally to the processes illustrated in FIGS. 7-27, it is noted that replacement posts (e.g., replacement posts 2030 of FIG. 20B or replacement post 2708 of FIG. 27) of different sizes and shapes and with different mechanical and/or electrical properties can be pre-manufactured and pre-stored so that when the need to replace a damaged or detached probe arises, a variety of replacement posts in different sizes and shapes and with different properties are available. In some embodiments, such replacement posts can be made in the same process as the probes attached to the electronic device were made. For example, replacement post 2708 of FIG. 27 can be made in the same manufacturing process as post 2108 of probe 2106 of FIG. 21. Similarly, replacement beams (e.g., like replacement beam 2010 of FIGS. 20A and 20B) of different sizes and shapes and with different mechanical and/or electrical properties can be pre-manufactured and pre-stored so that when the need to replace a damaged or detached probe arises, a variety of replacement beams in different sizes and shapes and with different properties are available. In some embodiments, such replacement beams can be made in the same process as the probes attached to the electronic device were made. For example, replacement beam 2010 of FIGS. 20A and 20B can be made in the same manufacturing process as probe 1306 of FIG. 13.

As mentioned above, probes 706, 1306, and 2106 shown in FIGS. 7-27 can be non-limiting examples of electrical elements 106 of FIG. 106. In addition, replacement probe 806 in FIGS. 7-10 can be a non-limiting example of replacement electrical element 306 as can replacement pedestal structure 1708, replacement post 2030, replacement post 2708, beam 2010, and contact tip 2012 in FIGS. 13-19. Replacement pedestal 2206 and probe 2406 can also be a non-limiting example of replacement electrical element 306. Likewise, traces 1304 can be non-limiting examples of terminals 104 in FIGS. 1-6. It should be apparent that the processes illustrated in FIGS. 7-27 are non-limiting examples of the more generalized process illustrated in FIGS. 1-6. Moreover, all characteristics, variations, and descriptions of the processes shown in FIGS. 7-27 are applicable to the process illustrated in FIGS. 1-6, and all characteristics, variations, and descriptions of the process shown in FIGS. 1-6 are applicable to the processes illustrated in FIGS. 7-27.

Electrical elements 106 are not limited to being probes but can be other types of electrical elements. For example, electrical elements 106 can also be circuit elements. For example, electrical elements 106 can be capacitors, resistors, diodes, switches, transistors, integrated circuit chips, or any other electric circuit element or any combination of the foregoing. FIGS. 28A-37B illustrate several exemplary applications of the process illustrated in FIGS. 1-6 in which electrical elements 106 can be one or more circuit elements.

Figure 28A:
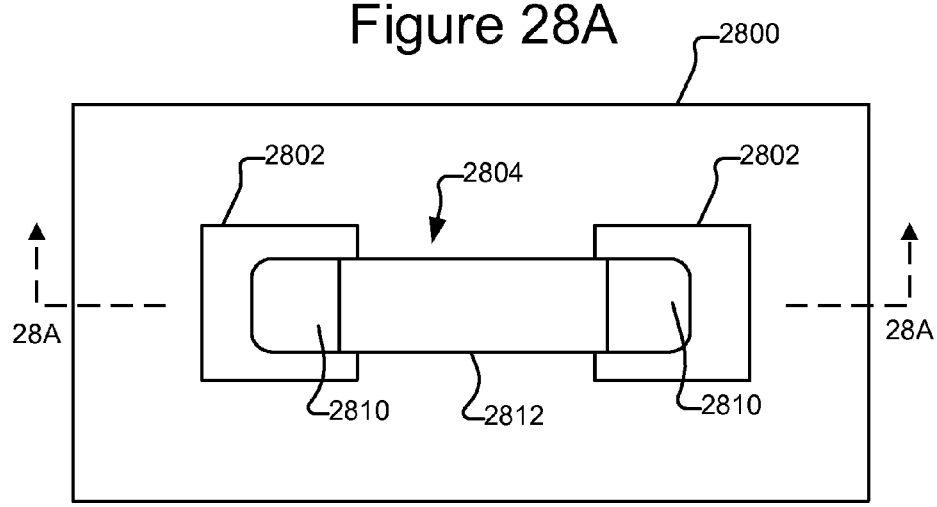
FIG. 28A illustrates a top view of a portion of an exemplary substrate to which an exemplary electric circuit element is attached according to some embodiments of the invention.
Figure 29A:
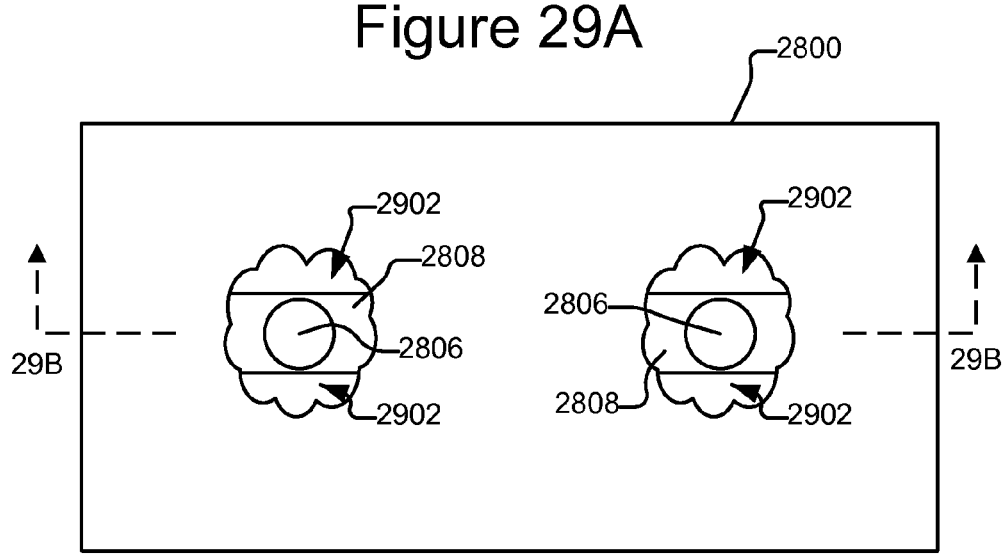
FIG. 29A illustrates a top view of the substrate of FIGS. 28A and 28B with the electric circuit element detached according to some embodiments of the invention.
Figure 29B:
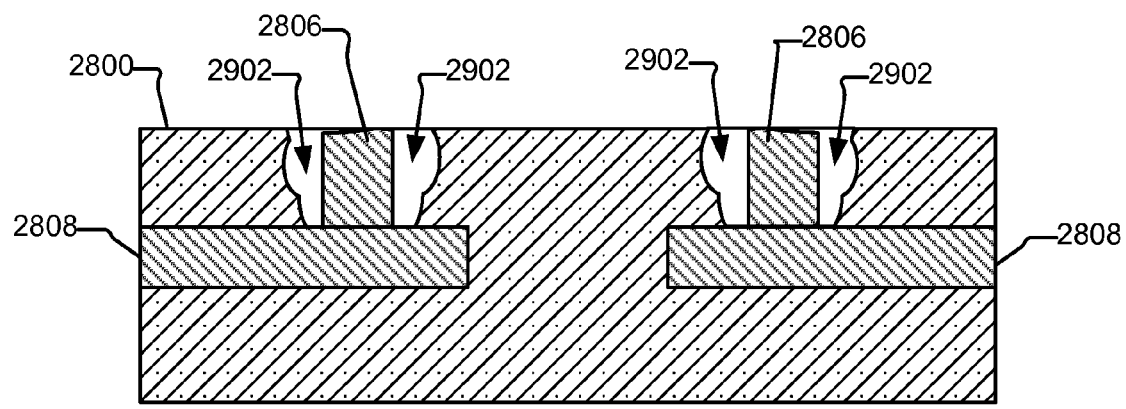
FIG. 29B illustrates a side, cross-sectional view of the substrate of FIG. 29A.

FIG. 28A illustrates a portion of an exemplary electronic device 2801 comprising a substrate 2800 with electrically conductive terminals 2802 to which an electric circuit element 2804 is attached, and FIGS. 29A and 29B illustrate the substrate 2800 after the electric circuit element 2804 and the terminals 2802 have been detached from the substrate 2800, according to some embodiments of the invention. FIGS. 30A-34B illustrate an exemplary method of replacing or attaching the electronic component according to some embodiments of the invention.

Figure 28B:
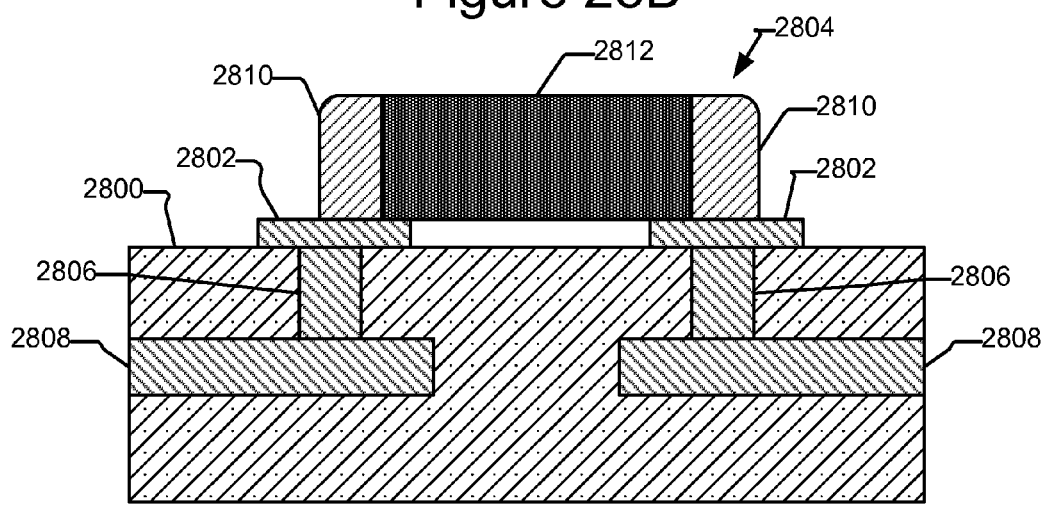
FIG. 28B illustrates a side, cross-sectional view of the substrate and electric circuit element of FIG. 28A.

Referring first to FIGS. 28A and 28B, FIG. 28A shows a top view and FIG. 28B shows a side, cross-sectional view of a portion of a substrate 2800. As shown, electrically the substrate 2800 can comprise conductive terminals 2802, and an electric circuit element 2804 can be attached to the terminals 2802. The terminals 2802 can be electrically connected by electrically conductive vias 2806 to electrically conductive traces 2808, which can be embedded in the substrate 2800. Alternatively, traces 2808 can be disposed on the same surface of the substrate 2800 as the terminals 2802. As yet another alternative, traces 2808 can be disposed on the surface of substrate 2800 opposite terminals 2802.

Substrate 2800—which can be like substrate 102 (and substrate 102 can likewise be like substrate 2800)—can be any type of substrate suitable for use in electronics. Non-limiting examples of suitable substrates include a substrate to which electrically conductive probes (not shown) are attached. Such a substrate can be part of a contactor device that is used to test electronic devices. For example, the substrate can be part of a probe card assembly, and the probes can be configured to contact pads of semiconductor dies or other electronic devices for testing the dies or devices. Other non-limiting examples of suitable substrates include a semiconductor substrate (e.g., a silicon wafer or die), organic substrates, inorganic substrates, etc.

The electric circuit element 2804 can be any electronic component suitable for being attached to terminals 2802 on a substrate 2800. Non-limiting examples of suitable electric circuit elements 2804 include capacitors, resistors, diodes, switches, transistors, integrated circuit chips, etc. For purposes of discussion and illustration, electric circuit element 2804 is illustrated as a capacitor with electrically conductive plates 2810 (which can be non-limiting examples of electrical leads) separated by a dielectric 2812. As shown in FIGS. 28A and 28B, the plates 2810 of the electric circuit element 2804 can be attached to the terminals 2802 of the substrate 2800. For example, the plates 2810 can be soldered, brazed, etc. to the terminals 2802 of the substrate 2800. In other configurations in which the electric circuit element 2804 is an electronic component other than a capacitor, terminals of the electric circuit element 2804 can be attached to terminals 2802 in the same way that plates 2810 are attached to terminals 2802 in FIGS. 28A and 28B. In some embodiments, the electrically conductive plates can comprise one or more layers of the same or different metals.

The terminals 2802—which can be like terminals 104—of substrate 2800 can be any terminal suitable for use with the substrate. Non-limiting examples of suitable terminals 2802 include pads, bumps (e.g., solder bumps), landings, posts, probes, etc. The vias 2806 and traces 2808 can be any electrically conductive structure. Although the electric circuit element 2804 is shown in FIGS. 28A and 28B with two connections (by plates 2810) to two terminals 2802 of the substrate 2800, the electric circuit element 2804 can have more or fewer such connections and can be attached to more or fewer terminals (e.g., like terminals 2802) on the substrate 2800. For example, if electric circuit element 2804 is a transistor, electric circuit element 2804 can include three terminals attached to three terminals 2802 of the substrate 2800.

Although two terminals 2802, vias 2806, and traces 2808 and one electric circuit element 2804 are shown in FIGS. 28A and 28B, substrate 2800 can have many more such terminals 2802, vias 2806, traces 2808, and electric circuit elements 2804. Moreover, additional elements can be attached to the substrate 2800. For example, electrically conductive probes (e.g., like any of the probes described herein) can be attached to terminals (e.g., like terminals 2802), which in turn can be attached to the substrate 2800, and such terminals can be electrically connected to other electronic elements (not shown) on or within the substrate 2800.

The electric circuit element 2804 can be or can become damaged. For example, the electric circuit element 2804 can be intentionally or unintentionally detached wholly or partially from the substrate 2800. As another example, the electric circuit element 2804 can become bent or broken on the substrate 2800. Regardless of how or why the electric circuit element 2804 becomes damaged, it may be desirable to repair or replace the electric circuit element 2804.

FIGS. 29A and 29B illustrate the substrate 2800 after the electronic component 2800 and the terminals 2802 have been detached from the substrate 2800. As discussed above, the electronic component 2800 may have been detached for any of several possible reasons. For example, the electric circuit element 2804 may have become damaged, and a human user may have detached the damaged electric circuit element 2804. As another example, the electric circuit element 2804 may have been detached inadvertently (e.g., the electric circuit element 2804 may have been accidentally torn or ripped from substrate 2800). As another example, the wrong type of electric circuit element 2804 may have initially been attached to the terminals 2802, and the electric circuit element 2804 may have been intentionally detached in order to replace it with a correct type of electronic component. Regardless of how or why the electric circuit element 2804 was detached, the terminals 2802 may have been partially or fully also detached. If partially detached, a human user may have detached from the substrate 2800 remaining portions of the terminals 2802.

The removal of the terminals 2802 can result in partial removal of portions of the substrate 2800 to which the terminals 2802 were attached. The result can be, as shown in FIGS. 29A and 29B, holes 2902 in the substrate 2800 where the terminals 2802 were. As also shown in FIGS. 29A and 29B, the holes 2902 can expose the vias 2806 and, in some instances, portions of one or more of the traces 2808. Although FIGS. 29A and 29B show one hole 2902 where each terminal 2802 had been, other results are possible. For example, rather than one large hole 2902 where each terminal 2802 had been (as shown in the non-limiting example depicted in FIGS. 29A and 29B), multiple smaller holes (not shown) can be created where a terminals 2802 was. As another example, some holes (e.g., like hole 2902) may not extend to traces 2808, and thus a trace 2808 may not be exposed by all of or even any of the holes (e.g., holes 2902). As yet another variation of the example shown in FIGS. 29A and 29B, in some instances, one of the terminals 2802 may remain wholly or partially in tact on the substrate 2800, or in another such variation, one or more small remnants of one or more of the terminals 2802 may remain on the substrate 2800.

As mentioned above, FIGS. 30A-34B illustrate replacing the electronic component 2802 according to some embodiments of the invention.

Figure 30A:
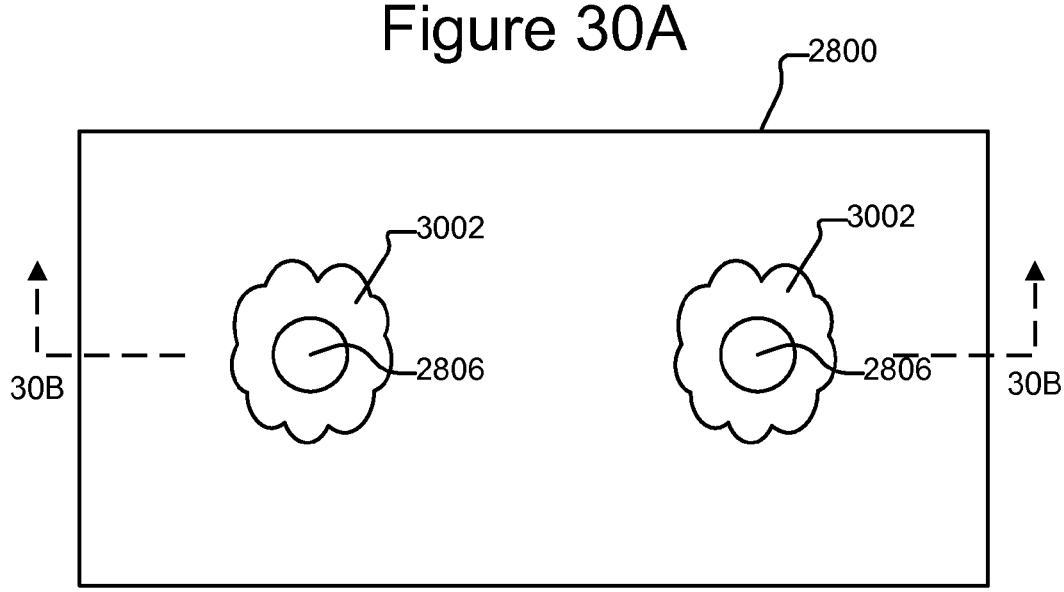
FIG. 30A illustrates a top view of the substrate of FIGS. 29A and 29B with a fill material in the holes in the substrate according to some embodiments of the invention.
Figure 30B:
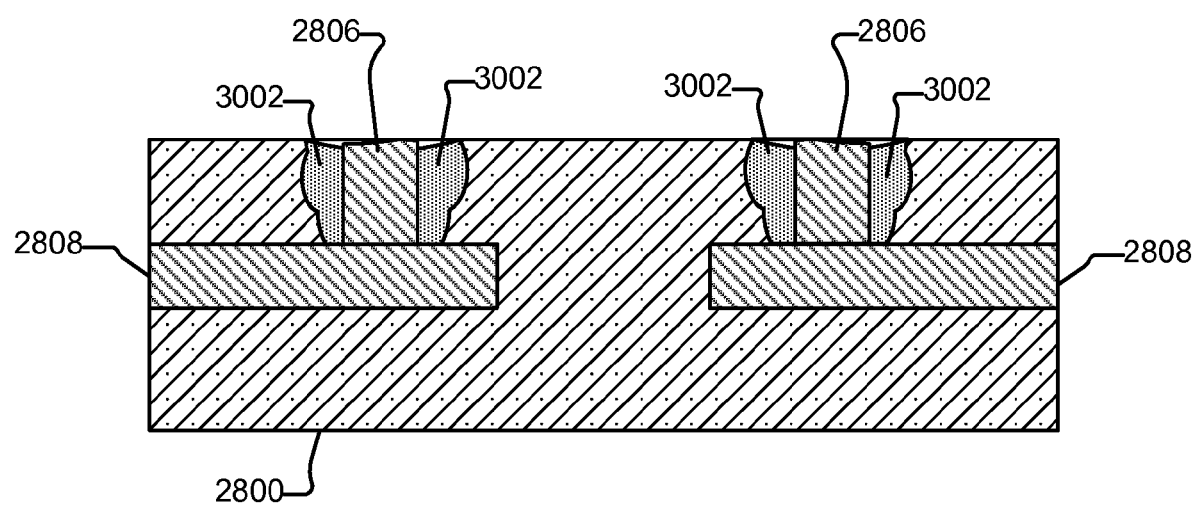
FIG. 30B illustrates a side, cross-sectional view of the substrate of FIG. 30A.

As shown in FIGS. 30A and 30B, a fill material 3002 can be deposited into the holes 2902. In some embodiments, at least enough fill material 3002 can be deposited into the holes 2902 to cover the exposed portions of a trace 2808. The fill material 3002 can be any suitable material for filling all or part of a hole 2902 and protecting any exposed portion or portions of a trace 2808. One non-limiting example of a suitable fill material 3002 is a non-conductive epoxy. Suitable non-conductive epoxies include without limitation ABLEBOND 2035SC, ABLEBOND 2025NS, ABLEBOND 8417B, ABLEBOND 2025DSi, EPO-TEC H54, EPO-TEC H55, and XA80215 discussed above. In some embodiments, if multiple traces become exposed, a non-conductive epoxy can provide structural enhancement while preventing the traces from shorting together.

The fill material 3002 can comprise a curable material, allowing, for example, the material 3002 to be deposited in liquid or paste form and then cured or hardened. Curing can be accomplished by heating the material 3002 to a desired temperature for a desired time. In some embodiments, the heating can be accomplished by flowing a heated gas (e.g., air) over the area or material to be cured. For example, the heated gas can be output from a nozzle or nozzles like 302 configured to output a heated gas. The tool can be positioned near the material 3002, and the nozzles of the tool can be pointed in the direction of the material 3002, causing heated gas exiting the nozzles to be directed at and flow onto the material 3002. In other embodiments, the heating can be accomplished by heating the substrate 2800. For example, the substrate 2800 can be placed on a chuck, stage, or other holding device (e.g., like holding structure 110), which, like holding structure 110, can include a temperature control device, such as a heater. As another example, the substrate 2800 can be placed in an oven. In still other embodiments, the heating can be a combination of flowing a heated gas and heating the substrate 2800. In still other embodiments, the substrate 2800 may include a heating element which can be used to heat the substrate 2800.

The time and temperature required for curing can depend on the particular characteristics of the type of material 3002 being cured. In some embodiments, the time and/or temperature can be less than a time and/or temperature of a manufacturing process to join the electric circuit element 2804 to the terminals 2802 of the substrate 2800. In some embodiments, the time and/or temperature can be less than a time and/or temperature to reflow a solder or other joining material used to attach the electric circuit element 2804 to the terminals 2802 of the substrate 2800. Non-limiting exemplary curing times and temperatures for curing the fill material 3002 can be 80-160° for 2-10 minutes.

Although the fill material 3002 is discussed above as being non-conductive, fill material 3002 can alternatively be electrically conductive. For example, fill material 3002 can be like the material that forms replacement terminals 3102 in FIGS. 31A and 31B (which are discussed below). The fill material 3002 can accordingly be the same as or similar to and can be deposited and cured in the same or similar manner as the material that forms the replacement terminals 3102 (as discussed below).

Whether fill material 3002 is conductive or non-conductive can depend on any of many possible factors. For example, fill material 3002 can be selected to be conductive if vias 2806 are structurally damaged and therefore structurally weak. On the other hand, if vias 2806 are structurally sound, fill material 3002 can be selected to be non-conductive.

Figure 31A:
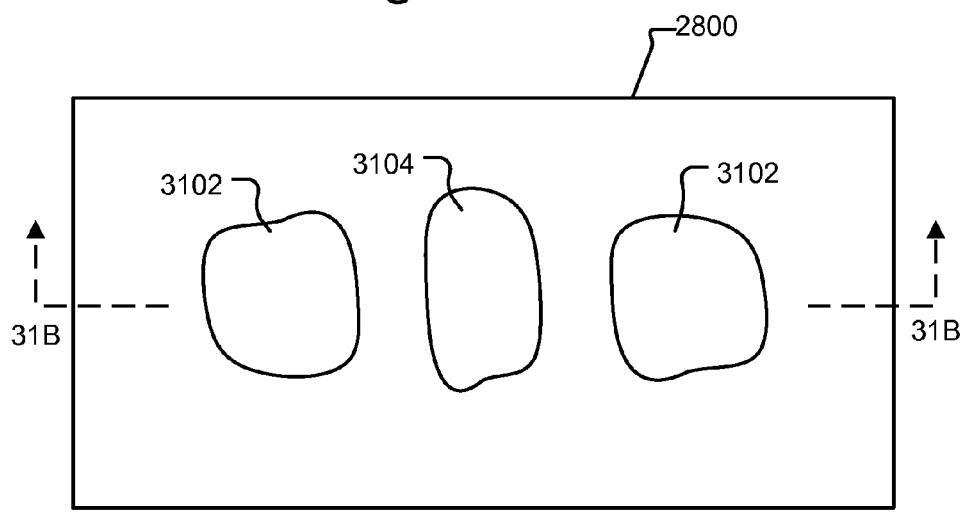
FIG. 31A illustrates a top view of the substrate of FIGS. 30A and 30B with replacement terminals and a non-conductive deposit formed on the substrate according to some embodiments of the invention.
Figure 31B:
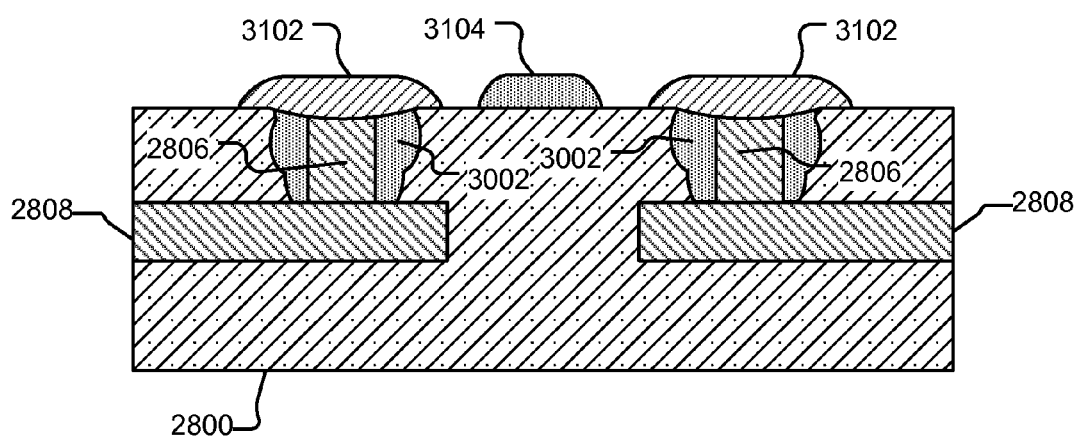
FIG. 31B illustrates a side, cross-sectional view of the substrate of FIG. 31A.

As shown in FIGS. 31A and 31B, replacement terminals 3102 can be formed on the substrate 2800. The replacement terminals 3102 can be formed by depositing an electrically conductive material on the substrate in the general area where the terminals 2802 had been. The conductive material that forms replacement terminals 3102 can be any suitable material that is electrically conductive. One non-limiting example of a suitable material for forming replacement terminals 3102 is an electrically conductive epoxy. Suitable conductive epoxies include any of the conductive epoxies discussed above with respect to conductive material 402, including without limitation ABLEBOND 2030SC, ABLEBOND 2100A, ABLEBOND 2300, EPO-TEC E-2036, EPO-TEC E-3001, and CE3104 discussed above.

The material that forms the replacement terminals 3102 can comprise a curable material, allowing, for example, the material forming the replacement terminals 3102 to be deposited in liquid or paste form and then cured or hardened. The material that forms the replacement terminals can 3102 can be cured in the same or similar manner as the fill material 3002.

As also shown in FIGS. 31A and 31B, a non-conductive material can be deposited between the replacement terminals 3102 to form an electrically non-conductive deposit 3104 between the replacement terminals 3102. The non-conductive deposit 3104 can comprise an adhesive and, as will be seen, can help adhere a replacement electric circuit element 3202 (see FIGS. 32A and 32B) to the substrate 2800. (Replacement electric circuit element 3202 can be a non-limiting example of an electrical element.) Alternatively or additionally, the non-conductive deposit 3104 can function as an insulating barrier, preventing the material that forms the replacement terminals 3102 from flowing together and thus electrically shorting the replacement terminals 3102 one to the other. The material that forms the non-conductive deposit 3104 can be any suitable material that has adhesive properties and/or is electrically non-conductive. For example, the material that forms the non-conductive deposit 3104 can comprise the same or similar material as the fill material 3002 and can be deposited and/or cured in a same or similar manner as the fill material 3002.

In some embodiments, the non-conductive deposit 3104 can be formed before forming the replacement terminals 3102. In other embodiments, the non-conductive deposit 3104 can be formed after or simultaneously with the replacement terminals 3102. In still other embodiments, a replacement terminal 3102 can be formed, the non-conductive deposit 3104 can then be formed, and another replacement terminal 3102 can then be formed.

Figure 32A:
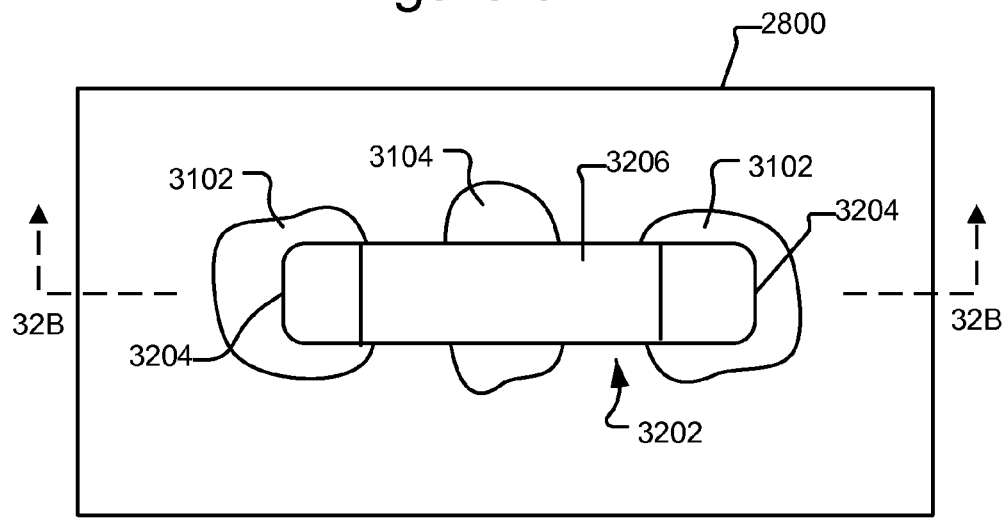
FIG. 32A illustrates a top view of the substrate of FIGS. 31A and 31B with a replacement electric circuit element according to some embodiments of the invention.
Figure 32B:
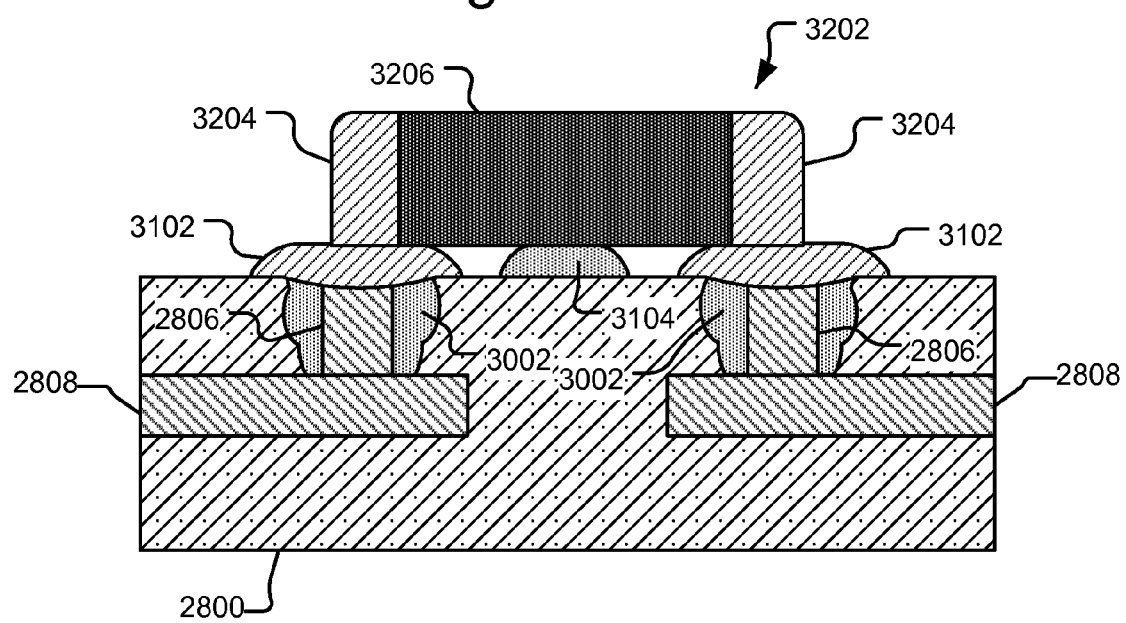
FIG. 32B illustrates a side, cross-sectional view of the substrate of FIG. 32A.

As shown in FIGS. 32A and 32B, a replacement electric circuit element 3202 can be placed on the replacement terminals 3102 and the deposit 3104, which can thus also function as a platform for supporting replacement electric circuit element 3202. For example, as shown in FIGS. 32A and 32B, the replacement component 3202 can comprise a capacitor having electrically conductive plates 3204 separated by a dielectric material 3206, which can be like the electric circuit element 2804 of FIGS. 28A and 28B. Plates 3204 of the replacement component 3202 can be placed on the replacement terminals 3102. The replacement electric circuit element 3202 can be grasped, moved, and/or held in position by a grasping tool (not shown) that can be, for example, like tool 300.

In some embodiments, if the replacement terminals 3102 and/or the non-conductive deposit 3104 comprise adhesive materials (e.g., an epoxy), the plates 3204 of the replacement component 3202 can be placed on the replacement terminals 3102 and the dielectric material 3206 can be placed on the deposit 3104 before curing the adhesive material or before the adhesive material dries or hardens. In this manner, the material that forms the replacement terminals 3102 and/or the material of the deposit 3104 can provide at least some adhesion of the replacement component 3202 to the substrate 2800. In other embodiments, the replacement terminals 3102 and/or the deposit 3104 need not provide any adhesion of the replacement component 3202 to the substrate 2800. The replacement component 3202 can be the same type of electronic component as 2804 of FIGS. 28A and 28B. For example, as discussed above, the electric circuit element 2804 can be a capacitor, and the replacement component 3202 can also be a capacitor. Alternatively, the replacement component 3202 can be a different type of electronic component than the electric circuit element 2804. For example, if the electronic component 2804 was a resistor, the replacement component 3202 can be a capacitor. Generally speaking, the replacement component 3202 can by any of the types of electronic components listed above with regard to the electric circuit element 2804 (e.g., a capacitor, resistor, diode, switch, transistor, integrated circuit chip, etc.).

Figure 33A:
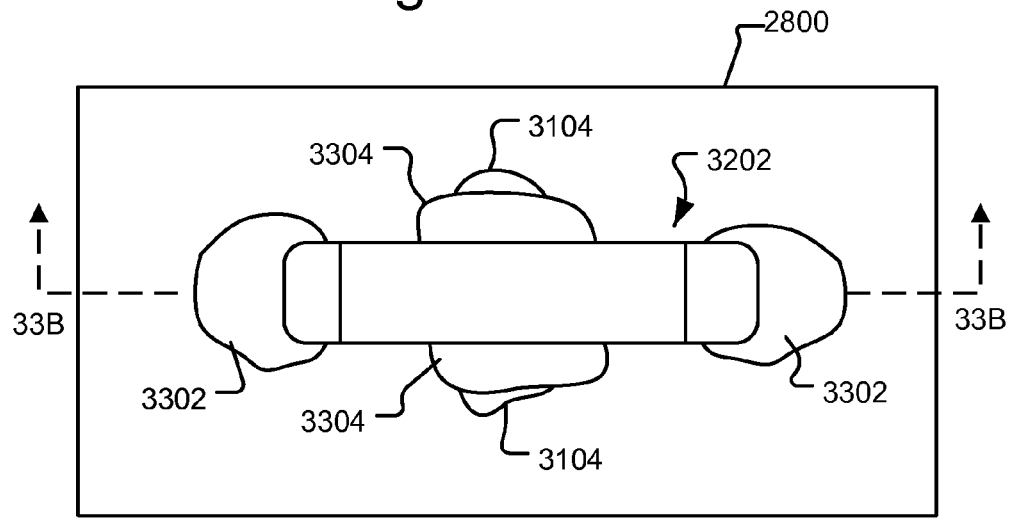
FIG. 33A illustrates a top view of the substrate of FIGS. 32A and 32B with adhesive materials deposited on the electric circuit element and substrate according to some embodiments of the invention.
Figure 33B:
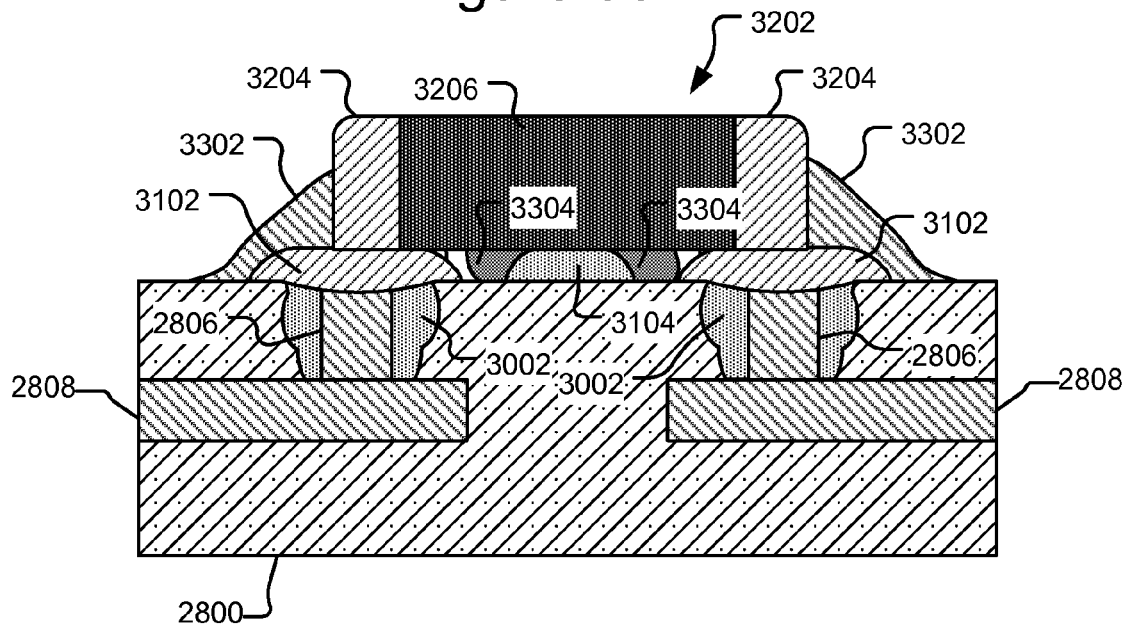
FIG. 33B illustrates a side, cross-sectional view of the substrate of FIG. 33A.

As shown in FIGS. 33A and 33B, regardless of whether the replacement terminals 3102 provide any adhesion of the plates 3204 of the replacement component 3202 to the replacement terminals 3102 of the substrate 2800 or the deposit 3104 adheres the replacement component 3202 to the substrate 2800, a first adhesive material 3302 can be deposited on and/or around the plates 3204 of the replacement component 3202, on and/or around the replacement terminals 3102. In addition, the first adhesive material 3302 can be deposited on portions of the substrate 2800 near the replacement terminals 3102, and/or the first adhesive material 3302 can be deposited on portions of the replacement component 3202 that are near the plates 3204. A significant purpose of the first adhesive material 3302 can be to hold the replacement electric circuit element 3202 to the replacement terminals 3102 and/or the substrate 2800. Even if the replacement terminals 3102 comprise an adhesive material and provide some adhesion of the plates 3204 of the replacement component 3202 to the replacement terminals 3102 and/or the deposit 3104 adheres the replacement component 3202 to the substrate 2800, the first adhesive material 3302 can provide additional adhesive strength to secure the plates 3204 of the replacement component 3202 to the replacement terminals 3102 and/or the replacement component 3202 to the substrate 2800.

In some embodiments, the first adhesive material 3302 can be electrically conductive and can be deposited over and around the electrical connections between the plates 3204 of the replacement component 3202 and the replacement terminals 3102. For example, the first adhesive material 3302 can comprise the same or similar material as the material that forms the replacement terminals 3102 and can be deposited in a same or similar manner as the material that forms the replacement terminals 3102. If the first adhesive material 3302 is electrically conductive, the first adhesive material 3302 can both hold the replacement component 3202 to the replacement terminals 3102 and/or the substrate 2800 and enhance electrical conductivity between the replacement terminals 3102 and the plates 3204 of the replacement component 3202. In such embodiments, the first adhesive material 3302 can be electrically conductive and can comprise, for example, the same or similar material as the material that forms the replacement terminals 3102 and can be deposited and/or cured in a same or similar manner as the material that forms the replacement terminals 3102. In other embodiments, the first adhesive material 3302 can be electrically non-conductive and can comprise, for example, the same or similar material as the fill material 3002 and can be deposited and/or cured in a same or similar manner as the fill material 3002. For example, the first adhesive material 3302 can be cured using any of the techniques discussed above for curing (e.g., heating) conductive material 402 including but not limited to positioning a nozzle like nozzle 302 adjacent the first adhesive material 3302 and directing heated gas from the nozzle 302 onto the first adhesive material 3302. As another example, substrate 2800 can be placed on a holding structure (e.g., like holding structure 110), and a heated gas can be directed onto or around first adhesive material 3302 from the holding tool 110 or another tool (not shown) placed in proximity to first adhesive material 3302. As another example, as mentioned, tool 300 can be used to grasp and position replacement component 3202, and tool 300 can include a heat generating mechanism that heats first adhesive material 3302. As another example, holding structure 110 can include a heat generating mechanism that heats first adhesive material 3302. As still another example, a heating tool (not shown) can be placed in contact with or in proximity to first adhesive material 3302 to heat the first adhesive material 3302. As yet another example, substrate 2800 can be placed in an oven (not shown) to heat and cure first adhesive material 3302.

In some embodiments, use of a non-conductive material as the first adhesive material 3302 can provide a barrier layer to protect the replacement terminals 3102 from being disturbed. For example, the first adhesive material 3302 can prevent particles from wearing off of replacement terminals 3102 and creating conductive debris.

As also shown in FIGS. 33A and 33B, second adhesive material 3304 can be deposited on the replacement component 3202, deposit 3104, and/or substrate 2800. The second adhesive material 3304 can provide additional adhesive strength holding the replacement component 3202 to the replacement terminals 3102 and/or the substrate 2800. The second adhesive material 3304 can be electrically non-conductive. For example, the second adhesive material 3304 can be the same as or similar to the material that forms the fill material 3002 and can be deposited and/or cured in the same or similar manner as the fill material 3002.

If the second adhesive material 3304 is electrically non-conductive, the second adhesive material 3304 can also provide an electrically non-conductive deposit between the deposits of the first adhesive material 3302, which as discussed above, can be electrically conductive. The second adhesive material 3304 can thus prevent deposits of the first adhesive material 3302 from flowing together and electrically shorting the plates 3204 of the replacement component 3202.

In some embodiments, the second adhesive material 3304 can be deposited before making any deposits of the first adhesive material 3302. In other embodiments, the second adhesive material 3304 can be deposited after or simultaneously with depositing the first adhesive material 3302. In still other embodiments, the second adhesive material 3304 can be deposited, in time, between sequential deposits of the first adhesive material 3302.

Figure 34A:
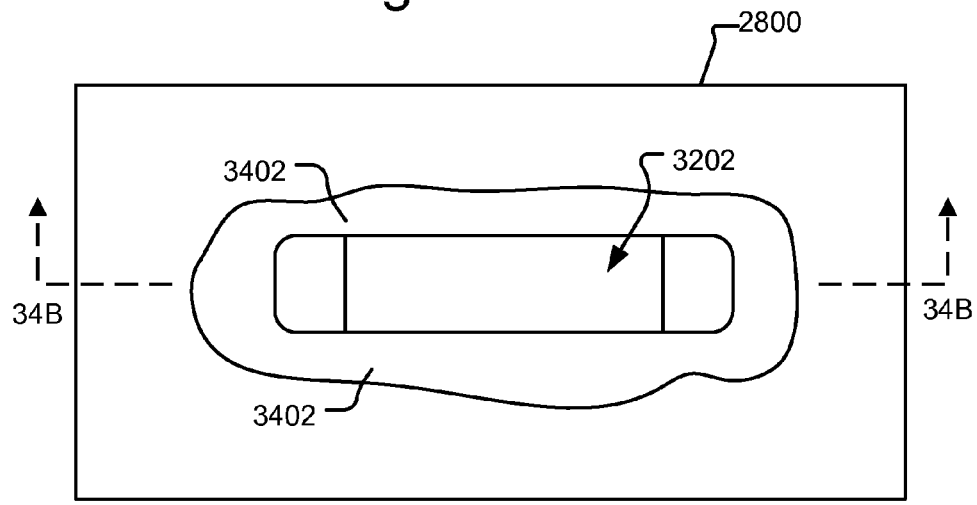
FIG. 34A illustrates a top view of the substrate of FIGS. 33A and 33B with a protective coating according to some embodiments of the invention.
Figure 34B:
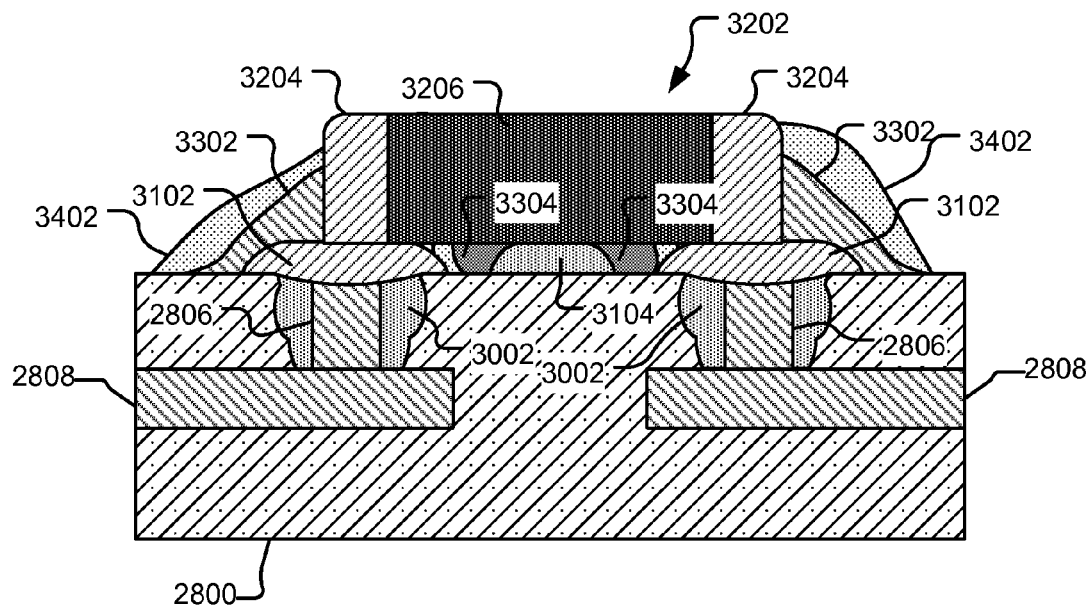
FIG. 34B illustrates a side, cross-sectional view of the substrate of FIG. 34A.

As shown in FIGS. 34A and 34B, a protective coating 3402 can be applied to the substrate 2800 on and around the replacement component 3202 or a portion thereof. The protective coating 3402 can protect the first adhesive material 3302, the second adhesive material 3304, the replacement terminals 3102, the deposit 3104, and/or the replacement component 3202. The protective coating 3402 can comprise a non-conductive material. For example, the protective coating can be the same as or similar to the fill material 3002 and can be deposited and cured in the same or similar manner. Among other benefits, the protective coating 3402 can prevent conductive materials (e.g., the material forming the replacement terminals 3102 or the material forming the first adhesion material 3302) from producing conductive debris during normal use and wear. In some embodiments, first adhesion material 3302 can cover all or part of adjacent or nearby components (e.g., other electronic components like electronic component 2804 of FIGS. 28A and 28B) and/or other terminals (e.g., like terminals 2802 of FIGS. 28A and 28B) without electrically connecting the replacement component 3202 and/or replacement terminals 3102 to the adjacent or nearby component(s).

In some embodiments, the height of the replacement component 3202 from the surface of the substrate 2800 can be controlled. For example, at the time during the process shown in FIGS. 30A-34B at which the replacement component 3202 is adhered to the replacement terminals 3102 and/or the substrate 2800, the replacement component 3202 can be held by a machine (e.g., like tool 300) at the desired height above the surface of the substrate 2800 until the adhesion material or materials is cured or hardens. For example, if the material that forms the replacement terminals 3102 and/or the deposit 3104 are epoxy materials, those materials can be deposited onto the substrate 2800 as shown in FIGS. 31A and 31B, and the replacement component 3202 can be pressed into the epoxy materials and held at the desired height above the surface of the substrate 2800 (see FIGS. 32A and 32B) until the epoxy materials are cured or harden.

The process illustrated in FIGS. 30A-34B is exemplary only and many variations are possible. For example, the first adhesive material 3302 can be non-conductive rather than electrically conductive. As another example, one or both of the first adhesive material 3302 and the second adhesive material 3304 need not be used. As yet another example, the protective coating 3402 need not be used.

Figure 35A:
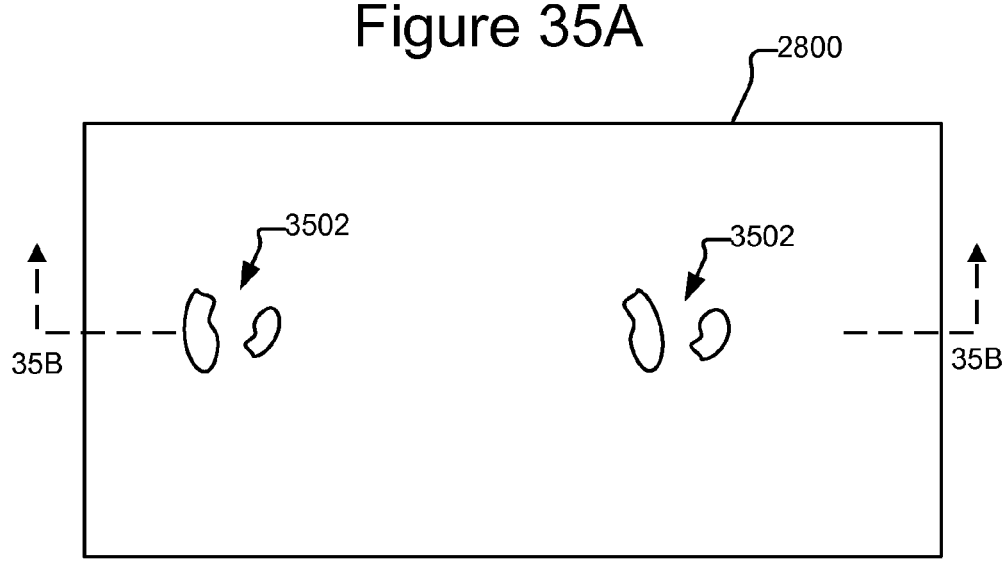
FIG. 35A illustrates a top view of the substrate of FIGS. 28A and 28B with the electric circuit element detached according to some embodiments of the invention.
Figure 35B:
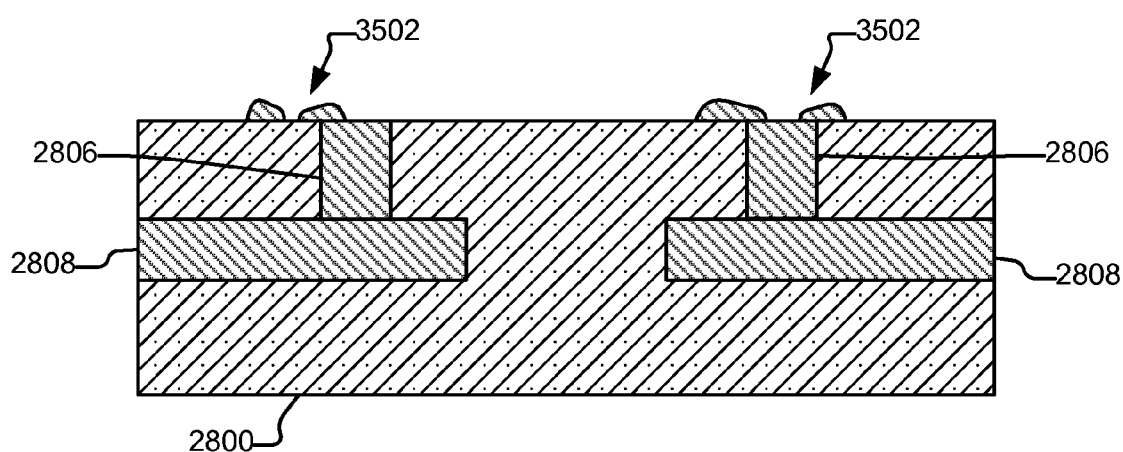
FIG. 35B illustrates a side, cross-sectional view of the substrate of FIG. 35A.
Figure 36A:
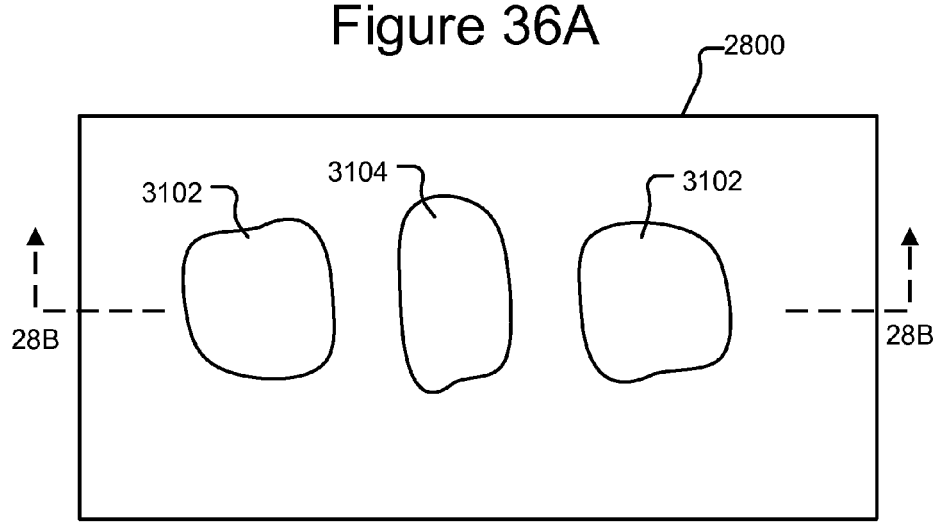
FIG. 36A illustrates a top view of the substrate of FIGS. 35A and 35B with replacement terminals and a non-conductive deposit formed on the substrate according to some embodiments of the invention.
Figure 36B:
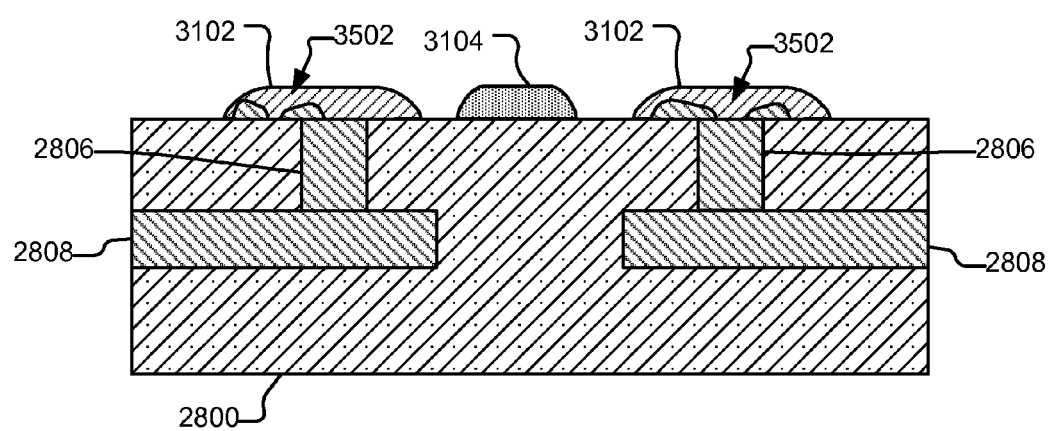
FIG. 36B illustrates a side, cross-sectional view of the substrate of FIG. 36A.
Figure 37A:
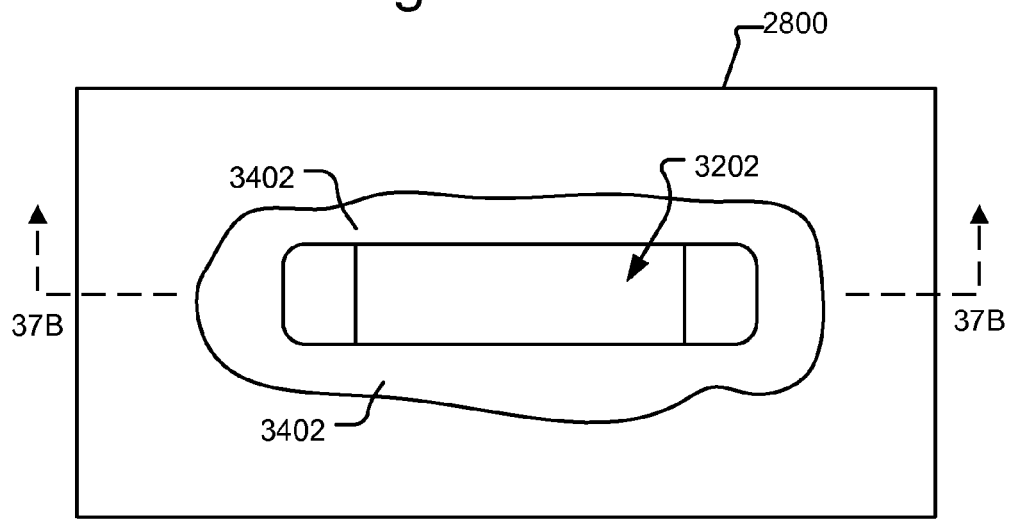
FIG. 37A illustrates a top view of the substrate of FIGS. 36A and 36B after further processing in which a replacement electric circuit is attached to the replacement terminals according to some embodiments of the invention.
Figure 37B:
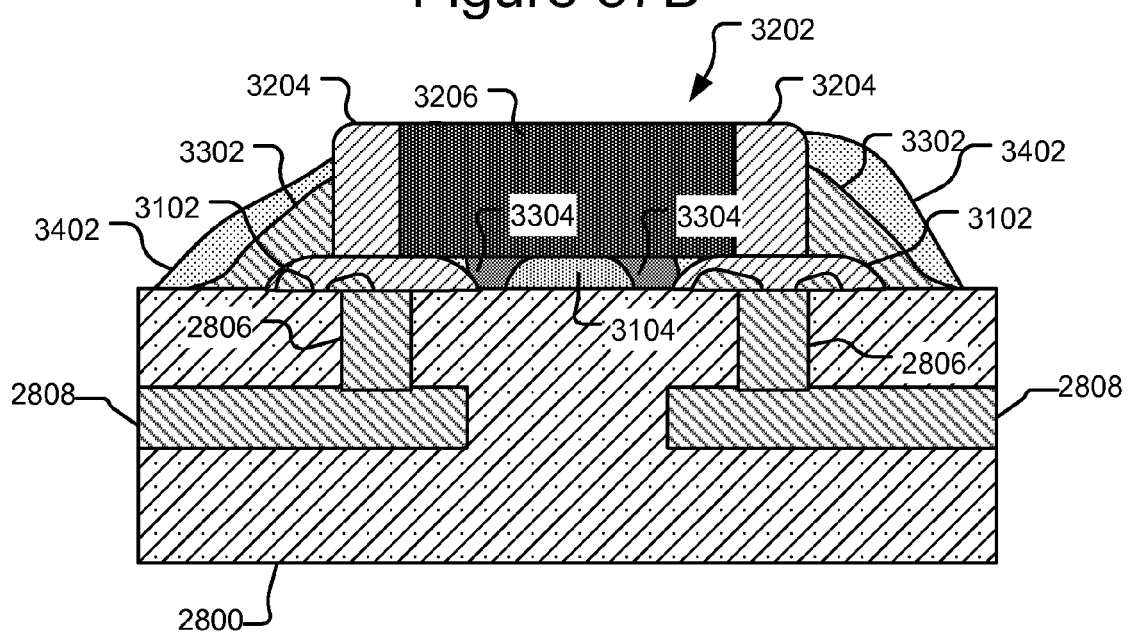
FIG. 37B illustrates a side, cross-sectional view of the substrate of FIG. 37A.

FIGS. 35A and 35B illustrate substrate 2800 after removal or detachment of the electric circuit element 2804 and terminals 2802 shown in FIGS. 28A and 28B in an alternative condition to the condition shown in FIGS. 29A and 29B, according to some embodiments of the invention. As shown in FIGS. 35A and 35B, the surface of the substrate 2800 to which the terminals 2802 were attached can remain intact. For example, holes, like holes 2902 in FIGS. 29A and 29B, are not formed. Pieces 3502 of the terminals 2802, however, can remain on the substrate 2800. These pieces 3502 can be corroded, oxidized, or otherwise damaged and may not be as electrically conductive as the terminals 2802 were, or otherwise desirable for electrical connection. As shown in FIGS. 36A and 36B, replacement terminals 3102 can be formed over the terminal pieces 3502. The replacement terminals 3102 can be the same as or similar to and can be formed and cured the same as or similar to the descriptions and illustrates associated with FIGS. 31A and 31B above. As shown in FIGS. 36A and 36B, deposit 3104 can be formed on substrate 2800 in the same or similar manner as described above with respect to FIGS. 31A and 31B. As shown in FIGS. 37A and 37B, a replacement component 3202 can be attached to the replacement terminals in the same way and using the same materials and procedures as discussed above with respect to FIGS. 32A-34B.

Figure 39:
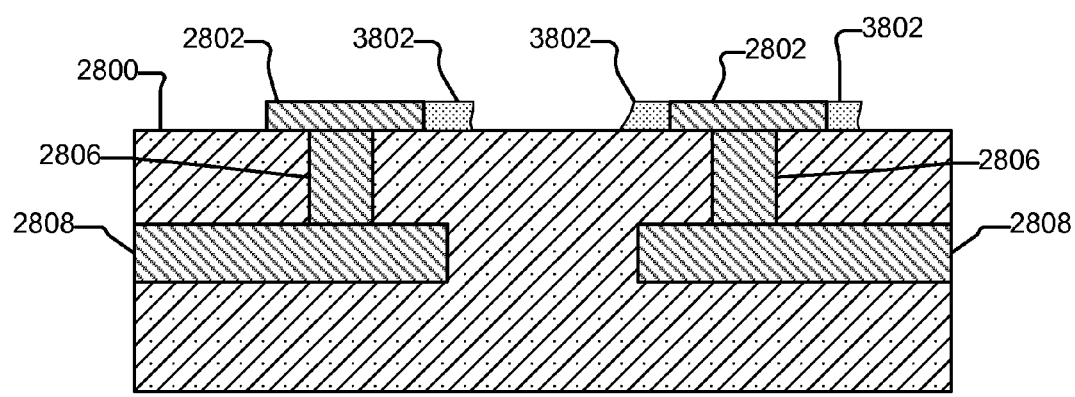
FIG. 39 shows a side, cross-sectional view of the substrate of FIGS. 38A and 38B after at least some of the solder residue is detached according to some embodiments of the invention.
Figure 40:
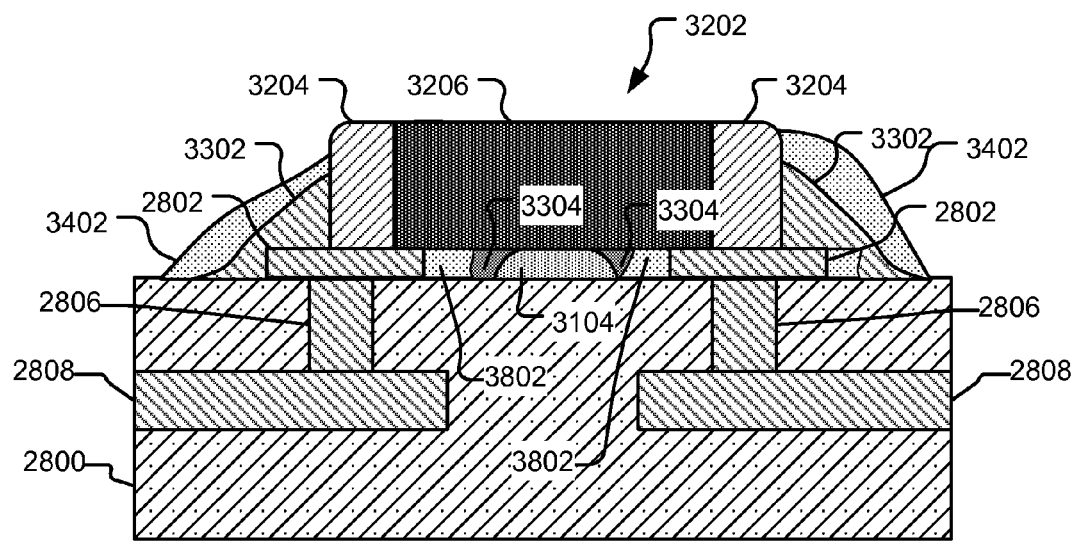
FIG. 40 shows a side, cross-sectional view of the substrate of FIG. 39 after further processing in which a replacement electric circuit is attached to the terminals according to some embodiments of the invention.

Referring again to FIGS. 28A and 28B, in some instances, electric circuit element 2812 may be damaged or otherwise not functioning properly and may be detached as shown in FIGS. 38A and 38B without causing appreciable damage to terminals 2802 or substrate 2800. As shown in FIGS. 38A and 38B, residual solder 3802 can remain on one or more of terminals 2802 and/or substrate 2800 after electric circuit element 2812 is detached. Residual solder 3802 can be remnants of solder that adhered electric circuit element 2812 to terminals 2802. As shown, the residual solder 3802 can extend farther from the substrate 2800 than the terminals 2802. In some circumstances, it can be important that the distance a replacement circuit element extends from substrate 2800 be substantially the same as, or at least not substantially greater than, the distance electric circuit element 2812 extended from substrate 2800 (see FIGS. 28A and 28B). In such circumstances, at least some of the residual solder 3802 can be detached as shown in FIG. 39. For example, as shown, substantially all of the residual solder 3802 that extends beyond terminals 3802 can be detached. Such removal can be accomplished in any suitable manner including without limitation grinding the residual solder 3802, chemically treating the residual solder 3802, scrapping the residual solder 3802, and fully or partially melting and then removing at least part of the melted or partially melted residual solder 3802. As shown in FIG. 40, a replacement component 3202 can be attached to terminals 2802 in the same way and using the same materials and procedures as discussed above with respect to FIGS. 32A-34B.

As mentioned above, electric circuit element 2804 shown in FIGS. 28A-37B can be a non-limiting example of electrical elements 106 of FIGS. 1-6. In addition, replacement electric circuit element 3202 can be a non-limiting example of replacement electrical element 306. Likewise, terminal 2802, replacement terminal 3102, and pieces 3502 can be examples of terminals 104 in FIGS. 1-6. It should be apparent that the processes illustrated in FIGS. 28A-37B are non-limiting examples of the more generalized process illustrated in FIGS. 1-6. Moreover, all characteristics, variations, and descriptions of the processes shown in 28A-37B are applicable to the process illustrated in FIGS. 1-6, and all characteristics, variations, and descriptions of the process shown in FIGS. 1-6 are applicable to the process illustrated in FIGS. 28A-37B.

Figure 41:
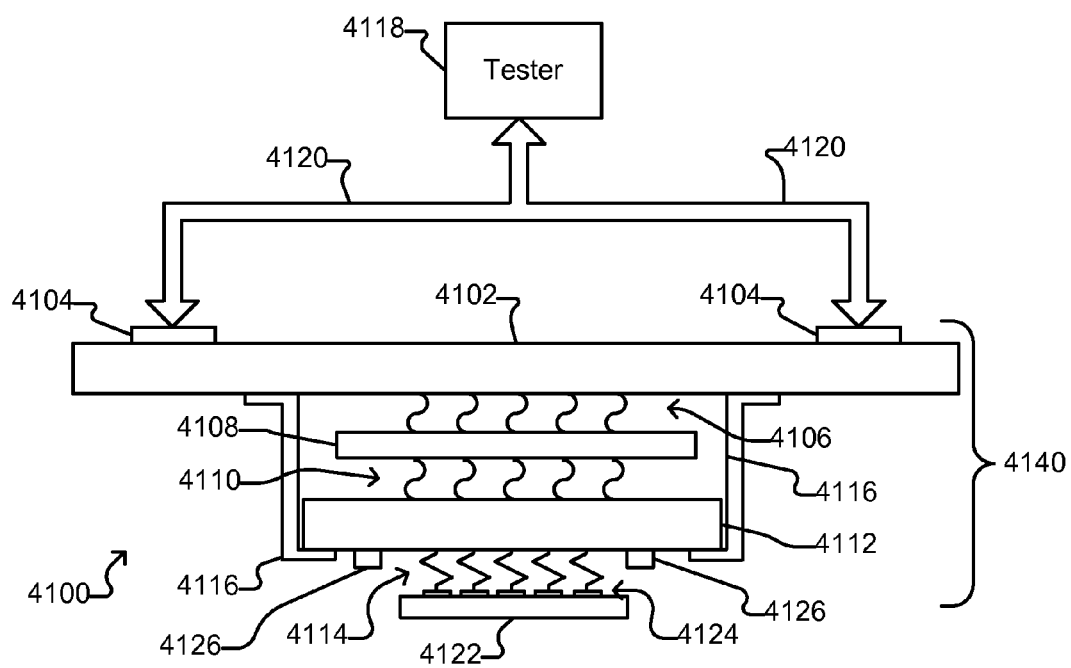
FIG. 41 shows a simplified schematic depiction of a test system that includes a probe card assembly according to some embodiments of the invention.

There are many possible uses and applications for the exemplary processes and electronic devices 100, 700, 1300, 2801 disclosed herein. For example, the electronic devices 100, 700, 1300, 2801 can be part of a probe cad assembly for testing DUTs, such as semiconductor dies. FIG. 41 shows an exemplary probe card assembly 4140 and a simplified block diagram of a test system 4100 in which the probe card assembly 4140 can be used to test one or more DUTs 4122 according to some embodiments of the invention.

As shown in FIG. 41, the probe card assembly 4140 can comprise a wiring substrate 4102, an interposer 4108, and a probe head 4112. Brackets 4116 and/or other suitable means can hold the wiring substrate 4102, interposer 4108, and probe head 4112 together. The wiring substrate 4102 can include electrical connectors 4104 configured to make electrical connections with a plurality of communications channels 4120 to and from a tester 4118. Connectors 4104 can be pads for receiving pogo pins, zero-insertion-force connectors, or any other electrical connection device suitable for making electrical connections with communications channels 4120. Electrically conductive paths (not shown) can be provided through the probe card assembly 4140 to provide electrical connections from individual electrical connections in connectors 4104 (each such individual electrical connection can correspond to one of communication channels 4120) to electrically conductive resilient probes 4114, which can contact input and/or output terminals 4124 of an electronic device under test ("DUT") 4122. Those conductive paths (not shown) through the probe card assembly 4140 can comprise: electrically conductive connections, such as traces and/or vias (not shown), from the connectors 4104 through the wiring substrate 4102 to electrically conductive terminals (not shown) on the wiring substrate 4102 in contact with spring contact structures 4106; electrically conductive connections, such as vias (not shown), through interposer 4108 electrically connecting the spring contact structures 4106 with spring contact structures 4110; and electrically conductive connections, such as traces and vias (not shown), through the probe head 4112 between electrically conductive terminals (not shown) on the probe head 4112 in contact with the spring contact structures 4110 and probes 4114. In this way, a plurality of signal paths comprising the communications channels 4120, the above-described conductive paths through the probe card assembly 4140, and the probes 4114 are provided between the tester 4118 and the input and/or output terminals 4124 of DUT 4122. Electric circuit elements 4126 (capacitors, resistors, diodes, switches, transistors, integrated circuit chips, etc.) can be disposed on the probe head 4112 and connected electrically to one or more of the electrical paths (not shown) through the probe head 4112. Although not shown, electrical components, like electrical components 4124, can also be attached to and electrically connected to electrical paths (not shown) through wiring board 4102 and/or interposer 4108.

As generally mentioned above, DUT 4122 can be any electronic device or devices to be tested, including without limitation one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronic devices, one or more printed circuit boards, or any other type of electronic device or devices.

The configuration of probe card assembly 4140 shown in FIG. 41 is exemplary only and is simplified for ease of illustration and discussion. Many variations, modifications, and additions are possible. For example, although the probe card assembly 4140 is illustrated in FIG. 41 as having three substrates—the wiring substrate 4102, the interposer 4108, and the probe head 4112—the probe card assembly 4140 can have more or fewer than three substrates. For example, probe head 4112 can be attached and/or electrically connected directly to the wiring substrate 4102, which can eliminate interposer 4108. As another exemplary possible modification of the probe card assembly 4140, the probe card assembly 4140 can have more than one probe head 4112, and each such probe head 4112 can be independently adjustable. Non-limiting examples of probe card assemblies with multiple probe heads, like probe head 4112, are disclosed in U.S. Published Patent Application No. 2006/0290367. Additional non-limiting examples of probe card assemblies are illustrated in U.S. Pat. No. 5,974,662 and U.S. Pat. No. 6,509,751 and the aforementioned U.S. Published Patent Application No. 2006/0290367, and various features of the probe card assemblies described in those patents and application can be implemented in the probe card assembly 4140 shown in FIG. 41.

DUT 4122 can be tested as follows. The tester 4118 can generate test signals, which can be provided through the communications channels 4120 and probe card assembly 4140 and probes 4114 to input terminals 4124 of DUT 4122. Response signals generated by DUT 4122 can be sensed by probes 4114 in contact with output terminals 4124 of DUT 4122 and provided through the probe card assembly 4140 and communications channels 4120 to the tester 4118. The tester 4118 can analyze the response signals to determine whether DUT 4122 responded properly to the test signals and, consequently, whether DUT 4122 passes or fails the testing. The tester 4118 can alternatively or in addition rate the performance of DUT 4122.

One or more of the probes 4114 on probe head 4112 can be detached and replaced using any of the processes illustrated herein, including the processes illustrated in any of FIGS. 1-27. Similarly, one or more of the electric circuit elements 4126 can be detached and replaced using the general process illustrated in FIGS. 1-6 or the more specific exemplary processes illustrated in FIGS. 28A-40. Moreover, probes 4114 and electric circuit elements 4126 can be detached and replaced while the probe card assembly 4140 remains fully assembled (e.g., brackets 4116 hold wiring board 4102, interposer 2808, and probe head 4112 together), which can be an improvement over processes in which a probe card assembly must be disassembled at least in part in order to repair electrical components like probes 4114 and/or electrical circuit elements 4126. Any electrical elements (not shown) (e.g., like electric circuit elements 4126) disposed on an outer surface of wiring substrate 4102 can likewise by detached and replaced while the probe card assembly 4140 is fully assembled. One or more of spring contact structures 4106, 4110 as well as any electrical elements (not shown) (e.g., like electric circuit elements 4126) disposed on the interposer 4108 can similarly be detached and repaired. Typically, however, probe card assembly 4140 may need to be at least partially disassembled in order to remove and replace a contact structure 4106, 4110 or electrical elements (not shown) (e.g., like electric circuit elements 4126) disposed on the interposer 4108. Regardless of which contact structures or electrical elements are replaced, the processes for doing so disclosed herein can allow the probe card assembly 4140 to be repaired in the field (e.g., in a test facility where the probe card assembly 4140 is utilized to test DUTs). In some instances, the disclosed processes can thus eliminate the need to take the probe card assembly 4140 to a special repair facility or to the factory where the probe card assembly 4140 was made for repair. Moreover, the processes disclosed herein can simplify repair of probe card assembly 4140, and as mentioned above, in some instances, repair can be performed without disassembling the probe card assembly 4140. Also, a single contact structure or a single electrical element can be replaced, and heat utilized in the repair process can be applied only in selected, localized locations of the probe card assembly 4140.

The processes illustrated in FIGS. 1-40 can be used to remove and replace electrical elements (e.g., like electrical elements 106) on devices other than a probe card assembly. For example, the processes illustrated in FIGS. 1-40 can be used to replace electrical elements on semiconductor wafers, semiconductor dies, printed circuit boards, etc.

The combination of a conductive material and a non-conductive adhesive material can be used to do more than replace a detached electrical element like electrical element 106. FIGS. 42-48 illustrate examples of the use of a combination of a conductive material and non-conductive adhesive material to repair conductive traces and conductive pads on an electronic component.

FIG. 42 illustrates a part of an electronic device 4200 comprising a substrate 4202 on which are disposed a plurality of electrically conductive traces 4204. As shown, one of the traces 4204a is damaged, having a damaged portion 4212. For example, the damaged portion 4212 can comprise a gap in the trace 4204a, which can be the result of part of the trace 4204a being detached, torn off, wearing away, etc. As shown in FIG. 43, conductive material 4302 can be deposited over the damaged portion 4212. The conductive material 4302 can be deposited to fill in the damaged portion 4212 and electrical connect the portions of the trace 4204a on either side of the damaged portion 4212.

A significant purpose of the conductive material 4302 can be to provide a relatively low resistance electrical repair of the damaged portion 4212. For example, the resistance level of the conductive material 4302 can be approximately the same as or less than the resistance level of the traces 4204. Conductive material 4302 can be any electrically conductive material that can be applied to the trace 4204a and substrate 4202. In addition to electrical conductivity properties, the electrically conductive material 4302 can have adhesive properties. For example, the conductive material 4302 can be an adhesive such as an epoxy. For example, the conductive material 4302 can be a weak adhesive.

In some embodiments, conductive material 4302 can be a material that is applied in an uncured state and later cured. Such a conductive material 4302 can be flowable (e.g., in a gel, semi-liquid, or liquid state) prior to being cured, and the conductive material 4302 can change to a hardened or semi-hardened stated after being cured. In some embodiments, the conductive material 4302 can be the same as or similar to the conductive material 402 discussed above, and conductive material 4302 can be applied and cured in the same or similar manner as the conductive material 402. For example, the conductive material 4302 can be cured by heating the conductive material 4302 in its uncured state. The uncured conductive material 4302 can be heated in any suitable manner including any of the techniques and/or using any of the tools or equipment discussed above for curing conductive material 402. For example, conductive material 4302 can be heated by directing a flow of heated gas onto the conductive material 4302.

As shown in FIG. 44, a non-electrically conductive adhesive material 4402 can be deposited over the conductive material 4302. A significant purpose of the non-electrically conductive adhesive material 4402 can be to secure the conductive material 4302 to the trace 4204a and/or substrate 4202. The non-electrically conductive adhesive material 4402 can thus be a strong adhesive that secures the conductive material 4302 to the trace 4204a and/or substrate 4202 with at least as much strength as the other traces 4204 are attached to substrate 4202. In addition to providing adhesion, the non-electrically conductive adhesive material 4402 can electrically insulate the conductive material 4302; coat and protect the conductive material 4302; and/or prevent the formation of debris in the form of small pieces wearing off of the conductive material 4302. Moreover, because the non-electrically conductive adhesive material 4402 is not electrically conductive, it can touch or even flow onto another trace or traces 4204 without making an electrical connection with the other trace or traces 4204. Thus, in some instances, great care need not be taken to limit flow or application of the non-electrically conductive adhesive material 4402 to a limited location.

In some embodiments, non-electrically conductive adhesive material 4402 can be a material that is applied in an uncured state and later cured. For example, conductive non-electrically conductive adhesive material 4402 can be applied to conductive material 4302, trace 4204a, and/or substrate 4202 in an uncured stated and then cured. Such a non-electrically conductive adhesive material 4402 can be flowable (e.g., in a gel, semi-liquid, or liquid state) prior to being cured, and the non-electrically conductive adhesive material 4402 can change to a hardened or semi-hardened stated after being cured. In some embodiments, the non-electrically conductive material 4402 can be the same as or similar to the non-conductive material 502 discussed above, and non-conductive material 4402 can be applied and cured in the same or similar manner as the non-conductive material 502. For example, the non-conductive material 4402 can be cured by heating the non-conductive material 4402 in its uncured state. The uncured non-conductive material 4402 can be heated in any suitable manner including any of the techniques and/or using any of the tools or equipment discussed above for curing non-conductive material 502. For example, non-conductive material 4402 can be heated by directing a flow of heated gas onto the non-conductive material 4402.

FIG. 45 illustrates a part of an electronic device 4500 comprising a substrate 4502 on which are disposed a plurality of electrically conductive pads 4504. As shown, one of the pads 4504a is damaged, having a damaged portion 4512. For example, the damaged portion 4512 can comprise a missing portion of pad 4504a, which can be the result of part of the pad 4504a being detached, torn off, wearing off, etc.

Figure 48:
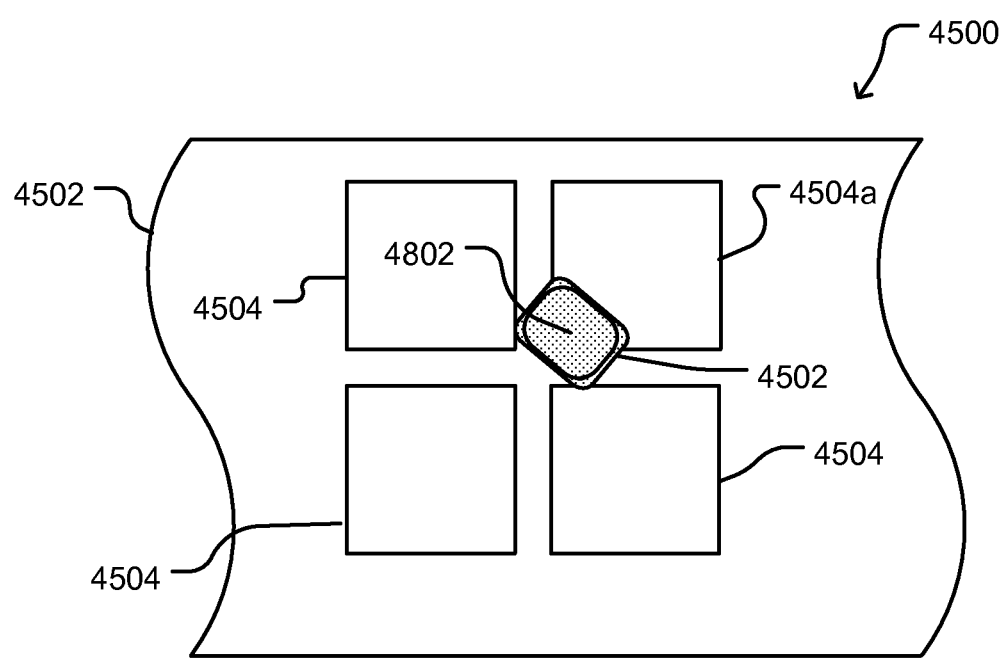
FIG. 48 shows application of a non-conductive adhesive material to the conductive material, dam structure, damaged pad, and substrate of the device of FIG. 47 according to some embodiments of the invention.

As shown in FIG. 46-48, a conductive material 4702 can be deposited over the damaged portion 4512, and a non-conductive adhesive material 4802 can be deposited over the conductive material 4702. The conductive material 4702 can be the same as or similar to the conductive material 4302, and the conductive 4702 can be deposited and cured and can serve the same purposes as the conductive material 4302. Likewise, the non-conductive adhesive material 4802 can be the same as or similar to the non-conductive material 4402, and the non-conductive adhesive material 4802 can be deposited and cured and can serve the same purposes as the non-conductive adhesive material 4402. The process of repairing the damaged portion 4512 of pad 4504a can thus be generally the same as or similar to the process of repairing the damaged portion 4212 of trace 4204a illustrated in FIGS. 42-44. FIGS. 45-48, however, illustrate an optional variation.

As shown in FIG. 46, a dam structure 4602 can be deposited on the damaged pad 4504a and substrate 4502, and the conductive material 4702 can be deposited within the dam structure 4602. The dam structure 4602 can limit the flow of the conductive material 4702. The dam structure 4602 can thus define a space and/or an area on (e.g., enclose a portion of) the pad 4504a and/or substrate 4502 on which the conductive material 4702 will be deposited. Dam structure 4602 can be the same as or similar to dam structure 202 and can be made in the same way as and comprise the same materials as dam structure 202. A dam structure like dam structure 4602 can be used in the process illustrated in FIGS. 42-44. For example, a dam structure like dam structure 4602 can be formed around damaged portion 4212 in FIG. 42, and conductive material 4302 can be deposited into the dam structure. The dam structure (not shown) can be located such that it prevents conductive material 4302 from flowing onto or otherwise contacting any of the other traces 4204.

Electronic devices 4200, 4500 can be any electronic devices. For example, electronic devices 4200, 4500 can be the wiring substrate 4102, interposer substrate 4108, or probe substrate 4112 of probe card assembly 4140 shown in FIG. 41. Electronic devices 4200, 4500 can be other devices including without limitation semiconductor dies, printed circuit boards, etc. Moreover, the exemplary processes illustrated in FIGS. 42-48 for repairing a damaged trace or damaged pad can be used to repair traces or pads on any of the electronic devices 100, 700, 1300, 2801 discussed above.

Although specific embodiments and applications of the invention have been described in this specification, there is no intention that the invention be limited these exemplary embodiments and applications or to the manner in which the exemplary embodiments and applications operate or are described herein.

I claim:

1. A contactor apparatus comprising:
   a substrate configured for a set of spring probes to be attached to the substrate such that contact tips of the spring probes are disposed in a tip pattern corresponding to a probing pattern of ones of terminals of electronic devices to be tested,
   a plurality of attached spring probes attached to the substrate, each of the attached spring probes comprising a base attached to the substrate and electrically connected to a terminal of the substrate, the contact tip spaced away from the substrate, and a spring body extending between the base and the contact tip, the plurality of attached spring probes are less than a full set of the spring probes;
   at least one replacement spring probe comprising a replacement base, a replacement spring body, and a replacement contact tip disposed in the tip pattern; and
   a cured conductive adhesive material disposed on the replacement base and a terminal of the substrate but not disposed on any of the bases of the attached spring probes, the conductive adhesive electrically connecting the replacement base to the terminal,
   wherein the cured conductive adhesive material extends from the terminal up and around the replacement base.

2. The contactor apparatus of claim 1 further comprising a cured non-conductive adhesive material deposited on the replacement base, on the substrate, and over the conductive adhesive material but not disposed on any of the bases of the attached spring probes.

3. The contactor apparatus of claim 2, wherein the non-conductive adhesive material is a stronger adhesive than the conductive adhesive material.

4. The contactor apparatus of claim 2, wherein:
   the conductive adhesive material comprises a conductive epoxy, and
   the non-conductive adhesive material comprises a non-conductive epoxy.

5. The contactor apparatus of claim 1 further comprising a dam structure enclosing a portion of the substrate that includes the terminal, other terminals to which the attached spring probes are attached are located outside of the dam structure, wherein the conductive adhesive is disposed within the dam structure.

6. The contactor apparatus of claim 1, wherein the contactor apparatus comprises an assembled probe card assembly comprising a wiring board and a probe head having a plurality of electrical connections therebetween, the wiring board comprising an electrical interface configured to connect to a tester for controlling testing of the electronic devices, the probe head comprising the substrate and providing electrical connections to the attached spring probes and the replacement spring probe.

7. The contactor apparatus of claim 1, wherein the cured conductive adhesive is also disposed on the substrate.

8. The contactor apparatus of claim 1, wherein the conductive adhesive is flowable before being cured.

9. The contactor apparatus of claim 1, wherein the conductive adhesive is a different material than the replacement spring probe.

10. The contactor apparatus of claim 2, wherein the non-conductive adhesive material is at least two times stronger an adhesive than the conductive adhesive material.

* * * * *